(12) United States Patent
Minegishi et al.

(10) Patent No.: US 12,389,508 B2
(45) Date of Patent: Aug. 12, 2025

(54) LIGHT SOURCE PARAMETER INFORMATION MANAGEMENT METHOD, LIGHT SOURCE PARAMETER INFORMATION MANAGEMENT APPARATUS, AND COMPUTER READABLE MEDIUM

(71) Applicant: Gigaphoton Inc., Tochigi (JP)

(72) Inventors: Yuji Minegishi, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 212 days.

(21) Appl. No.: 18/363,381

(22) Filed: Aug. 1, 2023

(65) Prior Publication Data

US 2024/0023217 A1 Jan. 18, 2024

Related U.S. Application Data

(63) Continuation of application No. PCT/JP2021/012384, filed on Mar. 24, 2021.

(51) Int. Cl.
*H05B 47/10* (2020.01)
*H05B 45/50* (2022.01)
(Continued)

(52) U.S. Cl.
CPC .......... *H05B 45/50* (2020.01); *H05B 47/105* (2020.01); *H05B 47/17* (2020.01); *H05B 47/19* (2020.01)

(58) Field of Classification Search
CPC ...... H05B 45/50; H05B 47/105; H05B 47/17; H05B 47/19; G03F 7/70008; G03F 7/70025; G03F 7/70525; G03F 7/70975
See application file for complete search history.

(56) References Cited

U.S. PATENT DOCUMENTS

| 5,383,217 A | 1/1995 | Uemura |
| 2001/0012311 A1 | 8/2001 | Atsumi |

(Continued)

FOREIGN PATENT DOCUMENTS

| JP | H10-275951 A | 10/1998 |
| JP | H11-121339 A | 4/1999 |

(Continued)

OTHER PUBLICATIONS

International Search Report issued in PCT/JP2021/012384; mailed Jun. 1, 2021.

(Continued)

*Primary Examiner* — Long Nguyen
(74) *Attorney, Agent, or Firm* — Studebaker Brackett PLLC

(57) ABSTRACT

A light source parameter information management method for managing information on a parameter of a light source used in an exposure apparatus, the method including acquiring priority target parameter information containing an item of a variable that is a priority target parameter prioritized in the operation of the light source, and a target value of the variable, estimating maintenance information based on the priority target parameter information, the maintenance information containing a value representing the life of a consumable in the light source until maintenance of the consumable, and outputting the maintenance information.

20 Claims, 46 Drawing Sheets

(51) Int. Cl.
*H05B 47/105* (2020.01)
*H05B 47/17* (2020.01)
*H05B 47/19* (2020.01)

(56) References Cited

U.S. PATENT DOCUMENTS

2020/0133249 A1  4/2020  Igarashi et al.
2021/0117931 A1* 4/2021  Abe .................... B23K 26/352
2021/0333788 A1  10/2021 Abe et al.

FOREIGN PATENT DOCUMENTS

| JP | 2000-306813 A | 11/2000 |
| JP | 2010-067794 A | 3/2010 |
| KR | 2003-0001712 A | 1/2003 |
| WO | 2019/043780 A1 | 3/2019 |
| WO | 2020/031301 A1 | 2/2020 |
| WO | 2020/161865 A1 | 8/2020 |

OTHER PUBLICATIONS

International Preliminary Report On Patentability and Written Opinion issued in PCT/JP2021/012384; issued Sep. 12, 2023.

* cited by examiner

FIG. 44

| PRIMARY ITEM INFORMATION | SECONDARY ITEM INFORMATION | TERTIARY ITEM INFORMATION | PARAMETERS | PARAMETER VALUES |
|---|---|---|---|---|
| LIGHT SOURCE OPTICAL PERFORMANCE PARAMETER INFORMATION | SPECTRAL CHARACTERISTIC PARAMETER INFORMATION | SPECTRAL LINEWIDTH PARAMETER INFORMATION | SPECTRAL LINEWIDTH ($\Delta\lambda$) | $\Delta\lambda$ IS E95, WHICH IS PRIMARILY WIDTH INCLUDING 95% OF ENERGY OF OVERALL SPECTRUM. ANOTHER EXAMPLE OF $\Delta\lambda$ MAY BE INDICATOR VALUE REPRESENTING SPECTRAL LINEWIDTH, SUCH AS FULL WIDTH AT HALF MAXIMUM $\Delta\lambda_{FWHM}$. |
| | | | SPECTRAL LINEWIDTH STABILITY ($\pm\Delta\Delta\lambda$) | $\Delta\Delta\lambda$ IS WIDTH OF VARIATION IN SPECTRAL LINEWIDTH $\Delta\lambda$, FOR EXAMPLE, VALUE FROM STANDARD DEVIATION $\sigma$ OF SPECTRAL LINEWIDTH VARIATION TO $4\sigma$. |
| | | WAVELENGTH PARAMETER INFORMATION | WAVELENGTH ($\lambda$) | $\lambda$ IS VALUE OF CENTER WAVELENGTH |
| | | | WAVELENGTH STABILITY ($\pm\sigma\lambda$) | $\sigma\lambda$ IS CENTER WAVELENGTH STABILITY, FOR EXAMPLE, VALUE FROM STANDARD DEVIATION $\sigma$ OF WAVELENGTH VARIATION TO $4\sigma$ |
| | OUTPUT CHARACTERISTIC PARAMETER INFORMATION | PULSE ENERGY PARAMETER INFORMATION | PULSE ENERGY (E) | E IS PULSE ENERGY VALUE OF LIGHT PULSES OUTPUT FROM LIGHT SOURCE. |
| | | | PULSE ENERGY STABILITY ($\pm\Delta E$) | $\Delta E$ IS WIDTH OF VARIATION IN PULSE ENERGY OF LIGHT PULSES OUTPUT FROM LIGHT SOURCE. FOR EXAMPLE, $\Delta E$ MAY BE FROM STANDARD DEVIATION $\sigma$ OF PULSE ENERGY VARIATION TO $4\sigma$. |
| | | DOSE PARAMETER INFORMATION | DOSE (D) | D IS MOVING ACCUMULATION VALUE OF PULSE ENERGY OF $N_S$ PULSES |
| | | | DOSE STABILITY ($\pm\Delta D$) | $\Delta D$ IS WIDTH OF VARIATION IN MOVING ACCUMULATION VALUE FOR $N_S$ PULSES OUTPUT FROM LIGHT SOURCE. FOR EXAMPLE, $\Delta D$ MAY BE FROM STANDARD DEVIATION $\sigma$ OF D TO $4\sigma$. |
| | | AVERAGE OUTPUT PARAMETER INFORMATION | DUTY RATIO (Dr) | Dr IS ON-TIME DUTY RATIO DURING BURST OPERATION |
| | | | NUMBER OF PULSES PER UNIT PERIOD (f) | f IS NUMBER OF PULSES OUTPUT PER UNIT PERIOD |
| LIGHT SOURCE MAINTENANCE INFORMATION | CONSUMABLE LIFE PARAMETER INFORMATION | CHAMBER LIFE PARAMETER INFORMATION | NUMBER OF REMAINING PULSES UNTIL CHAMBER REPLACEMENT ($N_{CHr}$) | $N_{CHr}$ IS NUMBER OF REMAINING PULSES UNTIL CHAMBER REPLACEMENT |
| | | | REMAINING PERIOD UNTIL CHAMBER REPLACEMENT ($T_{CHr}$) | $T_{CHr}$ IS RESULT OF DIVISION OF $N_{CHr}$ DIVIDED BY NUMBER OF PULSES OUTPUT PER UNIT PERIOD |
| | | LINE NARROWING MODULE LIFE PARAMETER INFORMATION | NUMBER OF REMAINING PULSES UNTIL LINE NARROWING MODULE REPLACEMENT ($N_{LNMr}$) | $N_{LNMr}$ IS NUMBER OF REMAINING PULSES UNTIL LINE NARROWING MODULE REPLACEMENT |
| | | | REMAINING PERIOD UNTIL LINE NARROWING MODULE REPLACEMENT ($T_{LNMr}$) | $T_{LNMr}$ IS RESULT OF DIVISION OF $N_{LNMr}$ DIVIDED BY NUMBER OF PULSES OUTPUT PER UNIT PERIOD. |
| | | MONITOR MODULE LIFE PARAMETER INFORMATION | NUMBER OF REMAINING PULSES UNTIL MONITOR MODULE REPLACEMENT $N_{MMr}$ | $N_{MMr}$ IS NUMBER OF REMAINING PULSES UNTIL MONITOR MODULE REPLACEMENT |
| | | | REMAINING PERIOD UNTIL MONITOR MODULE REPLACEMENT ($T_{MMr}$) | $T_{MMr}$ IS RESULT OF DIVISION OF $N_{MMr}$ DIVIDED BY NUMBER OF PULSES OUTPUT PER UNIT PERIOD. |
| | | OC LIFE PARAMETER INFORMATION | NUMBER OF REMAINING PULSES UNTIL OC REPLACEMENT ($N_{OCr}$) | $N_{OCr}$ IS NUMBER OF REMAINING PULSES UNTIL OC REPLACEMENT |
| | | | REMAINING PERIOD UNTIL OC REPLACEMENT ($T_{OCr}$) | $T_{OCr}$ IS RESULT OF DIVISION OF $N_{OCr}$ DIVIDED BY NUMBER OF PULSES OUTPUT PER UNIT PERIOD. |
| LIGHT SOURCE CONSUMPTION PARAMETER INFORMATION | GAS CONSUMPTION PARAMETER INFORMATION | | GAS CONSUMPTION PER UNIT PULSE (Gw) | Gw IS LASER GAS CONSUMPTION PER UNIT PULSE NUMBER. |
| | CONSUMED POWER PARAMETER INFORMATION | | CONSUMED POWER (W) | W IS POWER CONSUMED BY LIGHT SOURCE. |
| OPERATION CONTROL PARAMETER INFORMATION | | | PARAMETERS THAT FALL WITHIN RANGE OF VOLTAGE V INSTRUCTED TO CHARGER | PARAMETER VALUES THAT FALL WITHIN RANGE OVER WHICH VOLTAGE IS APPLIED TO CHARGER AND INCLUDE MAXIMUM HVUL AND MINIMUM HVLL |
| | | | HALOGEN PARTIAL PRESSURE IN CHAMBER (Hgc) | Hgc IS HALOGEN PARTIAL PRESSURE IN CHAMBER |
| | | | PARAMETER OF ACTUATOR THAT CHANGES SPECTRAL LINEWIDTH | SPACING BETWEEN CONCAVE LENS AND CONVEX LENS OF WAVEFRONT ADJUSTER MAGNIFICATION M IN A CASE WHERE MAGNIFICATION PROVIDED BY PRISMS IN LNM IS VARIABLE |

FIG. 45

| PRIMARY ITEM INFORMATION | SECONDARY ITEM INFORMATION | TERTIARY ITEM INFORMATION | PARAMETERS | PARAMETER VALUES |
|---|---|---|---|---|
| LIGHT SOURCE OPTICAL PERFORMANCE PRIORITY TARGET PARAMETER INFORMATION | SPECTRAL CHARACTERISTIC PRIORITY TARGET PARAMETER INFORMATION | SPECTRAL LINEWIDTH PRIORITY TARGET PARAMETER INFORMATION | PRIORITY TARGET SPECTRAL LINEWIDTH (Δλtp) | Δλtp IS PRIORITIZED SPECTRAL LINEWIDTH TARGET VALUE. |
| | | | PRIORITY TARGET SPECTRAL LINEWIDTH STABILITY (ΔΔλtp) | ΔΔλtp IS PRIORITIZED SPECTRAL LINEWIDTH VARIATION WIDTH TARGET VALUE. |
| | | WAVELENGTH PRIORITY TARGET PARAMETER INFORMATION | PRIORITY TARGET WAVELENGTH (λtp) | λtp IS WAVELENGTH PRIORITIZED TARGET VALUE. |
| | | | PRIORITY TARGET WAVELENGTH STABILITY (λtp ± σλtp) | σλtp IS PRIORITIZED WAVELENGTH STABILITY TARGET VALUE. |
| | | PULSE ENERGY PRIORITY TARGET PARAMETER INFORMATION | PRIORITY TARGET PULSE ENERGY (Etp) | Etp IS TARGET VALUE OF PRIORITIZED PULSE ENERGY OUTPUT FROM LIGHT SOURCE. |
| | | | PRIORITY TARGET PULSE ENERGY STABILITY (±ΔEtp) | ΔEtp IS TARGET VALUE OF WIDTH OF VARIATION IN PRIORITIZED PULSE ENERGY OUTPUT FROM LIGHT SOURCE. |
| | OUTPUT CHARACTERISTIC PRIORITY TARGET PARAMETER INFORMATION | DOSE PRIORITY TARGET PARAMETER INFORMATION | PRIORITY TARGET DOSE (Dtp) | Dtp IS TARGET VALUE OF MOVING ACCUMULATION OF PRIORITIZED PULSE ENERGY OF Ns LIGHT PULSES OUTPUT FROM LIGHT SOURCE. |
| | | | PRIORITY TARGET DOSE STABILITY (±ΔDtp) | ΔDtp IS TARGET VALUE OF WIDTH OF VARIATION IN PRIORITIZED MOVING ACCUMULATION OF Ns PULSES OUTPUT FROM LIGHT SOURCE. |
| | | AVERAGE OUTPUT PRIORITY TARGET PARAMETER INFORMATION | PRIORITY TARGET DUTY RATIO (Drtp) | Drtp IS TARGET VALUE OF ON-TIME PRIORITIZED DUTY RATIO DURING BURST OPERATION. |
| | | | PRIORITY TARGET NUMBER OF PULSES PER UNIT PERIOD (ftp) | ftp IS TARGET VALUE OF NUMBER OF PULSES OUTPUT PER PRIORITIZED UNIT PERIOD. |
| | GAS CONSUMPTION PRIORITY TARGET PARAMETER INFORMATION | | PRIORITY TARGET GAS CONSUMPTION PER UNIT PULSE (Gwtp) | Gwtp IS TARGET VALUE OF LASER GAS CONSUMPTION PER PRIORITIZED UNIT PULSE NUMBER. |
| LIGHT SOURCE CONSUMPTION PRIORITY TARGET PARAMETER INFORMATION | CONSUMED POWER TARGET PRIORITY PARAMETER INFORMATION | | PRIORITY TARGET CONSUMED POWER (Wtp) | Wtp IS TARGET VALUE OF PRIORITIZED CONSUMED POWER CONSUMED BY LIGHT SOURCE. |

FIG. 46

| PRIMARY ITEM INFORMATION | SECONDARY ITEM INFORMATION | TERTIARY ITEM INFORMATION | PARAMETERS | PARAMETER VALUES |
|---|---|---|---|---|
| LIGHT SOURCE OPTICAL PERFORMANCE RECOMMENDED TARGET PARAMETER INFORMATION | SPECTRAL CHARACTERISTIC RECOMMENDED TARGET PARAMETER INFORMATION | SPECTRAL LINEWIDTH RECOMMENDED TARGET PARAMETER INFORMATION | RECOMMENDED TARGET SPECTRAL LINEWIDTH (Δλtr) | Δλtr IS RECOMMENDED SPECTRAL LINEWIDTH TARGET VALUE. |
| | | | RECOMMENDED TARGET SPECTRAL LINEWIDTH STABILITY (ΔΔλtr) | ΔΔλtr IS TARGET VALUE OF WIDTH OF VARIATION IN RECOMMENDED SPECTRAL LINEWIDTH Δλ. |
| | | WAVELENGTH RECOMMENDED TARGET PARAMETER INFORMATION | RECOMMENDED TARGET WAVELENGTH (λtr) | λtr IS TARGET VALUE OF RECOMMENDED WAVELENGTH. |
| | | | RECOMMENDED TARGET WAVELENGTH STABILITY (σλtr) | σλtr IS TARGET VALUE OF RECOMMENDED WAVELENGTH STABILITY. |
| | OUTPUT CHARACTERISTIC RECOMMENDED TARGET PARAMETER INFORMATION | PULSE ENERGY RECOMMENDED TARGET PARAMETER INFORMATION | RECOMMENDED TARGET PULSE ENERGY (Etr) | Etr IS TARGET VALUE OF RECOMMENDED PULSE ENERGY OUTPUT FROM LIGHT SOURCE. |
| | | | RECOMMENDED TARGET PULSE ENERGY STABILITY (±ΔEtr) | ΔEtr IS TARGET VALUE OF WIDTH OF VARIATION IN RECOMMENDED PULSE ENERGY OUTPUT FROM LIGHT SOURCE. |
| | | DOSE RECOMMENDED TARGET PARAMETER INFORMATION | RECOMMENDED TARGET DOSE (Dtr) | Dtr IS TARGET VALUE OF MOVING ACCUMULATION OF PULSE ENERGY OF RECOMMENDED Ns LIGHT PULSES OUTPUT FROM LIGHT SOURCE. |
| | | | RECOMMENDED TARGET DOSE STABILITY (±ΔDtr) | ΔDtr IS TARGET VALUE OF WIDTH OF VARIATION IN MOVING ACCUMULATION OF RECOMMENDED Ns LIGHT PULSES OUTPUT FROM LIGHT SOURCE. |
| | | AVERAGE OUTPUT RECOMMENDED TARGET PARAMETER INFORMATION | RECOMMENDED TARGET DUTY RATIO (Drtr) | Drtr IS TARGET VALUE OF ON-TIME PRIORITIZED DUTY RATIO DURING RECOMMENDED BURST OPERATION |
| | | | RECOMMENDED TARGET NUMBER OF PULSES PER UNIT PERIOD (ftr) | ftr IS TARGET VALUE OF NUMBER OF PULSES OUTPUT PER RECOMMENDED UNIT PERIOD |
| LIGHT SOURCE CONSUMPTION RECOMMENDED TARGET PARAMETER INFORMATION | GAS CONSUMPTION RECOMMENDED TARGET PARAMETER INFORMATION | | RECOMMENDED TARGET GAS CONSUMPTION PER UNIT PULSE (Gwtr) | Gwtr IS TARGET VALUE OF LASER GAS CONSUMPTION PER RECOMMENDED UNIT PULSE NUMBER. |
| | CONSUMED POWER TARGET RECOMMENDED PARAMETER INFORMATION | | RECOMMENDED TARGET CONSUMED POWER (Wtr) | Wtr IS TARGET VALUE OF RECOMMENDED CONSUMED POWER CONSUMED BY LIGHT SOURCE. |

FIG. 47

| PRIMARY ITEM INFORMATION | SECONDARY ITEM INFORMATION | TERTIARY ITEM INFORMATION | PARAMETERS | PARAMETER VALUES |
|---|---|---|---|---|
| LIGHT SOURCE MAINTENANCE INFORMATION | CONSUMABLE LIFE PARAMETER INFORMATION | CHAMBER LIFE PARAMETER INFORMATION | NUMBER OF REMAINING PULSES UNTIL CHAMBER REPLACEMENT ($N_{CHr}$) | $N_{CHr}$ IS NUMBER OF REMAINING PULSES UNTIL CHAMBER REPLACEMENT. |
| | | | REMAINING PERIOD UNTIL CHAMBER REPLACEMENT ($T_{CHr}$) | $T_{CHr}$ IS RESULT OF DIVISION OF $N_{CHr}$ DIVIDED BY NUMBER OF PULSES OUTPUT PER UNIT PERIOD. |
| | | LINE NARROWING MODULE LIFE PARAMETER INFORMATION | NUMBER OF REMAINING PULSES UNTIL LINE NARROWING MODULE REPLACEMENT ($N_{LMMr}$) | $N_{LMMr}$ IS NUMBER OF REMAINING PULSES UNTIL LINE NARROWING MODULE REPLACEMENT |
| | | | REMAINING PERIOD UNTIL LINE NARROWING MODULE REPLACEMENT ($T_{LMMr}$) | $T_{LMMr}$ IS RESULT OF DIVISION OF $N_{LMMr}$ DIVIDED BY NUMBER OF PULSES OUTPUT PER UNIT PERIOD. |
| | | MONITOR MODULE LIFE PARAMETER INFORMATION | NUMBER OF REMAINING PULSES UNTIL MONITOR MODULE REPLACEMENT $N_{MMr}$ | $N_{MMr}$ IS NUMBER OF REMAINING PULSES UNTIL MONITOR MODULE REPLACEMENT |
| | | | REMAINING PERIOD UNTIL MONITOR MODULE REPLACEMENT ($T_{MMr}$) | $T_{MMr}$ IS RESULT OF DIVISION OF $N_{MMr}$ DIVIDED BY NUMBER OF PULSES OUTPUT PER UNIT PERIOD. |
| | | OC LIFE PARAMETER INFORMATION | NUMBER OF REMAINING PULSES UNTIL OC REPLACEMENT ($N_{OCr}$) | $N_{OCr}$ IS NUMBER OF REMAINING PULSES UNTIL OC REPLACEMENT. |
| | | | REMAINING PERIOD UNTIL OC REPLACEMENT ($T_{OCr}$) | $T_{OCr}$ IS RESULT OF DIVISION OF $N_{OCr}$ DIVIDED BY NUMBER OF PULSES OUTPUT PER UNIT PERIOD. |

FIG. 48

| PRIMARY ITEM INFORMATION | PARAMETERS | PARAMETER VALUES |
|---|---|---|
| OPERATION CONTROL TARGET PARAMETER INFORMATION | TARGET PARAMETERS THAT FALL WITHIN RANGE OF VOLTAGE V INSTRUCTED TO CHARGER (HVULt TO HVLLt) | TARGET PARAMETER VALUES THAT FALL WITHIN RANGE OVER WHICH VOLTAGE IS APPLIED TO CHARGER AND INCLUDE MAXIMUM HVULt AND MINIMUM HVLLt |
| | TARGET HALOGEN GAS PARTIAL PRESSURE (Hgct) IN CHAMBER | Hgct IS TARGET VALUE OF HALOGEN PARTIAL PRESSURE IN CHAMBER. |
| | INITIAL TARGET PARAMETER (Ct) OF ACTUATOR THAT CHANGES SPECTRAL LINEWIDTH | Ct IS INITIAL TARGET VALUE OF SPACING BETWEEN CONCAVE LENS AND CONVEX LENS OF WAVEFRONT ADJUSTER. Mt IS TARGET VALUE OF INITIAL MAGNIFICATION IN A CASE WHERE MAGNIFICATION M PROVIDED BY PRISMS IN LNM IS VARIABLE |

LIGHT SOURCE PARAMETER INFORMATION MANAGEMENT METHOD, LIGHT SOURCE PARAMETER INFORMATION MANAGEMENT APPARATUS, AND COMPUTER READABLE MEDIUM

CROSS-REFERENCE TO RELATED APPLICATIONS

The present application is a continuation application of International Application No. PCT/JP2021/012384, filed on Mar. 24, 2021, the entire contents of which are hereby incorporated by reference.

BACKGROUND

1. Technical Field

The present disclosure relates to a light source parameter information management method, a light source parameter information management apparatus, and a computer readable medium.

2. Related Art

In recent years, a semiconductor exposure apparatus is required to improve the resolution thereof as semiconductor integrated circuits are increasingly miniaturized and highly integrated. To this end, reduction in the wavelength of light emitted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

Light from spontaneously oscillating the KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light output from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] WO2020/161865
[PTL 2] WO2020/031301
[PTL 3] WO2019/043780
[PTL 4] JP2010-67794A
[PTL 5] U.S. Pat. No. 5,383,217
[PTL 6] JP11-121339A

SUMMARY

A light source parameter information management method according to an aspect of the present disclosure is a light source parameter information management method for managing information on a parameter of a light source used in an exposure apparatus, the method including acquiring priority target parameter information containing an item of a variable that is a priority target parameter prioritized in operation of the light source, and a target value of the variable, estimating maintenance information based on the priority target parameter information, the maintenance information containing a value representing a life of a consumable in the light source until maintenance of the consumable, and outputting the maintenance information.

A light source parameter information management apparatus according to another aspect of the present disclosure includes a processor, and a memory configured to store a program executed by the processor, the processor executing instructions of the program to acquire priority target parameter information containing an item of a variable that is a priority target parameter prioritized in operation of the light source, and a target value of the variable, estimate maintenance information based on the priority target parameter information, the maintenance information containing a value representing a life of a consumable in the light source until maintenance of the consumable, and output the maintenance information.

A computer readable medium according to another aspect of the present disclosure is a non-transitory computer readable medium storing a program that causes a computer to achieve a function of managing information on a parameter of a light source used in an exposure apparatus, the program causing the computer to perform functions of acquiring priority target parameter information containing an item of a variable that is a priority target parameter prioritized in operation of the light source, and a target value of the variable, estimating maintenance information based on the priority target parameter information, the maintenance information containing a value representing a life of a consumable in the light source until maintenance of the consumable, and outputting the maintenance information.

BRIEF DESCRIPTION OF THE DRAWINGS

Embodiments of the present disclosure will be described below only by way of example with reference to the accompanying drawings.

FIG. 44 is a table showing a specific example of light source parameter information.

FIG. 45 is a table showing a specific example of priority target parameter information.

FIG. 46 is a table showing a specific example of the recommended target parameter information.

FIG. 47 is a table showing a specific example of maintenance information.

FIG. 48 is a table showing a specific example of operation control target parameter information.

DETAILED DESCRIPTION

Contents

Figure 1:
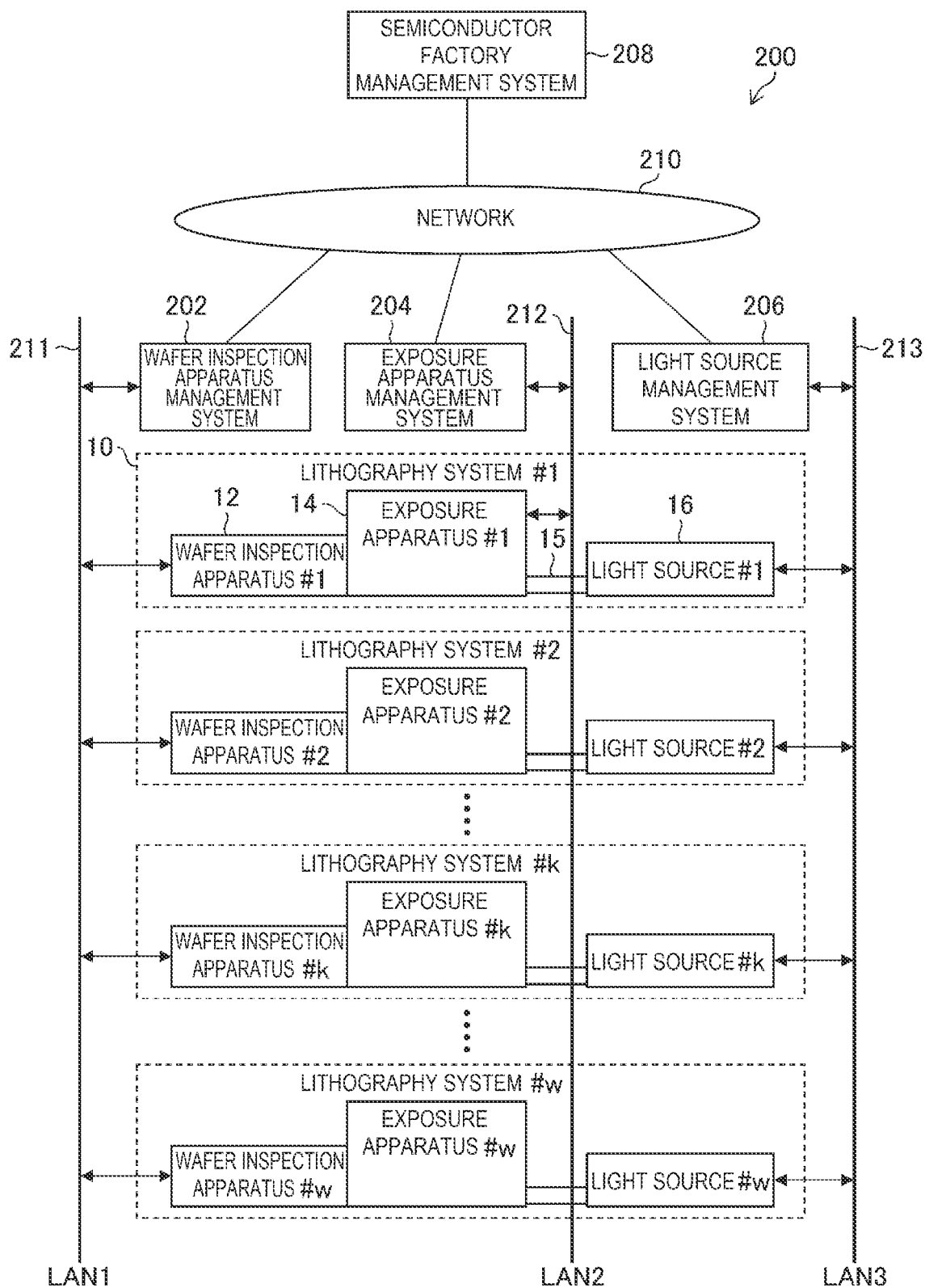
FIG. 1 schematically shows the configuration of an exemplary semiconductor manufacturing system in a semiconductor factory.

1. Description of terms
2. Description of semiconductor manufacturing system
2.1 Configuration
2.2 Operation
3. Description of lithography system
3.1 Configuration
3.2 Operation
4. Example of exposure pattern onto wafer
5. Example of light source
5.1 Configuration
5.2 Operation
5.3 Others
5.4 Problems
6. First Embodiment
6.1 Configuration
6.2 Operation
6.2.1 Example of processes carried out by data analysis server
6.2.2 Example of processes carried out by light source parameter management server
6.3 Effects
6.4 Others 7. Second Embodiment
7.1 Configuration
7.2 Operation
7.2.1 Example of processes carried out by data analysis server
7.2.2 Example of processes carried out by light source parameter management server
7.3 Effects
7.4 Others
8. Third Embodiment
8.1 Configuration
8.2 Operation
8.3 Effects
9. Fourth Embodiment
9.1 Configuration
9.2 Optical performance priority mode operation
9.2.1 Example of case where spectral linewidth Δλ is priority target parameter
9.2.1.1 Operation
9.2.1.2 Effects
9.2.1.3 Others
9.2.2 Case where pulse energy is priority target parameter
9.2.2.1 Example of case where generation of high pulse energy is prioritized and exposure can be performed with spectral linewidth Δλ widened
9.2.2.1.1 Operation
9.2.2.1.2 Effects
9.2.2.1.3 Others
9.2.2.2 Example of case where exposure can be performed with generation of high pulse energy prioritized and pulse energy stability relaxed in terms of specifications
9.2.2.2.1 Operation
9.2.2.2.2 Effects
9.2.2.2.3 Others
9.2.2.3 Example of case where exposure can be performed with operation at high duty ratio prioritized and pulse energy stability relaxed in terms of specifications
9.2.2.3.1 Operation
9.2.2.3.2 Effects
9.2.2.3.3 Others
9.3 Consumable life extension mode operation
9.3.1 Example of resetting target halogen gas partial pressure
9.3.1.1 Operation
9.3.1.2 Effects
9.3.2 Example of resetting target spectral linewidth
9.3.3 Example of resetting gas consumption
9.3.4 Effects
9.3.5 Others
9.4 Consumption reduction mode operation
9.4.1 Gas consumption reduction Mode operation
9.4.1.1 Example of resetting target halogen partial pressure
9.4.1.2 Example of widening target spectral linewidth
9.4.1.3 Example of reducing number of remaining pulses until maintenance
9.4.1.4 Effects
9.4.1.5 Others
9.4.2 Power saving mode operation
9.4.2.1 Example of resetting target value of charging voltage
9.4.2.2 Example of resetting target value of halogen gas partial pressure
9.4.2.3 Example of widening target spectral linewidth
9.4.3 Effects
9.4.4 Others
9.5 Variations
10. Specific example of parameter information
11. Computer readable medium on which program is recorded
12. Others Embodiments of the present disclosure will be described below in detail with reference to the drawings. The embodiments described below show some examples of the present disclosure and are not intended to limit the contents of the present disclosure. Furthermore, all configurations and operations described in the embodiments are not necessarily essential as configurations and operations in the present disclosure. The same component has the same reference character, and no duplicate description of the same component will be made.

1. Description of Terms

The term "consumables" refers to parts or modules that deteriorate due to pulses output from a light source used in an exposure apparatus and are replaced with new ones. Examples of the consumables may include a light source chamber, a line narrowing module (LNM), an output coupler (OC), and a monitor module. The concept of the "replacement" also includes not only replacement of a consumable with a new one but maintenance and/or recovery of the function of the consumable as a part, such as cleaning the consumable, and re-arrangement of the same consumable.

A critical dimension (CD) refers to the dimension of a micro-pattern formed on a wafer made, for example, of a semiconductor.

The term "overlay" refers to superposition of micro-patterns formed on a wafer made, for example, of a semiconductor on each other.

The term "exposure conditions" refers to the conditions under which a photoresist on a wafer made, for example, of a semiconductor, is exposed. Specific examples of the exposure conditions may include illumination conditions, projection conditions, the amount of exposure, the spectral characteristics of the light from the light source, and the output characteristics of the light source.

In the present specification, the terms "parameter", "parameter value", and "parameter information" have the meanings below when used.

The "parameter" is an item representing a variable.

The "parameter value" is the value of the variable described above. That is, the "parameter value" is a specific numerical value of the parameter described above.

The "parameter information" is a collection of data containing a plurality of variables and the values of the plurality of variables.

Specific examples of the parameter information will be described later (FIG. 44). For example, spectral linewidth parameter information is a collection of data containing variables (items) representing the spectral linewidth and the values thereof, and variables representing spectral linewidth stability (operation range) and the values thereof. The value representing the spectral linewidth stability includes, for example, the lower and upper limits of the operation range. The spectral linewidth parameter information may also include data on a variable representing the period for which the light source operates with the spectral linewidth value and the stability satisfied, and the value of the variable.

Notation with the term "target", such as a "target parameter" and "target parameter information", means a parameter or parameter information that is a control target. The target parameter information may contain a target value that is a target toward which the parameter is controlled, and information representing an acceptable range of the target value. The acceptable range used herein may be interpreted as the operation range, operation specifications, variation range, or stability range of the parameter.

"Priority target parameter information" is a collection of data on an item of a variable that is a target parameter prioritized in the operation of the light source and a target value of the variable. Specific examples of the priority target parameter information will be described later (FIG. 45).

The priority target parameter information further includes two cases below.

(a) The priority target parameter information also includes a case where a user selects one of the following priority modes: light source optical performance priority mode operation; consumable life extension mode operation; and consumption reduction mode operation.

(b) The priority target parameter information also includes a case where the collection of data including the item of the variable of the priority target parameter, and the target value of the variable is presented as a proposal based on which the light source can be operated, and the user selects an item of a variable that is a priority target parameter of the light source.

The variety of types of priority mode operation will now be defied below.

The light source optical performance priority mode operation refers to operation of operating the light source in such a way that the optical performance of the light source is prioritized.

The consumable life extension mode operation refers to the operation of operating the light source in such a way that the life of any of the consumables of the light source is extended.

The consumption reduction mode operation refers to the operation of operating the light source in such a way that the electric power and gas consumed by the light source are reduced. The electric power and the laser gas are each an element consumed by the operation of the light source.

"Recommended target parameter information" is a collection of data on an item of a variable of a parameter required to be relaxed in terms of specifications, and a target value of the parameter, the parameter being different from the priority target parameter estimated when the light source is operated under the target parameter information prioritized in the operation of the light source. Specific examples of the recommended target parameter information will be described later (FIG. 46).

"Maintenance information" is a collection of data on the number of remaining pulses or a remaining period until maintenance of the consumables of the light source that are required to be periodically replaced with the operation of the light source stopped. Specific examples of the maintenance information will be described later (FIG. 47).

The number of remaining pulses or the remaining period until the maintenances for each of the consumables is a value representing the life of the consumable (remaining life before maintenance). When the number of pulses per unit period, such as the average number of pulses per day, is known, the number of remaining pulses until the maintenance of the consumable can be converted into the remaining period. The number of remaining pulses until the maintenance may be used as a parameter representing the life of the consumable, or the remaining period or both the two factors may be used. The maintenance information may also include information on the date and time representing the timing when the consumable is to be replaced.

An "operation control target parameter" is a light source control target parameter necessary for the light source to achieve the priority target parameter information. The "operation control target parameter information" is a collection of the operation control target parameter and the target value thereof, and a plurality of operation control target parameters may be set to satisfy the specifications of a plurality of requirements. Specific examples of the operation control target parameter information will be described later (FIG. 48).

An "external apparatus" is an apparatus that receives at least one of the priority target parameter information, the recommended target parameter information, and the maintenance information. Specifically, the external apparatus can, for example, be a semiconductor factory management system, a display apparatus (for informing operator of priority control parameter information, recommended target parameter information, maintenance information, and other pieces of information), an exposure apparatus, an exposure apparatus management system.

2. Description of Semiconductor Manufacturing System

2.1 Configuration

FIG. 1 schematically shows the configuration of an exemplary semiconductor manufacturing system 200 in a semiconductor factory. The semiconductor manufacturing system 200 includes a plurality of lithography systems 10, a wafer inspection apparatus management system 202, an exposure apparatus management system 204, a light source management system 206, and a semiconductor factory management system 208.

The semiconductor factory management system 208 is connected to the wafer inspection apparatus management system 202, the exposure apparatus management system 204, and the light source management system 206 via a network 210.

The network 210 is a communication line that allows information transmission via a wire and/or wirelessly. The network 210 may be a wide area network or a local area network.

To identify each of the plurality of lithography systems 10 provided in the semiconductor manufacturing system 200, lithography system identification characters #1, #2, . . . #k, . . . #w are used in the description. Reference character w represents the number of lithography systems provided in the semiconductor manufacturing system 200. Reference character w is an integer greater than or equal to one. Reference character k is an integer greater than or equal to one but smaller than or equal to w.

The lithography system #k includes a wafer inspection apparatus 12, an exposure apparatus 14, and a light source 16. For convenience of the description, the wafer inspection apparatus 12, the exposure apparatus 14, and the light source 16 provided in the lithography system #k are referred to as a wafer inspection apparatus #k, an exposure apparatus #k, and a light source #k, respectively. For simplicity, the lithography system #k described below has a form including one wafer inspection apparatus #k, one exposure apparatus #k, and one light source #k.

Part or entirety of the plurality of lithography systems #1 to #w may have forms different from one another. The number of wafer inspection apparatuses #k, exposure apparatuses #k, and light sources #k, the arrangement thereof, and other factors thereof in the lithography system #k can be designed as appropriate. The lithography system #k includes one or more wafer inspection apparatuses #k, one or more exposure apparatuses #k, and one or more light sources #k.

The wafer inspection apparatus management system 202 is connected to each of the wafer inspection apparatuses #1 to #w via a first local area network 211. The exposure apparatus management system 204 is connected to each of the exposure apparatuses #1 to #w via a second local area network 212. The light source management system 206 is connected to each of the light sources #1 to #w via a third local area network 213.

In FIG. 1, the first local area network 211 is expressed by "LAN1", the second local area network 212 is expressed by "LAN2", and the third local area network 213 is expressed by "LAN3".

2.2 Operation

The wafer inspection apparatuses #1 to #w measure on a wafer basis physical property values of the surface of the wafer on which a photoresist pattern has been formed. The "physical property values" are, for example, a CD value, the overlay, the magnification, and the height of the surface. The wafer inspection apparatus management system 202 acquires the physical property values measured on a wafer basis from each of the wafer inspection apparatuses #1 to #w and saves data on the measured physical property values on a wafer basis in the corresponding lithography systems #k. Furthermore, the wafer inspection apparatus management system 202 organizes and saves the data on the physical property values for each wafer scan field of the wafer. The wafer inspection apparatus management system 202 then outputs as necessary some or all of the measured data, for example, to the semiconductor factory management system 208 and a data analysis server that is not shown.

The exposure apparatus management system 204 acquires data containing exposure conditions and measured values for each wafer and scan field from the exposure apparatuses #1 to #w. The "exposure conditions" are, for example, projection conditions and illumination conditions. The "measured values" are, for example, the amount of exposure and focus positions. The exposure apparatus management system 204 saves the data on the exposure conditions and the measured values for each lithography system, for each wafer, and for each scan field. The exposure apparatus management system 204 outputs some or all of the measured data, for example, to the semiconductor factory management system 208 and the data analysis server as necessary.

The light source management system 206 acquires operation data from each of the light sources #1 to #w and saves the operation data of the light source #k for the lithography system #k. The operation data includes, for example, data on spectral characteristic values, data on pulse energy characteristic values, and data on output characteristic values of the laser light. The spectral characteristic values are, for example, the wavelength and the spectral linewidth. The output characteristic values of the laser light are, for example, a pulse energy value, σ (standard deviation value) representing variation in the pulse energy, dose stability, the number of pulses per unit period, and a duty ratio. The operation data includes measured data measured with sensors or other components during the operation of the light source #k.

The light source management system 206 organizes and saves the variety of data on a lithography system basis, on a wafer basis, and on a scan field basis, and outputs some or all of the measured data, for example, to the semiconductor factory management system 208 and the data analysis server as necessary.

The semiconductor factory management system 208 manages the entire semiconductor factory. The semiconductor factory management system 208 receives information acquired, for example, by each of the wafer inspection apparatus management system 202, the exposure apparatus management system 204, and the light source management system 206.

3. Description of Lithography System

3.1 Configuration

Figure 2:
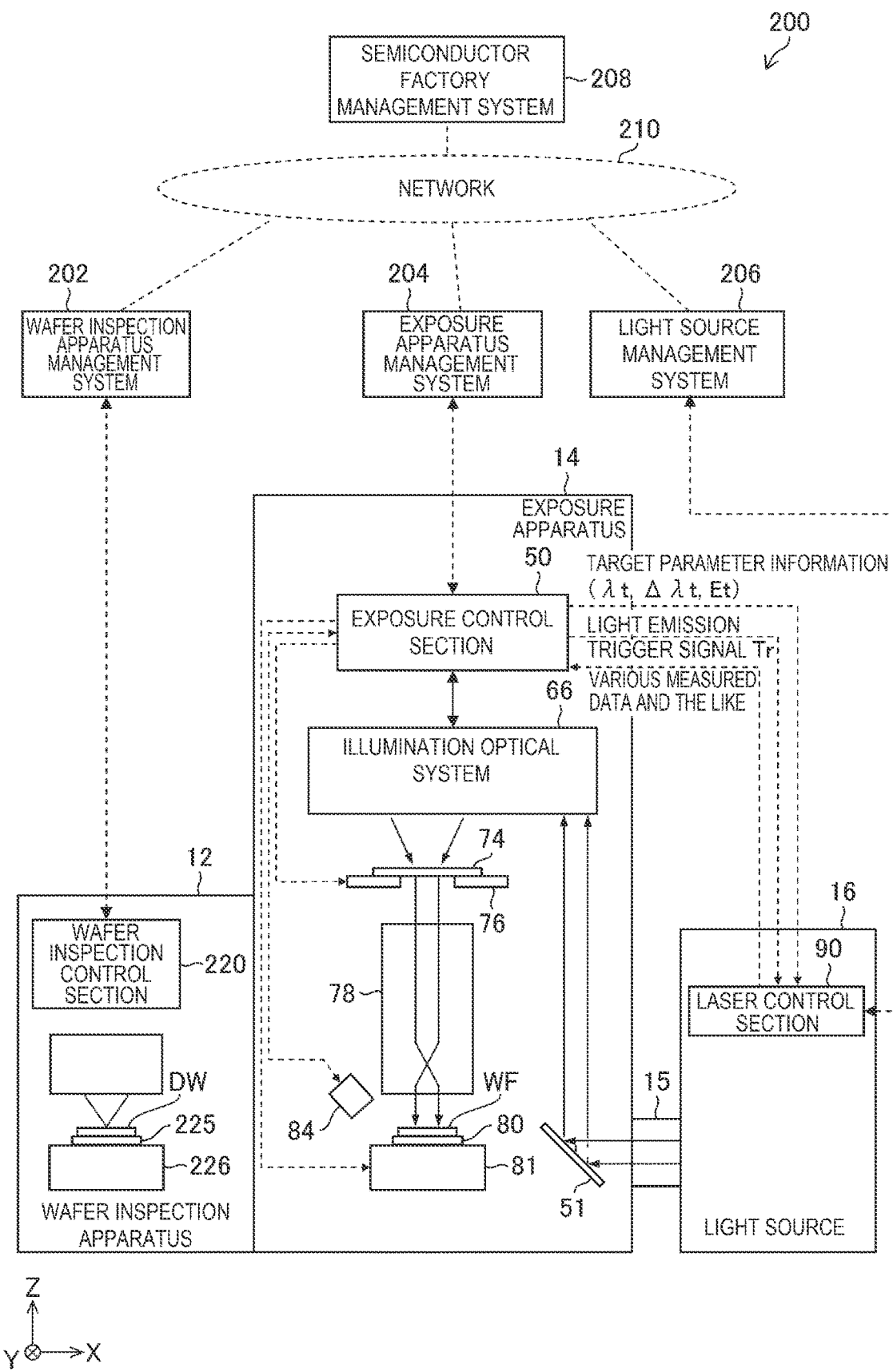
FIG. 2 schematically shows the configuration of a lithography system.

FIG. 2 schematically shows an example of the configuration of the lithography system #k. The lithography system #k includes the wafer inspection apparatus 12, the exposure apparatus 14, and the light source 16.

The wafer inspection apparatus 12 irradiates the wafer with laser light and measures the light reflected off or diffracted by the wafer to allow the measurement below. That is, the wafer inspection apparatus 12 is capable of measurement including the CD, the height of the wafer, and the overlay. The wafer inspection apparatus 12 may be a high-resolution scanning electron microscope (SEM). The wafer inspection apparatus 12 includes a wafer inspection control section 220, a wafer holder 225, and a wafer stage 226.

The exposure apparatus 14 includes an exposure control section 50, a beam delivery unit (BDU) 15, a highly reflective mirror 51, an illumination optical system 66, a reticle 74, a reticle stage 76, a projection optical system 78, a wafer holder 80, a wafer stage 81, and a focus sensor 84. The exposure apparatus #k includes an exposure sensor that is not shown but measures the amount of exposure on a wafer WF held by the wafer holder 80.

The illumination optical system 66 shapes the incident laser beam into a static exposure area SEA (see FIG. 5) having a rectangular shape and an approximately uniform optical intensity distribution. The illumination optical system 66 generates illumination patterns that are not shown but allow changes in the illumination conditions under which the reticle 74 is illuminated. The illumination patterns may, for example, allow polarized light illumination, annular illumination, and dipole illumination. The projection optical system 78 is so disposed that an image of the reticle pattern is formed on the wafer WF and includes, for example, a diaphragm that is not shown but is so disposed that the conditions under which the projection optical system 78 forms an image can be adjusted for numerical aperture (NA) adjustment.

The focus sensor 84 is so disposed that the distance between the surface of the wafer WF and the projection optical system 78 can be measured.

The light source 16 is, for example, an excimer laser apparatus capable of narrowed-line oscillation with the wavelength and the spectral linewidth being changeable, and includes a laser control section 90, and a monitor module, a chamber, a line narrowing module, an output coupler, and other apparatuses that are not shown in FIG. 2. An example of a detailed configuration of the excimer laser apparatus will be described later with reference to FIG. 5.

In the present disclosure, a control apparatus that functions as each of the exposure control section 50, the laser control section 90, and other control sections can be achieved by a combination of hardware including one or more computers and software installed thereon. The software is synonymous with a program. A programmable controller is encompassed in the concept of a computer. The computer includes a CPU (central processing unit) and a memory. Part or entirety of the processing functions of the control apparatus may be achieved by using an integrated circuit represented by an FPGA (field programmable gate array) and an ASIC (application specific integrated circuit).

The functions of a plurality of control apparatuses can be achieved by a single control apparatus. Furthermore, in the present disclosure, the control apparatuses may be connected to each other via a communication network, such as a local area network and the Internet. In a distributed computing environment, a program unit may be saved in both local and remote memory storage devices.

3.2 Operation

The exposure control section 50 outputs a variety of target parameter values to the light source 16. The target parameter values provided from the exposure control section 50 to the light source 16 include a target wavelength $\lambda t$, a target spectral linewidth $\Delta\lambda t$, target pulse energy Et, and other target parameter values.

The laser control section 90 controls a wavelength and a wavelength bandwidth selected by the line narrowing module, which will be described later, of a laser resonator in such a way that the wavelength and the spectral linewidth of the light output from the light source 16 are the target wavelength $\lambda t$ and the target spectral linewidth $\Delta\lambda t$. The laser control section 90 then causes the light source 16 to output pulse laser light in synchronization with a light emission trigger signal Tr, and outputs data measured by the monitor module, which will be described later, to the exposure control section 50 and the light source management system 206. The data measured by the monitor module includes a wavelength $\lambda$, a spectral linewidth $\Delta\lambda$, pulse energy E, and other factors.

The exposure control section 50 controls the reticle stage 76 and the wafer stage 81 while outputting the light emission trigger signal Tr to scan and expose the photoresist with which the wafer WF is coated with the image of the reticle 74 in a step-and-scan scheme which will be described later. The exposure control section 50 then outputs data on the exposure conditions to the exposure apparatus management system 204. The data on the exposure conditions include, for example, the conditions of the illumination optical system 66 (illumination pattern), a dose (amount of exposure), focusing (distance between projection optical system 78 and wafer surface), and the conditions of the projection optical system 78 (NA, for example).

The wafer inspection apparatus 12 measures the physical property values (including, for example, CD value, overlay, magnification, and surface height) of the wafer WF, on which a photoresist pattern has been formed after a developer that is not shown develops the wafer WF having undergone the exposure as described above. The wafer inspection control section 220 then outputs data produced by the measurement to the wafer inspection apparatus management system 202.

4. Example of Exposure Pattern onto Wafer

Figure 3:
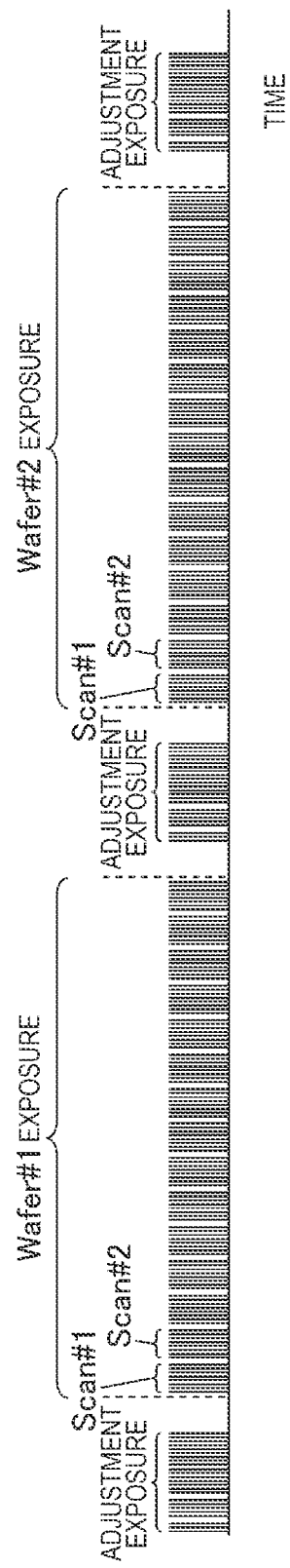
FIG. 3 shows an example of an output pattern of a light emission trigger signal output from an exposure control section to a laser control section.

FIG. 3 shows an example of an output pattern of the light emission trigger signal Tr output from the exposure control section 50 to the laser control section 90. In the example, after adjustment exposure is performed for each wafer WF, an actual exposure pattern is used to perform actual exposure. The light source 16 suspends the oscillation during the stepping operation period in the step-and-scan exposure, and outputs the pulse laser light in accordance with the interval between the light emission trigger signals Tr during the scanning operation period. Such a laser oscillation pattern is called a burst operation pattern.

Figure 4:
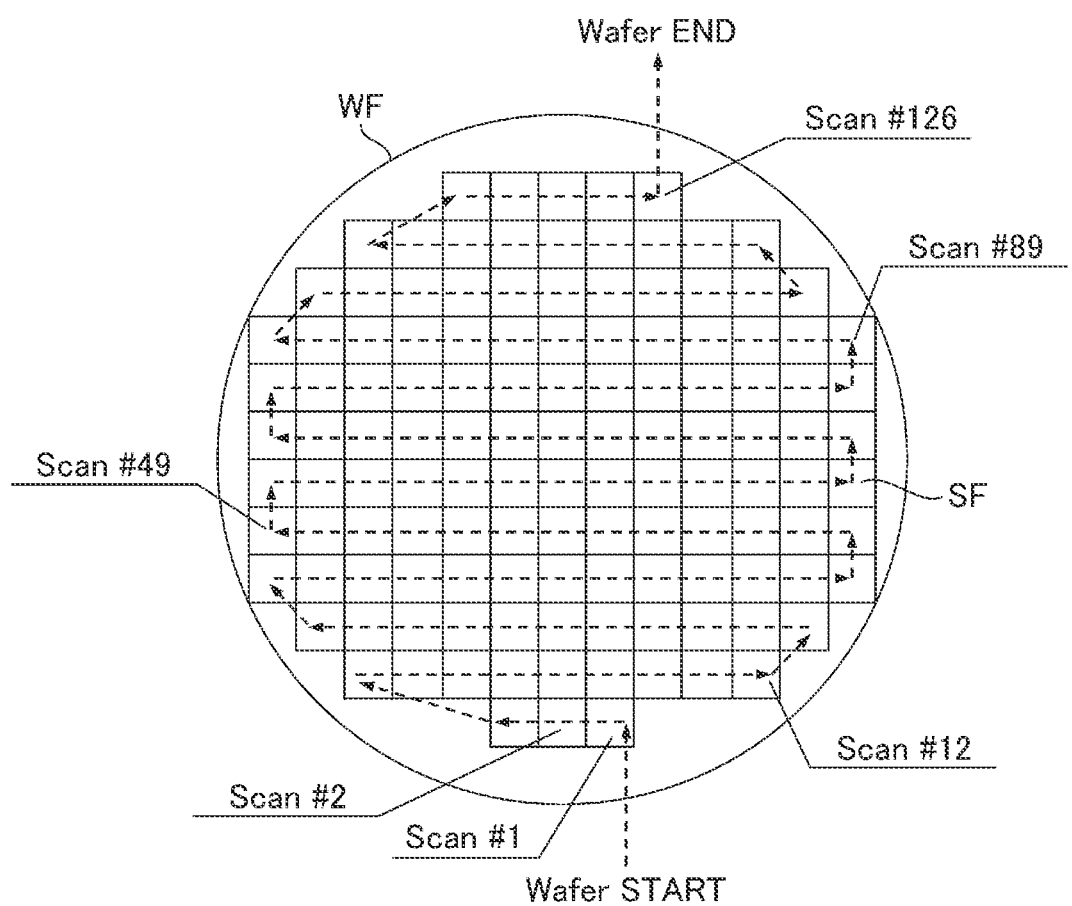
FIG. 4 shows an example of an exposure pattern in step-and-scan exposure on a wafer.

FIG. 4 shows an example of an exposure pattern in the step-and-scan exposure on the wafer WF. A large number of rectangular regions shown within the wafer WF in FIG. 4 are each a scan field SF. The scan field SF is an exposure region where single scan exposure is performed and is also called a scan region. The wafer exposure is performed by the scan exposure performed on each of a plurality of exposure regions (scan fields SF), into which the wafer WF is divided and which each have a predetermined size, during the period between the start (Wafer START) and the end (Wafer END) of the wafer exposure, as shown in FIG. 4.

That is, in the wafer exposure, the following steps are repeated: the step of exposing a first predetermined exposure region of the wafer WF in first scan exposure (Scan #1); and then exposing a second predetermined exposure region in second scan exposure (Scan #2). During single scan exposure, pulse laser light can be continuously output multiple times from the laser apparatus. The scan exposure described above is successively repeated, and when the scan exposure of all the exposure regions of a first wafer WF is completed, the adjustment exposure is performed again, and the wafer exposure of a second wafer WF is performed.

The step-and-scan exposure is performed in the order indicated by the broken-line arrows shown in FIG. 4, Wafer START→Scan #1→Scan #2→ . . . →Scan #126→Wafer END. The wafer WF is an example of a semiconductor substrate (photosensitive substrate) onto which a photoresist has been applied.

Figure 5:
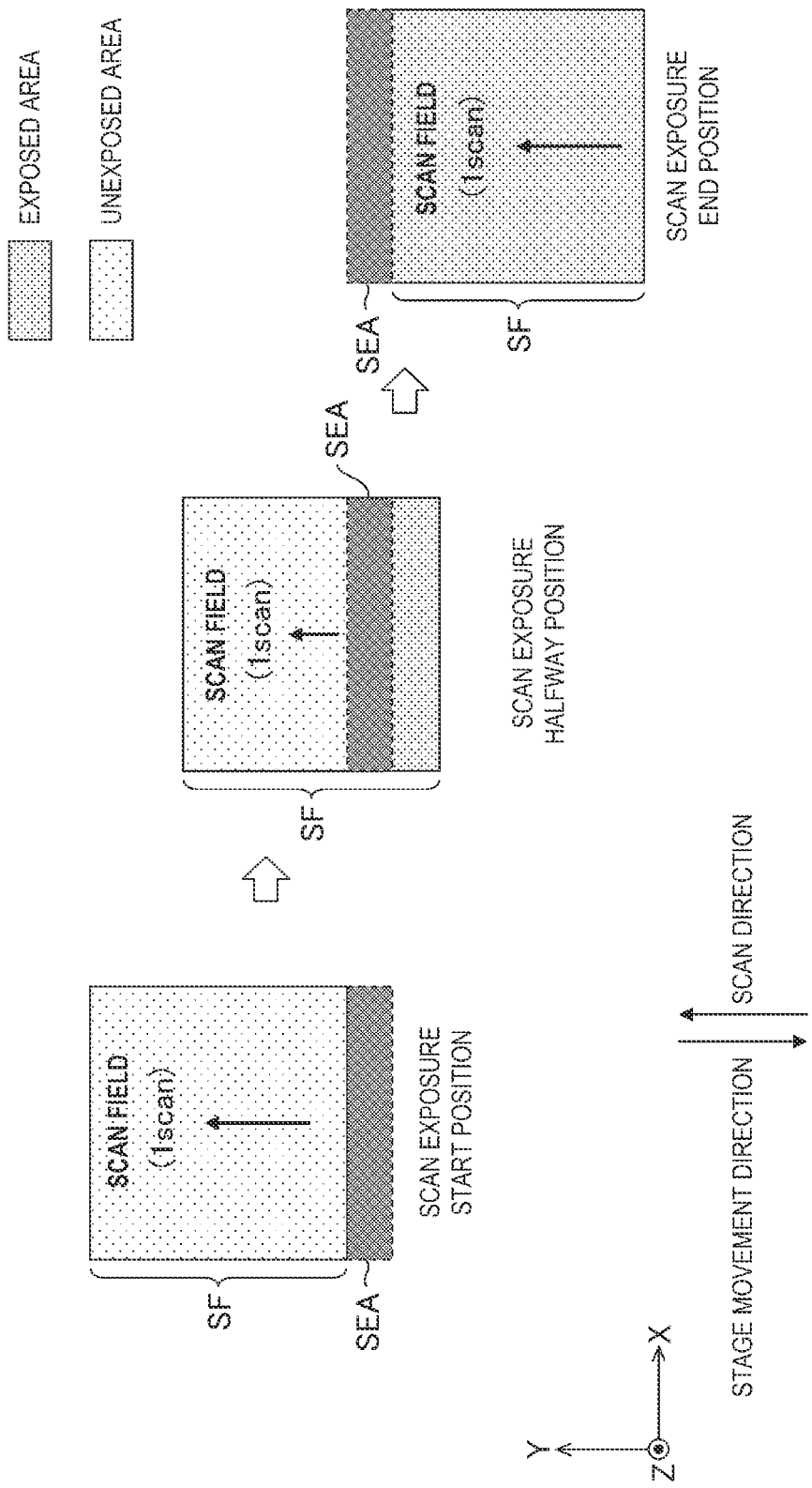
FIG. 5 shows the relationship between one scan field and a static exposure area of the wafer.

FIG. 5 shows the relationship between one scan field SF and the static exposure area SEA of the wafer WF. In the static exposure area SEA, the reticle 74 is irradiated with a rectangular laser beam having an approximately uniform optical intensity distribution, and the exposure is performed with the reticle 74 and the wafer WF moved in directions different from each other along the minor axis (axis Y) in accordance with the reduction magnification of the projection optical system 78, so that the scan field SF of the wafer WF is exposed to the reticle pattern.

This example shows a case where during the scan exposure, the wafer stage 81 is moved in the negative direction of the axis Y, and the scan is performed in the positive direction of the axis Y. Note that the movement of the wafer stage 81 in the positive direction of the axis Y may be combined with the scan performed in the negative direction of the axis Y to shorten the movement period in the next step.

Figure 6:
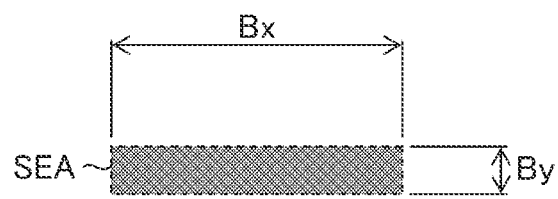
FIG. 6 shows an example of the static exposure area.

Now, the number of pulses Ns of the pulse laser light radiated to the photoresist while scan exposure is performed is called an N slit. As shown in FIG. 6, let By be the length of the static exposure area SEA, in the minor axis direction, over which batch exposure can be performed, and Bx be the length of the exposure area SEA in the major axis direction, and the N slit is expressed by the expression below.

$$Ns = f \cdot Vw / By$$

In the expression, Vw represents the speed at which the wafer WF is scanned, and f represents the repetition frequency at which the light source emits light.

5. Example of Light Source

5.1 Configuration

Figure 7:
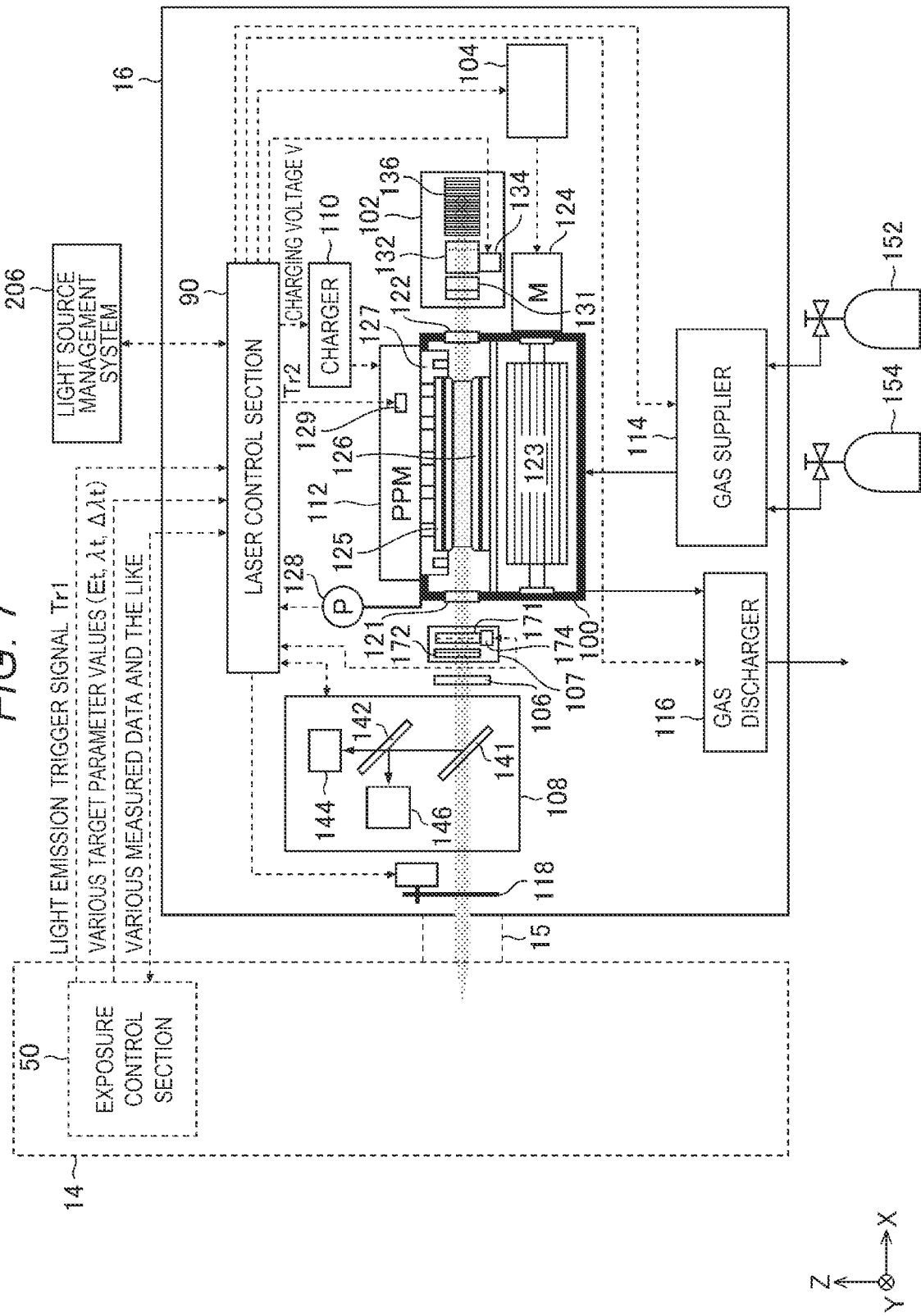
FIG. 7 schematically shows the configuration of an exemplary light source for an exposure apparatus.

FIG. 7 schematically shows the configuration of an exemplary light source 16. The light source 16 is, for example, a KrF excimer laser apparatus and includes a chamber 100, a line narrowing module (LNM) 102, an inverter 104, an output coupler (OC) 106, a wavefront adjuster 107, a monitor module 108, a charger 110, a pulse power module (PPM) 112, a gas supplier 114, a gas discharger 116, and an exit port shutter 118.

The chamber 100 includes a first window 121, a second window 122, a cross-flow fan (CFF) 123, a motor 124, which rotates the CFF 123, a pair of electrodes 125 and 126, an electric insulator 127, a pressure sensor 128, and a heat exchanger that is not shown.

The inverter 104 is an apparatus that supplies the motor 124 with electricity. The inverter 104 receives from the laser control section 90 an instruction signal that identifies the frequency of the electric power supplied to the motor 124. Controlling the frequency provided by the inverter 104 allows control of the rotational speed of the CFF 123.

The PPM 112 is connected to the electrode 125 via feed through elements in the electric insulator 127 in the chamber 100. The PPM 112 includes a semiconductor switch 129 and the following components: a charging capacitor; a pulse transformer; and a pulse compression circuit, none of which is shown.

The LNM 102 includes a beam expander using a first prism 131 and a second prism 132, a rotary stage 134, and a grating 136. The first prism 131 and the second prism 132 are disposed to expand the light beam having exited via the second window 122 of the chamber 100 in the axis-Y direction and cause the expanded light beam to be incident on the grating 136.

The grating 136 is disposed in the Littrow arrangement, which causes the angle of incidence of the laser light incident on the grating 136 to be equal to the angle of diffraction of the laser light diffracted by the grating 136. The second prism 132 is so disposed on the rotary stage 134 that rotation of the rotary stage 134 changes the angle of incidence of the laser light incident on the grating 136 and the angle of diffraction of the laser light diffracted by the grating 136.

The OC 106 is a partially reflective mirror and is so disposed that the OC 106 and the LNM 102 form an optical resonator. The chamber 100 is disposed in the optical path of the optical resonator.

The wavefront adjuster 107 is disposed between the OC 106 and the chamber 100. The wavefront adjuster 107 includes a cylindrical concave lens 171, a cylindrical convex lens 172, and a linear stage 174. Changing the distance between the concave lens 171 and the convex lens 172 with the aid of the linear stage 174 allows a change in the radius of curvature of the wavefront of the laser light viewed along the axis Z.

The monitor module 108 includes a first beam splitter 141, a second beam splitter 142, a pulse energy detector 144, and a spectrum detector 146. The first beam splitter 141 is disposed on the optical path of the laser light having exited via the OC 106 and so disposed that part of the laser light is reflected off the first beam splitter 141 and incident on the second beam splitter 142.

The pulse energy detector 144 is disposed to receive the laser light having passed through the second beam splitter 142. The pulse energy detector 144 may, for example, be a photodiode that measures the optical intensity of ultraviolet light. The second beam splitter 142 is so disposed to reflect part of the laser light and cause the reflected laser light to be incident on the spectrum detector 146.

The spectrum detector 146 may, for example, be an etalon spectrometer including an etalon and an image sensor. The monitor etalon spectrometer measures interference fringes produced by the etalon with the image sensor. Based on the produced interference fringes, the center wavelength and the spectral linewidth of the output pulse laser light are then measured.

In the case where a KrF excimer laser apparatus is employed, the gas supplier 114 is connected via pipes to an inert gas supply source 152, which is a source that supplies an inert laser gas, and a halogen gas supply source 154, which is a source that supplies a halogen-containing laser gas. The inert laser gas is a mixture of a Kr gas and an Ne gas. The halogen-containing laser gas is a mixture of an $F_2$ gas, a Kr gas, and an Ne gas. The gas supplier 114 is connected to the chamber 100 via a pipe.

The gas supplier 114 includes automatic valves and mass flow controllers that are not shown but supply the inert laser gas or the halogen-containing laser gas to the chamber 100 by a predetermined amount.

The gas discharger 116 is connected to the chamber 100 via a pipe. The gas discharger 116 includes a halogen filter that removes the halogen gas and a discharge pump, neither of which is shown, and discharges the laser gas from which the halogen has been removed out of the light source 16.

The exit port shutter 118 is disposed on the optical path of the laser light output from the light source 16 to the exterior thereof and can block and unblock the laser light to the exterior.

The light source 16 is so disposed that the laser light output from the light source 16 via the exit port shutter 118 enters the exposure apparatus 14.

5.2 Operation

The operation of the light source 16 will be described. The laser control section 90 discharges the gases present in the chamber 100 via the gas discharger 116 and then fill the chamber 100 with a mixed gas that is a mixture of Kr and Ne and a mixed gas that is a mixture of $F_2$, Kr, and Ne via the gas supplier 114 in such a way that a desired gas composition and total gas pressure are achieved.

The laser control section 90 causes the motor 124 to rotate the CFF 123 via the inverter 104 at a predetermined rotational speed. As a result, the laser gas flows through the space between the electrodes 125 and 126.

The laser control section 90 receives the target pulse energy Et from the exposure control section 50 of the exposure apparatus 14 and outputs data on charging voltage V, which allows the pulse laser light to have the pulse energy Et, to the charger 110.

The charger 110 charges the charging capacitor in the PPM 112 in such a way that the charging capacitor provides the charging voltage V. When a light emission trigger signal Tr1 is output from the exposure apparatus 14, a trigger signal Tr2 is input from the laser control section 90 in synchronization with the light emission trigger signal Tr1 to the semiconductor switch 129 in the PPM 112. When the semiconductor switch 129 operates, a magnetic compression circuit in the PPM 112 compresses current pulses, and high voltage is applied to the space between the electrodes 125 and 126 in accordance with the charging voltage V. As a result, discharge occurs between the electrodes 125 and 126, and the laser gas is excited in the discharge space.

When the state of the excited laser gas in the discharge space transitions to the ground state, excimer light, which is ultraviolet light, is produced. The excimer light travels back and forth between the OC 106 and the LNM 102 and is therefore amplified, resulting in laser oscillation. As a result, the narrowed-line pulse laser light is output via the OC 106.

The pulse laser light output via the OC 106 enters the monitor module 108. In the monitor module 108, part of the laser light is sampled by the first beam splitter 141 and incident on the second beam splitter 142. The second beam splitter 142 transmits the part of the laser light incident thereon, which enters the pulse energy detector 144, and the second beam splitter 142 reflects the other part of the laser light, which enters the spectrum detector 146.

The pulse energy E of the pulse laser light output from the light source 16 is measured with the pulse energy detector 144, and data on the measured pulse energy E is output from the pulse energy detector 144 to the laser control section 90.

The center wavelength $\lambda$ and the spectral linewidth $\Delta\lambda$ are measured with the spectrum detector 146, and data on the measured center wavelength $\lambda$ and spectral linewidth $\Delta\lambda$ are output from the spectrum detector 146 to the laser control section 90.

The laser control section 90 receives the target pulse energy Et, the target wavelength $\lambda$t, and the target spectral linewidth $\Delta\lambda$t from the exposure apparatus 14. The laser control section 90 controls the pulse energy based on the pulse energy E measured with the pulse energy detector 144 and the target pulse energy Et. The pulse energy control involves controlling the charging voltage V in such a way that the difference between the pulse energy E measured with the pulse energy detector 144 and the target pulse energy Et ($\Delta E = E - Et$) approaches zero.

The laser control section 90 controls the wavelength and the spectral linewidth of the pulse laser light based on the center wavelength $\lambda$ measured with the spectrum detector 146 and the target wavelength $\lambda$t. The wavelength control involves controlling the angle of rotation of the rotary stage 134 in such a way that the difference between the center wavelength $\lambda$ measured with the spectrum detector 146 and the target wavelength $\lambda$t ($\delta\lambda = \lambda - \lambda t$) approaches zero.

The spectral linewidth control involves controlling the linear stage 174 of the wavefront adjuster 107 in such a way that the difference between the spectral linewidth $\Delta\lambda$ measured with the spectrum detector 146 and the target spectral linewidth $\Delta\lambda$t ($\Delta\Delta\lambda = \Delta\lambda - \Delta\lambda t$) approaches zero.

As described above, the laser control section 90 receives the target pulse energy Et, the target wavelength $\lambda$t, and the target spectral linewidth $\Delta\lambda$t from the exposure apparatus 14 and causes the light source 16 to output, whenever the light emission trigger signal Tr1 is input to the laser control section 90, the pulse laser light in synchronization with the light emission trigger signal Tr1.

When the excimer laser apparatus repeats the discharge, the electrodes 125 and 126 wear, resulting in consumption of the halogen gas in the laser gas and generation of impurity gases. A decrease in the partial pressure of the halogen gas and an increase in the impurity gases in the chamber 100 lower the pulse energy of the pulse laser light and adversely affect the stability of the pulse energy. The laser control section 90 performs the following gas control ([1] to [4]) to suppress the adverse effects described above.

[1] Halogen Injection Control

The halogen injection control is gas control in which the halogen gas consumed primarily by the discharge in the chamber 100 is replenished in the chamber 100 during the laser oscillation by injection of the halogen-containing gas having a concentration higher than that of the halogen gas in the chamber 100. The laser control section 90 performs the control in such a way that target halogen partial pressure Hgct is achieved in the chamber 100. The target halogen partial pressure Hgct used herein is one of the operation control target parameters under which the light source 16 is operated.

[2] Partial Gas Replacement Control

The partial gas replacement control is gas control in which part of the laser gas in the chamber 100 is replaced with a new laser gas during the laser oscillation in such a way that an increase in the concentrations of the impurity gases in the chamber 100 is suppressed.

[3] Gas Pressure Control

The gas pressure control is gas control in which the pulse energy is controlled by injection of the laser gas into the chamber 100 to change total gas pressure P of the laser gas when it is difficult to control the pulse energy of the pulse laser light output from the light source 16 by changing the charging voltage V within the range over which the charging voltage V is controlled. An upper limit (HVULt) and a lower limit (HVLLt) of the range over which the charging voltage V is controlled are one of the operation control target parameters under which the light source 16 is operated.

[4] Overall Gas Replacement Control

When the laser performance (pulse energy) cannot be maintained by the control defined in [1], [2], and [3] described above, the laser oscillation is stopped, the laser gas in the chamber 100 is exhausted, the chamber is filled with a new laser gas, and the laser is again caused to oscillate for operation. The control described above is called overall gas replacement control.

A "gas consumption Gw" is now defined. The gas consumption Gw is defined as the laser gas consumed per unit number of pulses. The gas consumption Gw can be determined from an expression Gw=Ga/Ng, where Ga represent the amount of gas supplied to the chamber 100 during at least one of the halogen injection control, the partial gas replacement control, the gas pressure control, and the overall gas replacement control, and Ng represents the number of pulses of the pulse laser light output in the control.

Target gas consumption Gwt is one of the operation control target parameters under which the light source 16 is operated, and the gas control is so performed on the light source 16 that the gas consumption per unit pulse number is Gwt.

The laser control section 90 controls the gas discharger 116 to cause it to discharge the laser gas from the chamber 100. The halogen gas is removed by the halogen filter, which is not shown, from the laser gas discharged from the chamber 100, and the resultant laser gas is discharged out of the light source 16.

The laser control section 90 outputs data on the parameter values, including the number of oscillation pulses, the charging voltage V, the gas pressure P in the chamber 100, the pulse energy E of the laser light, the wavelength $\lambda$, and the spectral linewidth $\Delta\lambda$, to the exposure apparatus 14 and the light source management system 206.

5.3 Others

FIG. 7 shows an example of the narrowed-line KrF excimer laser apparatus as the light source 16, but not necessarily, and a narrowed-line ArF excimer laser apparatus may be used as the light source 16.

The case where the light source 16 has a single chamber is presented, but not necessarily, and the laser apparatus may include a master oscillator that outputs narrowed-line pulse laser light and an amplifier in which a chamber containing an excimer laser gas amplifies the pulse laser light.

In the laser apparatus including the master oscillator and the amplifier, the master oscillator may be a solid-state laser apparatus that is a combination of a solid-state laser and a nonlinear crystal and outputs narrowed-line laser light that belongs to a wavelength band within which an ArF or KrF laser light can be amplified.

5.4 Problems

Depending on a customer, the customer's process design, and a product manufactured by the customer, which target parameter information affects the product and how the information affects the product vary. The light source is guaranteed by design to operate within the specifications determined as a product.

The thus uniformly determined ranges of the target parameter information is, however, insufficient in many cases for users involved in increasingly miniaturized semiconductor manufacturing.

In actual scenes of semiconductor production, there is a growing need to monitor and control the parameters based on more detailed, strict target parameter information.

There are, however, few light sources operate based on specific priority target parameter information particularly important for individual users or in individual semiconductor processes, or lithography systems using such light sources.

6. First Embodiment

6.1 Configuration

Figure 8:
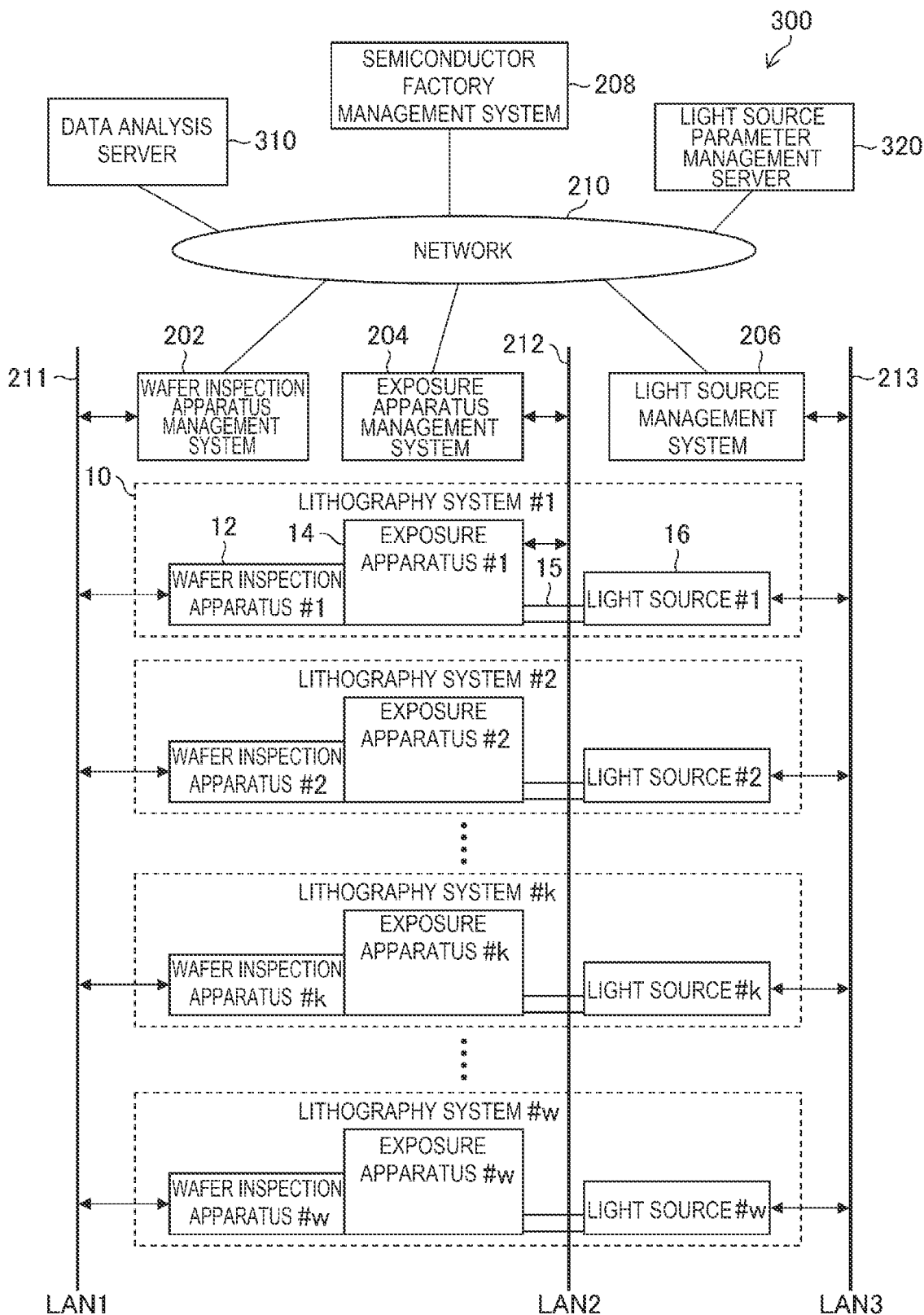
FIG. 8 shows the configuration of a semiconductor manufacturing system according to a first embodiment.

FIG. 8 shows the configuration of a semiconductor manufacturing system 300 according to a first embodiment. Differences between the configurations shown in FIGS. 8 and 1 will be described. The semiconductor manufacturing system 300 shown in FIG. 8 has the configuration of the semiconductor manufacturing system 200 shown in FIG. 1 to which a data analysis server 310 and a light source parameter management server 320 are added. The data analysis server 310 and the light source parameter management server 320 are connected to the network 210.

The data analysis server 310 and the light source parameter management server 320 each include a processor and a storage apparatus that stores a program, neither of which is shown. The storage apparatus is a tangible, non-transitory computer readable medium, including, for example, a memory that is a primary storage apparatus and a storage that is an auxiliary storage apparatus. The computer readable medium may, for example, be a semiconductor memory, a hard disk drive (HDD) apparatus, or a solid-state drive (SSD) apparatus, or a combination of a plurality of the components described above. The processor includes a CPU and carries out a variety of processes by executing instructions of the program. The processor may be a combination of a CPU and a graphics processing unit (GPU) or may include an integrated circuit such as a programmable logic device (PLD).

6.2 Operation

Figure 9:
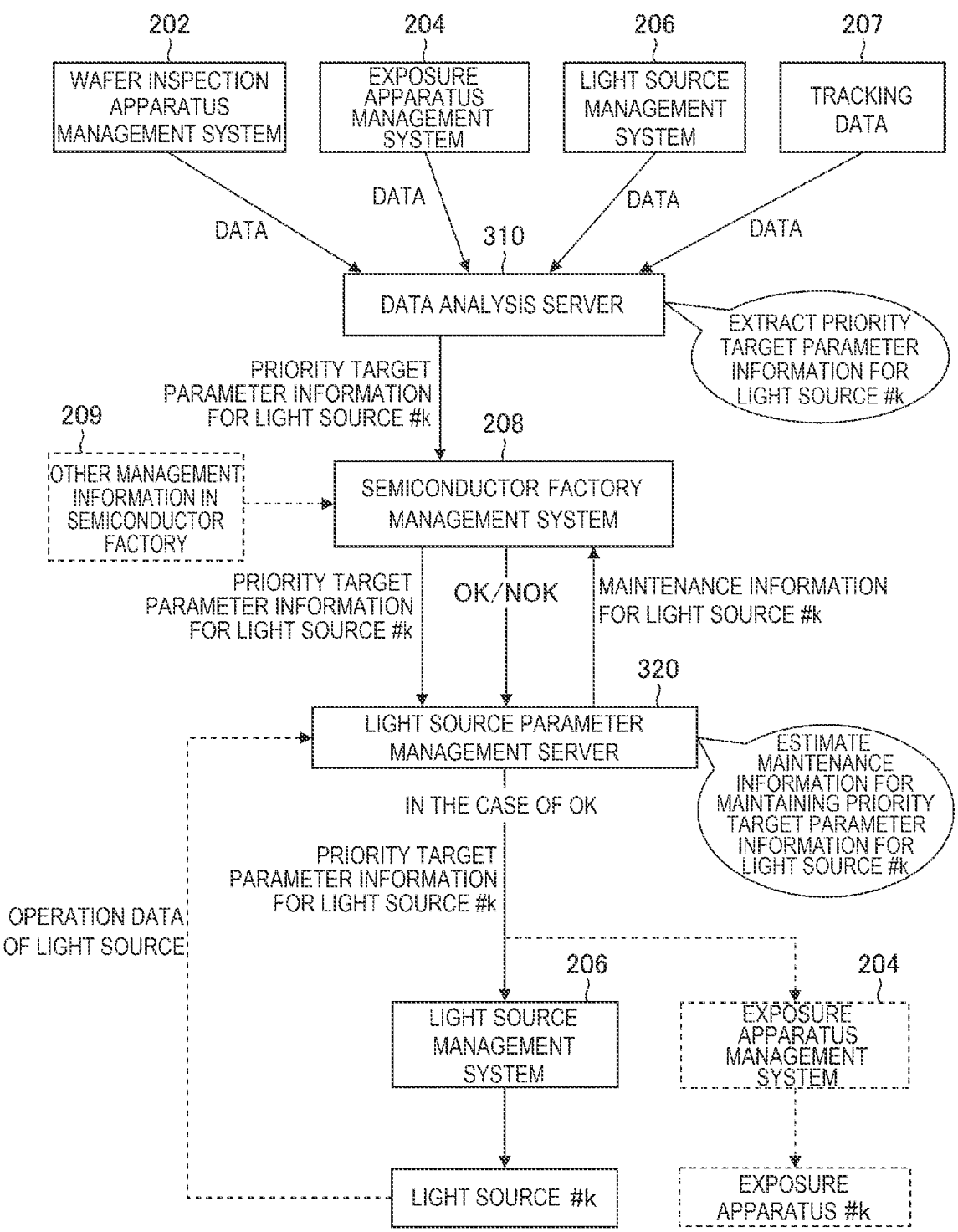
FIG. 9 is a block diagram showing the overall procedure of processes carried out by the semiconductor manufacturing system according to the first embodiment.

FIG. 9 is a block diagram showing the overall procedure of processes carried out by the semiconductor manufacturing system 300. The data analysis server 310 executes steps (A-1 to A-5) below.

Step A-1: The data analysis server 310 acquires data from the wafer inspection apparatus management system 202, data from the exposure apparatus management system 204, data from the light source management system 206, and tracking data 207 in the factory, and organizes and stores the variety of data on a lithography system basis, on a wafer basis, and on a scan basis. The tracking data 207 includes, for example, data on a tracked yield of chips in the wafer.

Step A-2: The data analysis server 310 analyzes the parameter information on the parameters of the lithography system #k that have been organized and saved in step A-1. The analysis method used by the data analysis server 310 may, for example, be the method described in Patent Literature 4.

Step A-3: The data analysis server 310 extracts parameters of the light source #k that greatly affect the exposure performance parameter from the result of the analysis performed in step A-2.

Step A-4: The data analysis server 310 determines the priority target parameter information for the light source #k based on the relationship between the parameters of the light source #k extracted in step A-3 and the exposure performance parameter.

Step A-5: The data analysis server 310 outputs the priority target parameter information for the light source #k determined in step A-4 to the semiconductor factory management system 208.

The semiconductor factory management system 208 executes steps (B-1 and B-2) below.

Step B-1: The semiconductor factory management system 208 receives the priority target parameter information for the light source #k and other management information 209 in the semiconductor factories. The other management information 209 in the semiconductor factory is data containing, for example, processes carried out in the semiconductor factory, semiconductor yields, factory line schedules, and semiconductor manufacturing costs.

Step B-2: The semiconductor factory management system 208 outputs the priority target parameter information for the light source #k to the light source parameter management server 320 based on the acquired priority target parameter information and the other management information in the semiconductor factory.

The light source parameter management server 320 executes steps (C-1 to C-3) below.

Step C-1: The light source parameter management server 320 receives the priority target parameter information from the semiconductor factory management system 208.

Step C-2: The light source parameter management server 320 estimates the maintenance information for the light source #k in the case where the priority target parameter information is set.

Step C-3: The light source parameter management server 320 outputs the maintenance information to the semiconductor factory management system 208.

The semiconductor factory management system 208 further executes steps (B-4 and B-5) below.

Step B-4: The semiconductor factory management system 208 receives the maintenance information for the light source #k.

Step B-5: The semiconductor factory management system 208 evaluates whether the operation of the light source #k is permitted (OK/NOK) based on the other management information 209 in the semiconductor factory and the maintenance information for the light source #k, and outputs the result of the evaluation to the light source parameter management server 320. The semiconductor factory management system 208 outputs an OK signal when the operation of the light source #k is permitted (when result of evaluation is OK), and outputs an NOK signal when the operation of the light source #k is not permitted (when result of evaluation is NOK).

The light source parameter management server 320 further executes steps (C-4 to C-6) below.

Step C-4: When the result of the evaluation is OK, which permits the operation of the light source #k, the light source parameter management server 320 outputs the priority target parameter information to the light source #k via the light source management system 206. As a result, the priority target parameter information is set in the light source #k, and the light source #k is controlled and operated based on the priority target parameter information.

Step C-5: When the result of the evaluation is OK, the light source parameter management server 320 estimates the maintenance information from the operation data of the light source #k in the case where the light source #k is operated with the priority target parameter information satisfied, and outputs the estimated maintenance information to the semiconductor factory management system 208.

Step C-6: On the other hand, when the result of the evaluation is NOK, which does not permit the operation of the light source #k, the light source parameter management server 320 outputs a signal that instructs the light source #k to stop operating (operation stop signal) via the light source management system 206. As a result, the light source #k stops operating.

The procedure of the processes carried out by each of the data analysis server 310 and the light source parameter management server 320 will be further described.

6.2.1 Example of Processes Carried Out by Data Analysis Server

Figure 10:
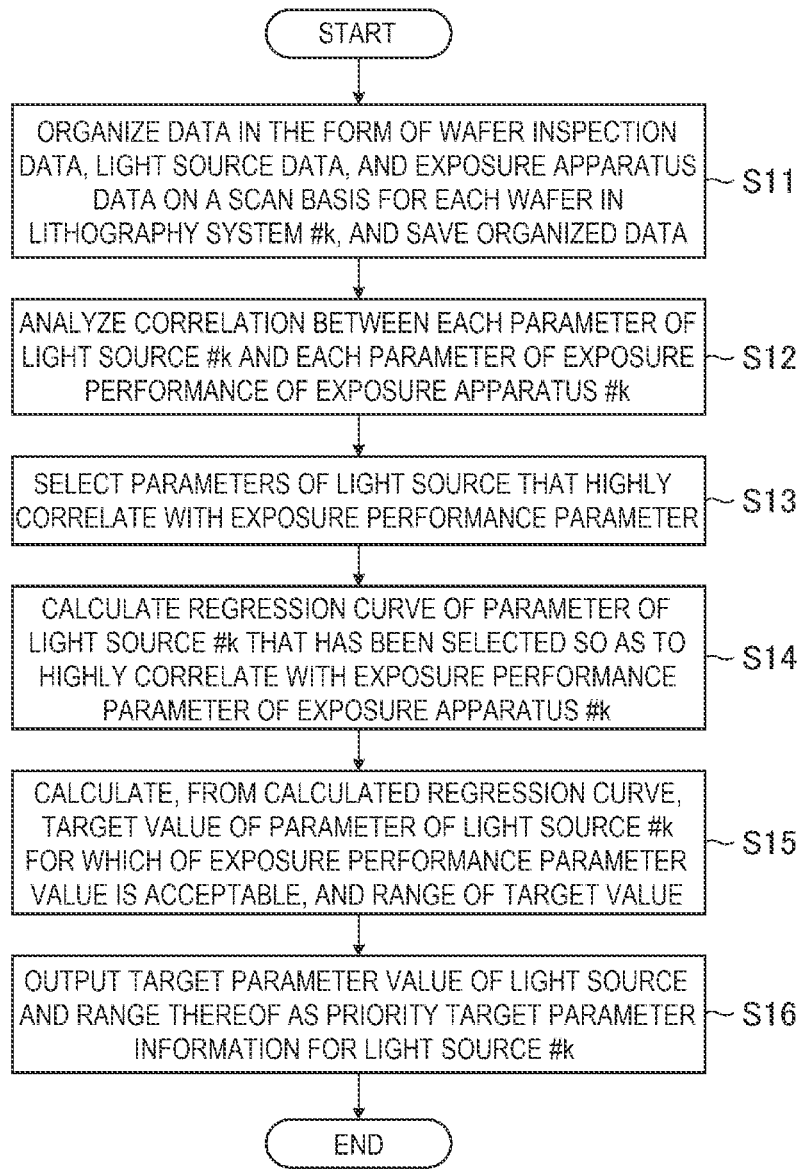
FIG. 10 is a flowchart showing an example of the contents of processes carried out by a data analysis server.

FIG. 10 is a flowchart showing an example of the contents of the processes carried out by the data analysis server 310. The processes in the steps shown in FIG. 10 are achieved by the program executed by the processor provided in the data analysis server 310.

When the flowchart of FIG. 10 starts, the data analysis server 310 acquires in step S11 a variety of data, for example, from the wafer inspection apparatus management system 202, the exposure apparatus management system 204, and the light source management system 206, organizes the data in the form of wafer inspection data, light source data, and exposure apparatus data on a scan basis for each wafer in the lithography system #k, and saves the organized data.

In step S12, the data analysis server 310 analyzes the correlation between each of the parameters of the light source #k and each of the parameters of the exposure performance of the exposure apparatus #k.

In step S13, the data analysis server 310 selects parameters of the light source #k that highly correlate with the exposure performance parameter.

In step S14, the data analysis server 310 calculates a regression curve for the parameters of the light source #k that have been selected as those that highly correlate with the exposure performance parameter of the exposure apparatus #k.

Figure 11:
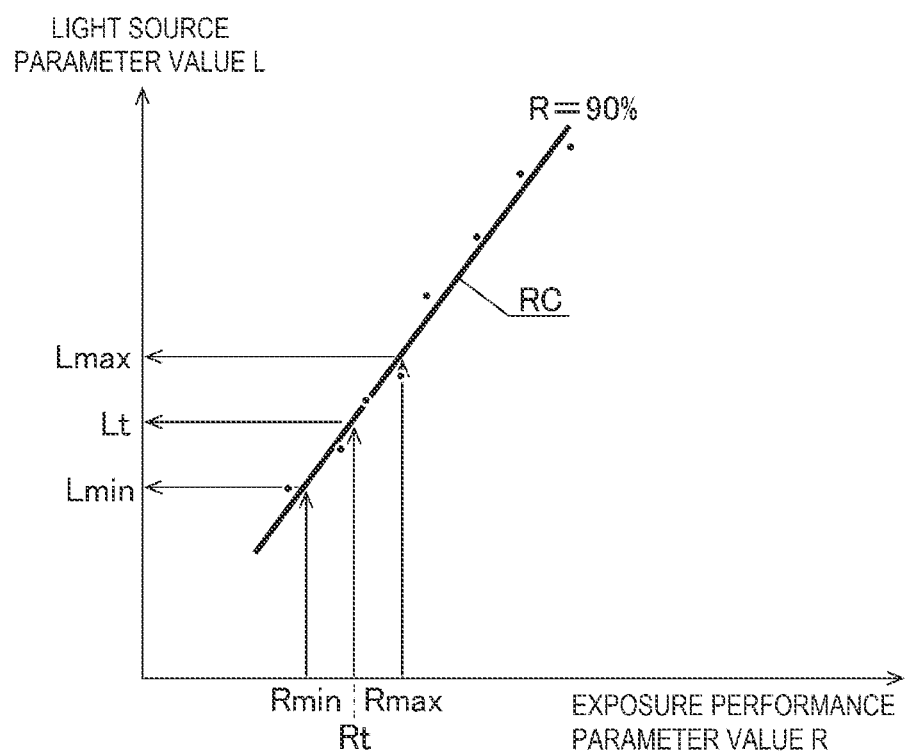
FIG. 11 is a graph showing how to determine target values of light source parameters and the ranges thereof from a regression curve.

In step S15, the data analysis server 310 calculates, from the calculated regression curve, target values of the parameters of the light source #k for which the exposure performance parameter value is acceptable, and the ranges of the target values (see FIG. 11).

In step S16, the data analysis server 310 outputs the target parameter values of the light source #k and the ranges thereof as the priority target parameter information for the light source #k. After step S16, the data analysis server 310 terminates the flowchart of FIG. 10.

FIG. 11 is a graph showing how to determine the target values of the light source parameters and the ranges thereof from the regression curve. The horizontal axis of FIG. 11 represents an exposure performance parameter value R, and the vertical axis of FIG. 11 represents a light source parameter value L. A regression curve RC is a regression curve of the light source parameters of the light source #k that have been selected as those that highly correlate with the exposure performance parameters of the exposure apparatus #k.

Based on a target value Rt of the exposure performance parameter of the exposure apparatus #k and acceptable lower and upper limits Rmin, Rmax, which indicate the acceptable range, a target value Lt of a light source parameter and acceptable lower and upper limits Lmin, Lmax, which indicate the acceptable range of the target value Lt, can be determined from the regression curve RC. The collection of thus obtained data, including the target value Lt of the light source parameter and the acceptable lower and upper limits Lmin, Lmax, can be the priority target parameter information for the light source.

Figure 12:
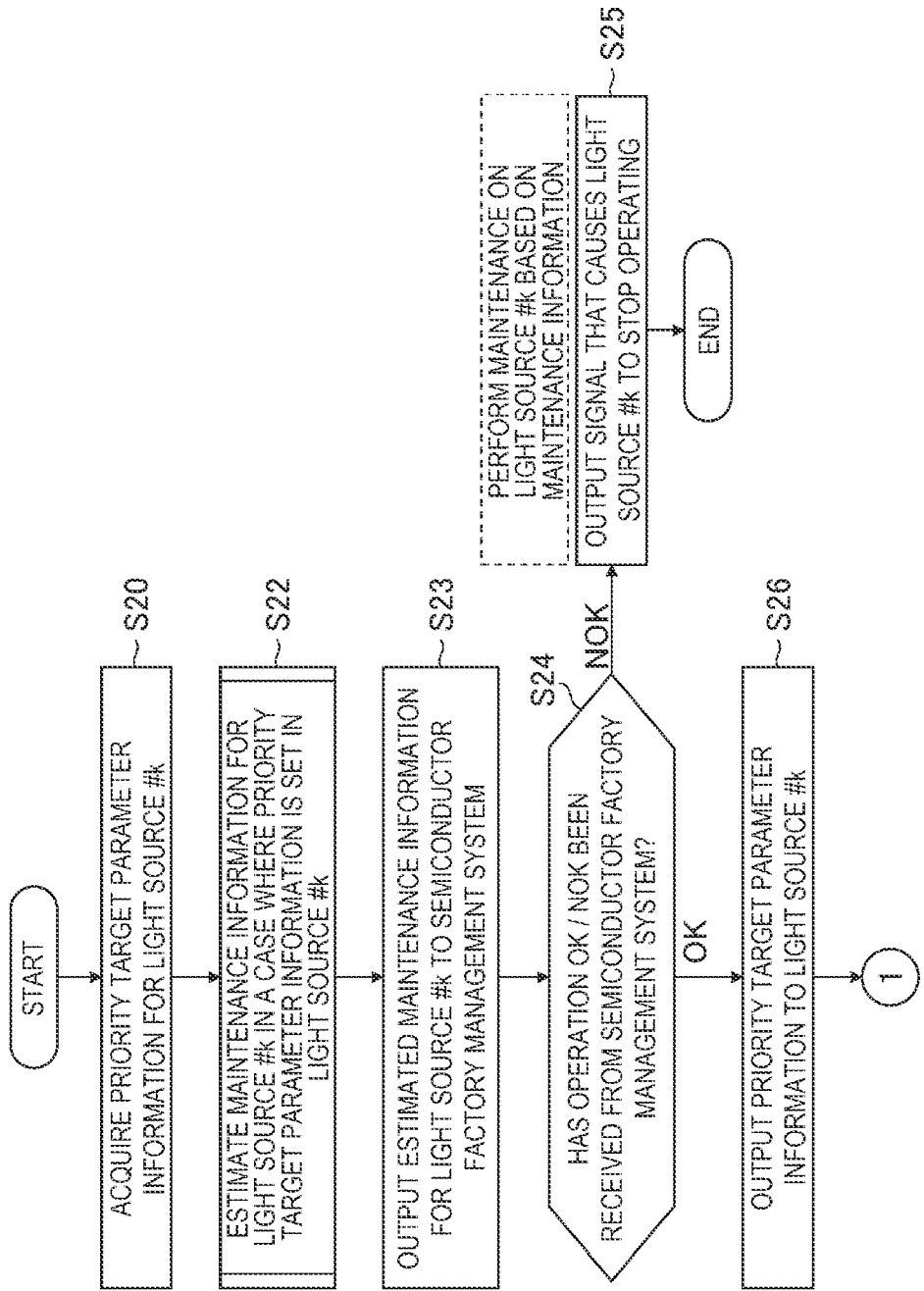
FIG. 12 is a flowchart showing an example of the contents of processes carried out by a light source parameter management server.
Figure 13:
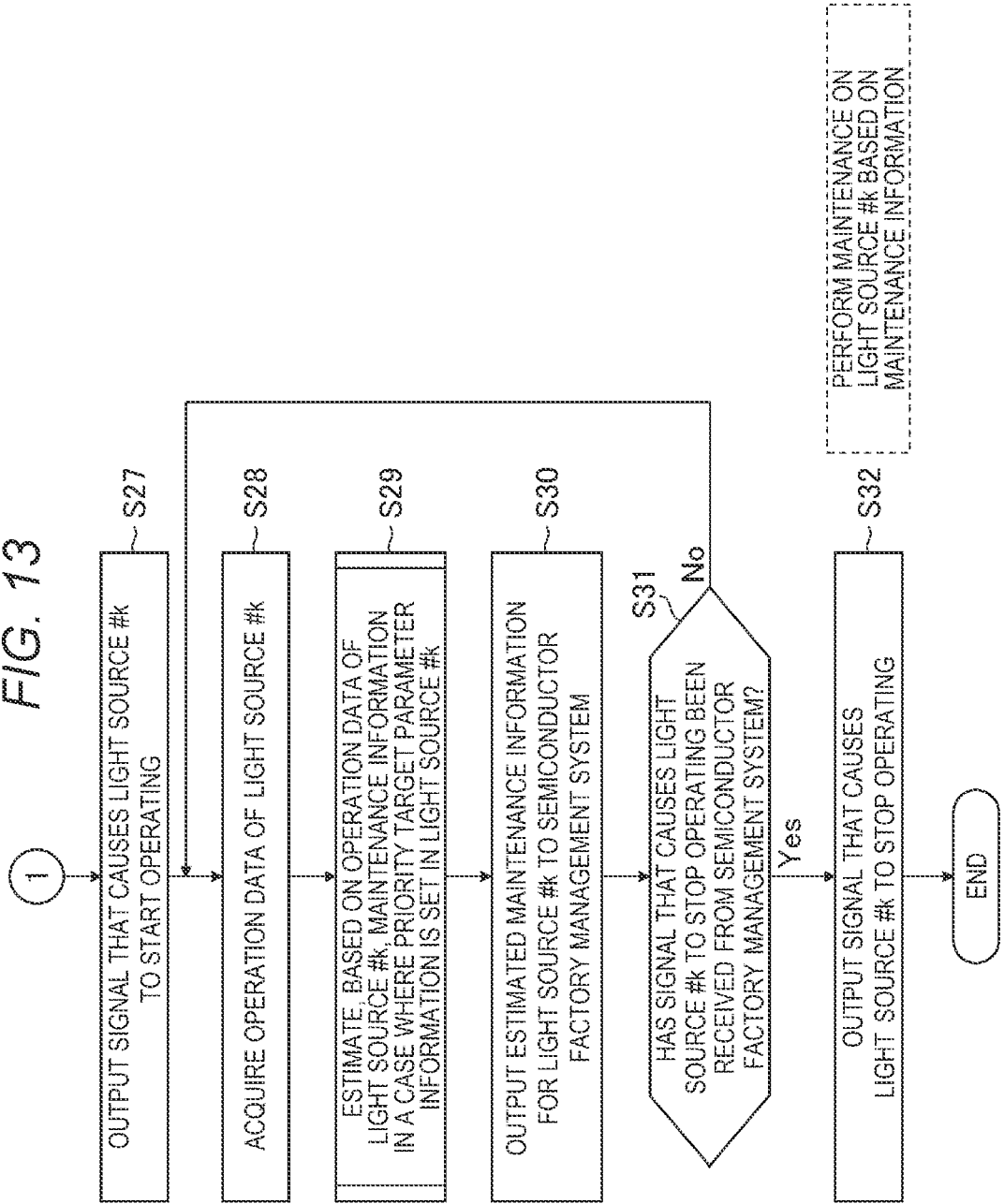
FIG. 13 is a flowchart showing an example of the contents of the processes carried out by the light source parameter management server.

6.2.2 Example of Processes Carried Out by Light Source Parameter Management Server FIGS. 12 and 13 are flowcharts showing an example of the contents of the processes carried out by the light source parameter management server 320. The processes in steps shown in FIGS. 12 and 13 are achieved by the program executed by the processor provided in the light source parameter management server 320.

When the flowchart of FIG. 12 starts, the light source parameter management server 320 acquires in step S20 the priority target parameter information for the light source #k. The priority target parameter information for the light source #k acquired by the light source parameter management server 320 is not limited to a target parameter of a single item. For example, the light source parameter management server 320 may acquire target parameter information in descending order of priority.

Figure 14:
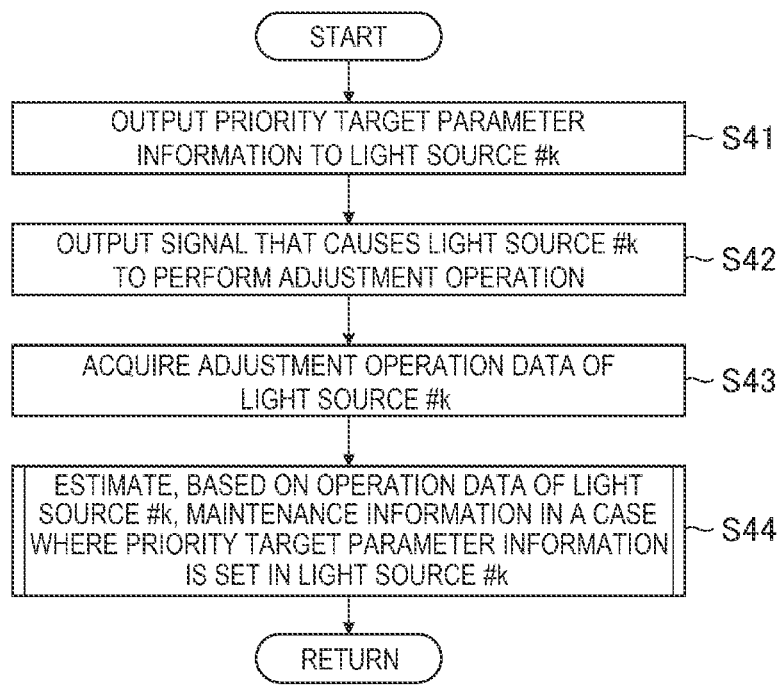
FIG. 14 is a flowchart showing an example of a subroutine applied to step S22 in FIG. 12.

In step S22, the light source parameter management server 320 estimates the maintenance information for the light source #k in the case where the priority target parameter information is set in the light source #k. The subroutine of step S22 will be described later (FIG. 14).

In step S23, the light source parameter management server 320 outputs the estimated maintenance information for the light source #k to the semiconductor factory management system 208.

In step S24, the light source parameter management server 320 evaluates which signal, the operation OK signal or the operation NOK signal, has been received from the semiconductor factory management system 208. When the light source parameter management server 320 receives the operation NOK signal from the semiconductor factory management system 208, the light source parameter management server 320 proceeds to step S25.

In step S25, the light source parameter management server 320 outputs a signal that causes the light source #k to stop operating. In the semiconductor factory, maintenance is performed on the light source #k based on the maintenance information output in step S23. After step S25, the light source parameter management server 320 terminates the flowchart of FIG. 12.

On the other hand, when the light source parameter management server 320 receives the operation OK signal from the semiconductor factory management system 208 in the evaluation in step S24, the light source parameter management server 320 proceeds to step S26.

In step S26, the light source parameter management server 320 outputs the priority target parameter information to the light source #k. After step S26, the light source parameter management server 320 proceeds to step S27 in FIG. 13.

In step S27, the light source parameter management server 320 outputs a signal that causes the light source #k to start operating.

In step S28, the light source parameter management server 320 acquires the operation data of the light source #k.

Figure 15:
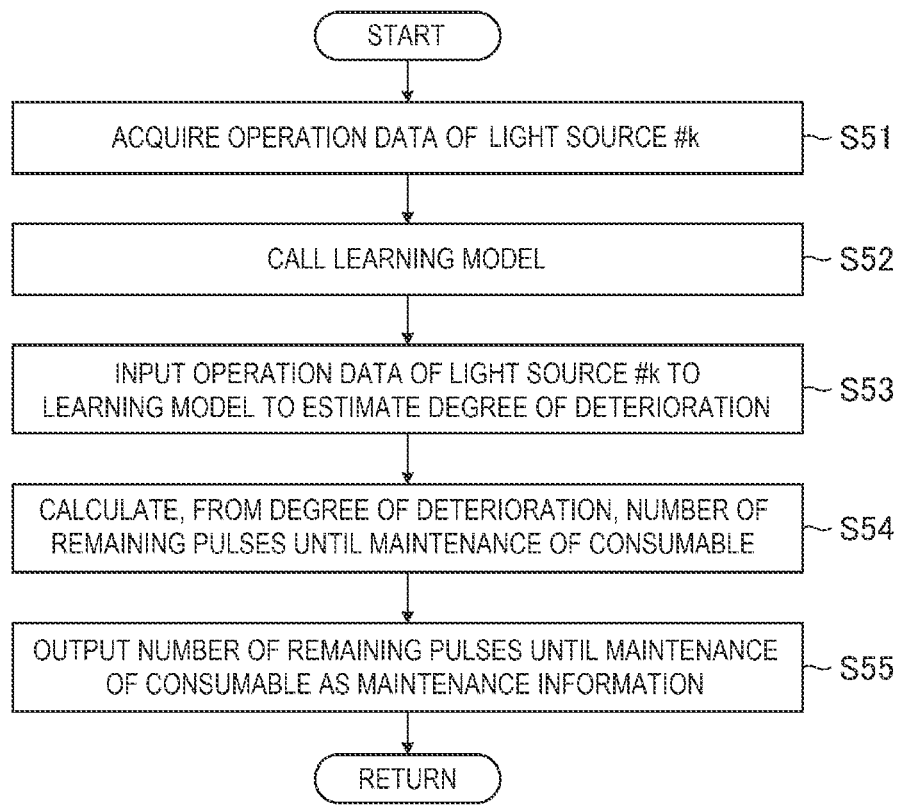
FIG. 15 is a flowchart showing an example of a subroutine applied to step S29 in FIG. 13 and step S44 in FIG. 14.

In step S29, the light source parameter management server 320 estimates, from the operation data of the light source #k, the maintenance information in the case where the priority target parameter information is set in the light source #k. The subroutine of step S29 will be described later (FIG. 15).

In step S30, the light source parameter management server 320 outputs the estimated maintenance information for the light source #k to the semiconductor factory management system 208.

In step S31, the light source parameter management server 320 evaluates whether the signal that causes the light source #k to stop operating has been received from the semiconductor factory management system 208. When the result of the evaluation in step S31 is No, the light source parameter management server 320 returns to step S28.

When the result of the evaluation in step S31 is Yes, the light source parameter management server 320 proceeds to step S32. In step S32, the light source parameter management server 320 outputs the signal that causes the light source #k to stop operating. In the semiconductor factory, maintenance is performed on the light source #k based on the maintenance information. After step S32, the light source parameter management server 320 terminates the flowchart of FIG. 13.

FIG. 14 is a flowchart showing an example of the subroutine applied to step S22 in FIG. 12. When the flowchart of FIG. 14 starts, the light source parameter management server 320 outputs in step S41 the priority target parameter information to the light source #k.

In step S42, the light source parameter management server 320 outputs a signal that causes the light source #k to perform adjustment operation. The light source #k starts the adjustment operation upon receipt of the adjustment operation signal, and outputs a variety of data (adjustment operation data) produced by performing the adjustment operation to the light source parameter management server 320.

In step S43, the light source parameter management server 320 acquires the adjustment operation data of the light source #k.

In step S44, the light source parameter management server 320 carries out the process of estimating, from the operation data of the light source #k, the maintenance information in the case where the priority target parameter information is set in the light source #k. The "operation data of the light source #k" in this case is the "the adjustment operation data of the light source #k" acquired in step S43. The subroutine process applied to step S44 may be the same subroutine process applied to step S29 in FIG. 13.

After step S44, the light source parameter management server 320 returns to the flowchart of FIG. 12.

FIG. 15 is a flowchart showing an example of the subroutine applied to step S29 in FIG. 13 and step S44 in FIG. 14.

When the flowchart of FIG. 15 starts, the light source parameter management server 320 acquires in step S51 the operation data of the light source #k.

In step S52, the light source parameter management server 320 calls a learning model used in the process of estimating the degree of deterioration of any of the consumables. The learning model may be a learned machine learning model (inference model) constituted by a neural network created by machine learning using supervised learning data, the machine learning so performed that light source operation data is input and the degree of deterioration of the consumable is output. The technology disclosed in Patent Literature 1 may be adopted for the method for creating a learning model that estimates the degree of deterioration of any of the consumables from the light source operation data and the method for calculating the number of pulses until the maintenance from the degree of deterioration output as a result of the inference of the learning model.

Patent Literature 1 describes the method below. That is, the method is a machine learning method for creating a learning model for estimating the life of a consumable of a laser apparatus, the method including acquiring first life-relating information containing data on a parameter relating to the life of the consumable, the data recorded in correspondence with different numbers of oscillation pulses during the period from start of use of the consumable to replacement thereof, dividing the first life-relating information into a plurality of levels each representing the degree of degradation of the consumable in accordance with the numbers of oscillation pulses, creating training data in which the first life-relating information is associated with the levels representing the degrees of deterioration, creating the learning model for estimating the degree of degradation of the consumable from data on the life-relating parameter by performing machine learning using the training data, and saving the created learning model.

Patent Literature 1 further describes an apparatus that manages consumables of a laser apparatus, the apparatus including a learning model saving section that saves the learning model created by carrying out the machine learning method described above, an information acquisition section that receives a signal carrying a request for estimation of the life of any of the consumables to be replaced in the laser apparatus and acquires current second life-relating information relating to the life of the consumable to be replaced, a life estimation section that calculates the life and a remaining life of the consumable to be replaced based on the learning model for the consumable to be replaced and the second life-relating information relating to the life of the consumable to be replaced, and an information output section that notifies an external apparatus of information on the calculated life and remaining life of the consumable to be replaced.

The light source parameter management server 320 may have the same functions as those of the consumable management apparatus described in Patent Literature 1.

In step S53, the light source parameter management server 320 inputs the operation data of the light source #k to the learning model to estimate the degree of deterioration.

In step S54, the light source parameter management server 320 calculates from the estimated degree of degradation the number of remaining pulses until the maintenance of the consumable.

In step S55, the light source parameter management server 320 outputs the number of remaining pulses until the maintenance as the maintenance information. After step S55, the light source parameter management server 320 returns to the flowcharts shown in FIGS. 12 and 13.

When the maintenance life of the consumable varies in accordance with the priority target parameter information, which will be described later, the learning model used in the flowchart of FIG. 15 is created based on supervised learning data for each of the modes. The light source parameter management server 320 may then call the learning model in correspondence with the priority target parameter.

The light source parameter management server 320 is an example of the "light source parameter information management apparatus" in the present disclosure. The method including the steps executed by the light source parameter management server 320 is an example of the "light source parameter information management method" in the present disclosure.

6.3 Effects

According to the first embodiment, the data analysis server 310 can be used to derive optimal priority target parameter information for the exposure process carried out by the lithography system #k, set the priority target parameter information in the light source #k, and output the maintenance information estimated when the light source #k is operated to the semiconductor factory management system 208 to efficiently manage the operation or shutdown of the lithography system #k.

The first embodiment allows operation of the light source in such a way that specific target parameter information that is particularly important can be maintained for individual users or in individual semiconductor processes.

As a result, the yield in the semiconductor manufacturing can be improved, and costs and other factors can be improved. Optimal exposure for the semiconductor processes is also achieved.

6.4 Others

In the example according to the first embodiment, the data analysis server 310 and the light source parameter management server 320 are separately described in terms of function, but it is not necessarily required to configure the two servers to perform the different functions, and the same server may perform the two functions. The functions of the two servers may instead be performed by the light source management system 206 or the exposure apparatus management system 204. The functions of the data analysis server 310 may be performed by the exposure apparatus management system 204, the light source parameter management server 320, or the light source management system 206.

The result of the output from the data analysis server 310 and the light source parameter management server 320 may be output to a display apparatus or any other apparatus that is not shown, so that the operator can understand the result.

The priority target parameter information may be output to the exposure apparatus #k via the exposure apparatus management system 204. The priority target parameter information may then be transmitted from the exposure apparatus #k to the light source #k to control the light source #k.

7. Second Embodiment

7.1 Configuration

Figure 16:
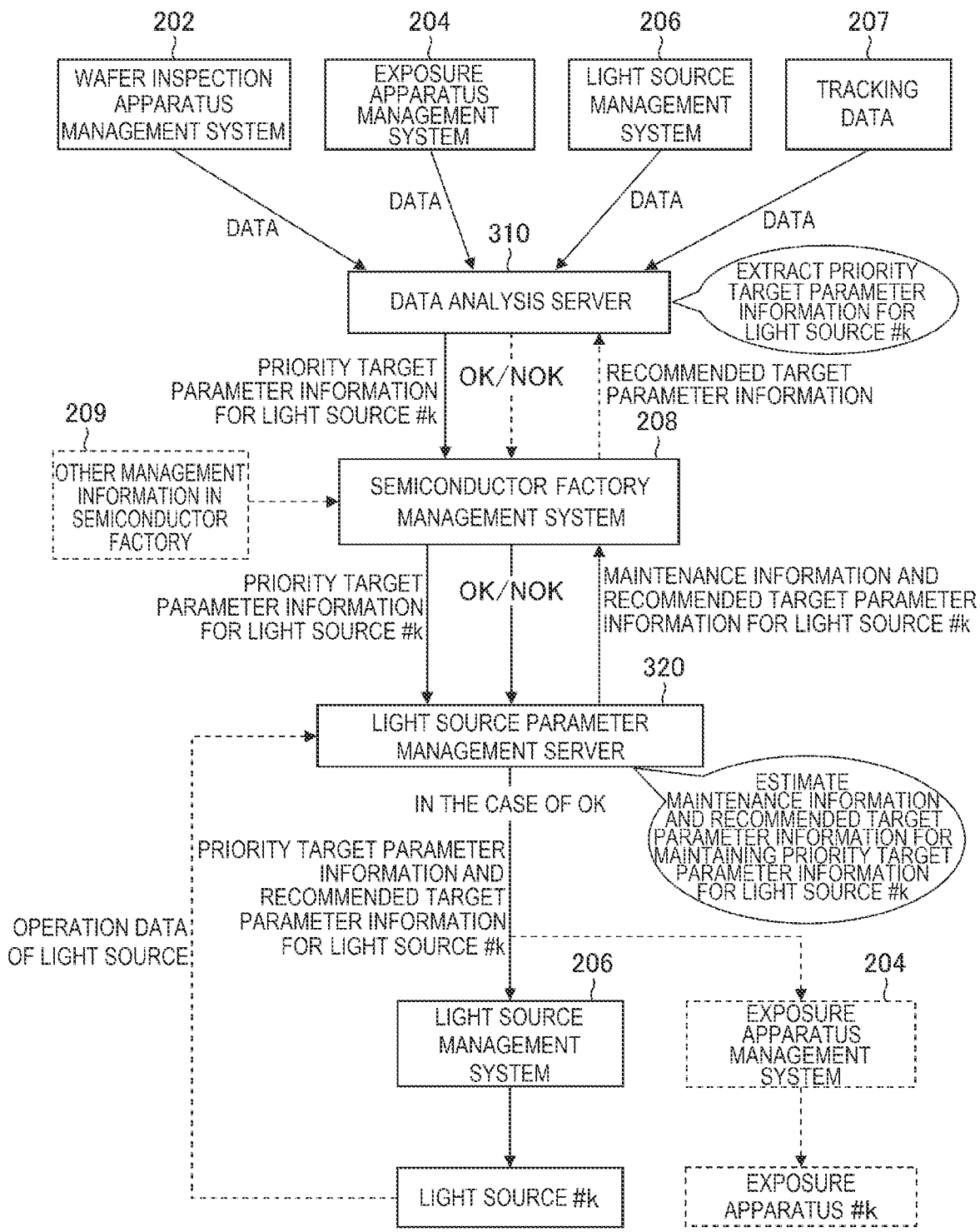
FIG. 16 is a block diagram showing the overall procedure of processes carried out by the semiconductor manufacturing system according to a second embodiment.

FIG. 16 is a block diagram showing the overall procedure of processes carried out by the semiconductor manufacturing system according to a second embodiment. The configuration of the system according to the second embodiment may be the same as the configuration in the first embodiment (FIG. 8). A mechanism that estimates the recommended target parameter information on a parameter different from the priority target parameter and provides an external apparatus, such as the semiconductor factory management system 208, with the estimated information is added to the second embodiment in addition to the configuration and the functions thereof described in the first embodiment.

7.2 Operation

Differences between FIGS. 16 and 9 will be described. In addition to the procedure in FIG. 9, FIG. 16 shows a case where the recommended target parameter information required to set the priority target parameter information is output.

In FIG. 16, when the priority target parameter information for the light source #k is set, the light source parameter management server 320 estimates the maintenance information, further estimates the recommended target parameter information, and outputs the estimated information to an external apparatus. The recommended target parameter information includes, for example, at least one of target spectral characteristic parameter information, target output characteristic parameter information, and target consumption parameter information.

The recommended target parameter information for the light source #k is output to the data analysis server 310 via the semiconductor factory management system 208.

The data analysis server 310 analyzes the correlation between the recommended target parameter and the exposure performance parameter, evaluates whether the operation is OK or NOK when the recommended target parameter information is set in the light source #k, and outputs the result of the evaluation to the semiconductor factory management system 208.

The semiconductor factory management system 208 evaluates whether the operation of the light source #k is OK or NOK based on the maintenance information, the recommended target parameter information, and other management information 209 in the semiconductor factory.

When the result of the evaluation is OK, the priority target parameter information and the recommended target parameter information are set in the light source #k via the light source management system 206, and the light source #k is controlled to satisfy the target parameter information.

7.2.1 Example of Processes Carried Out by Data Analysis Server

Figure 17:
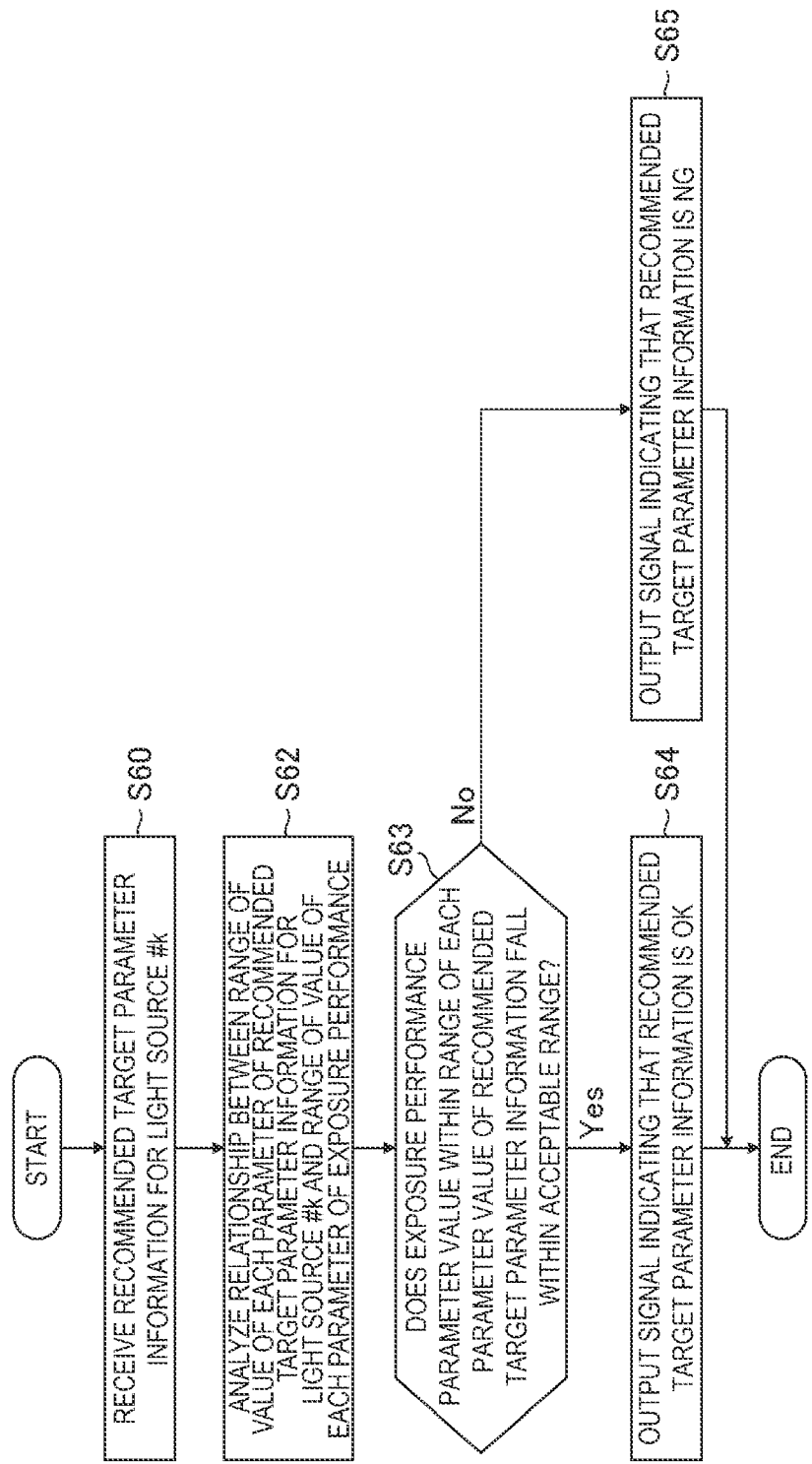
FIG. 17 is a flowchart showing an example of the procedure of checking recommended target parameter information in the data analysis server in the second embodiment.

FIG. 17 is a flowchart showing the procedure of checking the recommended target parameter information in the data analysis server 310 in the second embodiment. To evaluate whether the received recommended target parameter information is to be employed, the semiconductor factory management system 208 sends the recommended target parameter information to the data analysis server 310, causes the data analysis server 310 to check whether the recommended target parameter information is appropriate, and receives the result of the checking.

When the flowchart of FIG. 17 starts, the data analysis server 310 receives in step S60 the recommended target parameter information for the light source #k.

In step S62, the data analysis server 310 analyzes the relationship between the range of the value of each parameter of the recommended target parameter information for the light source #k and the range of the value of each parameter of the exposure performance.

Figure 18:
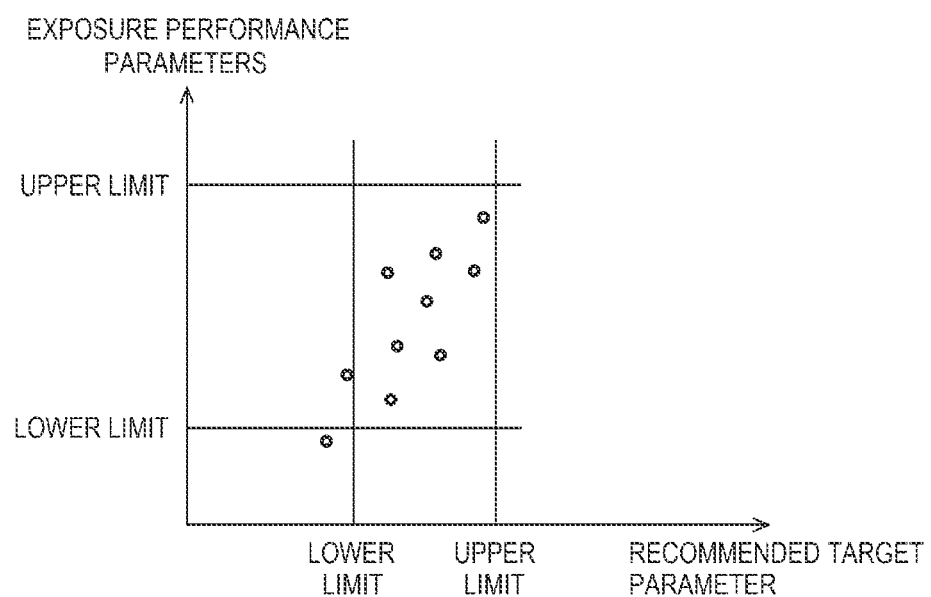
FIG. 18 is a graph showing an example of analysis of the relationship between a recommended target parameter and an exposure performance parameter.

Then, in step S63, the data analysis server 310 evaluates whether the exposure performance parameter value within a range of each parameter value of the recommended target parameter information falls within an acceptable range (see FIG. 18).

When the result of the evaluation in step S63 is Yes, the data analysis server 310 proceeds to step S64. In step S64, the data analysis server 310 outputs an OK signal indicating that the recommended target parameter information is appropriate (OK).

On the other hand, when the result of the evaluation in step S63 is No, the data analysis server 310 proceeds to step S65. In step S65, the data analysis server 310 outputs an NG signal indicating that the recommended target parameter information is inappropriate (NG).

After step S64 or S65, the data analysis server 310 terminates the flowchart of FIG. 17.

FIG. 18 is a graph showing an example of the analysis of the relationship between the recommended target parameter and the exposure performance parameter. The horizontal axis of FIG. 18 represents the recommended target parameter, and the vertical axis of FIG. 18 represents the exposure performance parameter. The data analysis provides the relationship between the exposure performance parameter value and the recommended target parameter value, as shown, for example, in FIG. 18. When the lower and upper limits indicating the acceptable range of the exposure performance parameter value are identified, it can be evaluated whether the exposure performance parameter value corresponding to the recommended target parameter value within the range thereof fall within the acceptable range.

Figure 19:
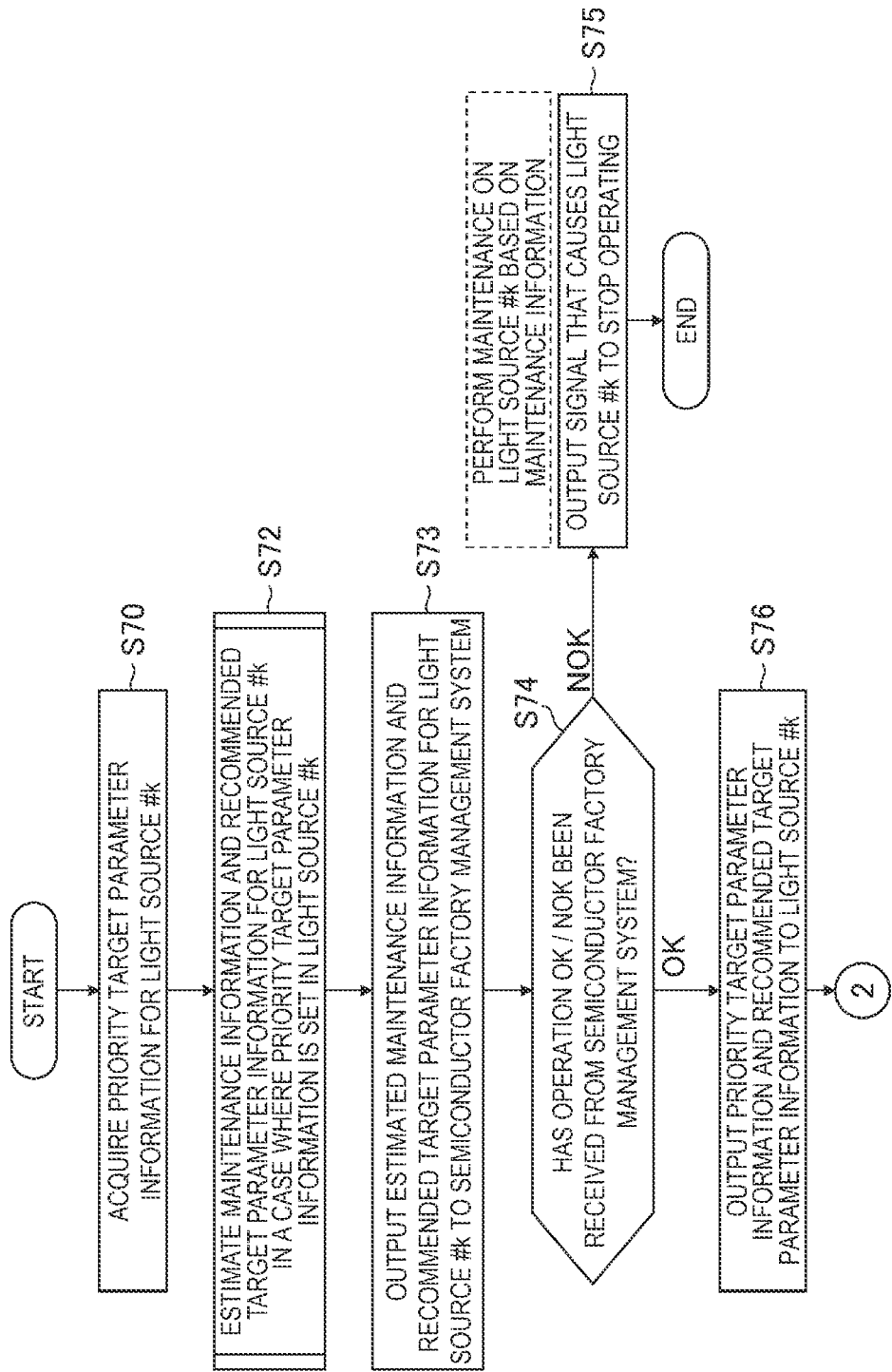
FIG. 19 is a flowchart showing an example of the contents of processes carried out by the light source parameter management server in the second embodiment.
Figure 20:
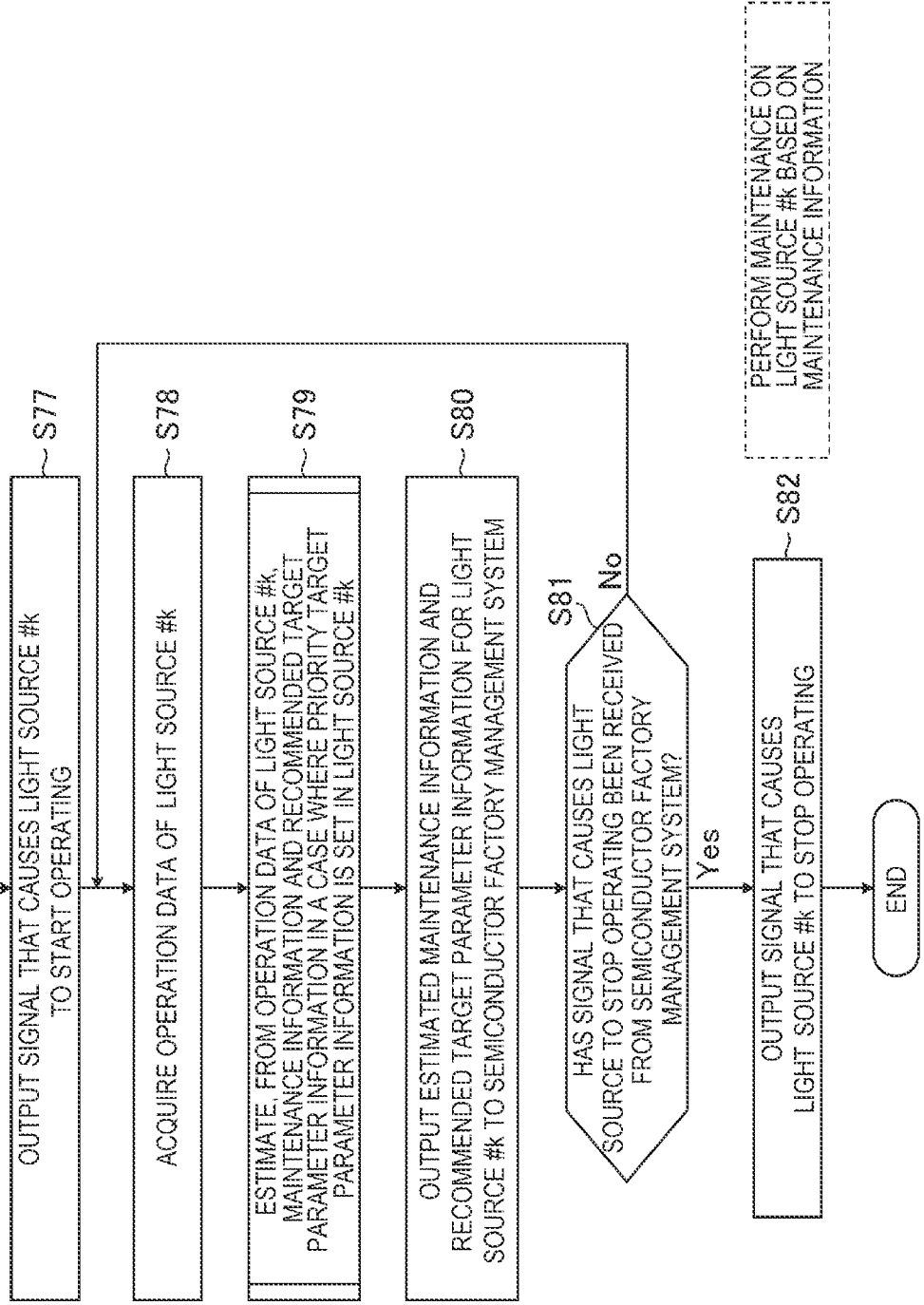
FIG. 20 is a flowchart showing an example of the contents of the processes carried out by the light source parameter management server in the second embodiment.

7.2.2 Example of Processes Carried Out by Light Source Parameter Management Server FIGS. 19 and 20 are flowcharts showing an example of the contents of the processes carried out by the light source parameter management server 320 in the second embodiment. In the flowcharts in FIGS. 19 and 20, steps S22, S23, S26, S29, and S30 in the flowcharts of FIGS. 12 and 13 are replaced with steps S72, S73, S76, S79, and S80, respectively. Steps S70, S74, S75, S77, S78, S81, and S82 in the flowchart of FIGS. 19 and 20 are the same as steps S20, S24, S25, S27, S28, S31, and S32 in the flowcharts of FIGS. 12 and 13, respectively, and no duplicate description thereof will therefore be made.

Figure 21:
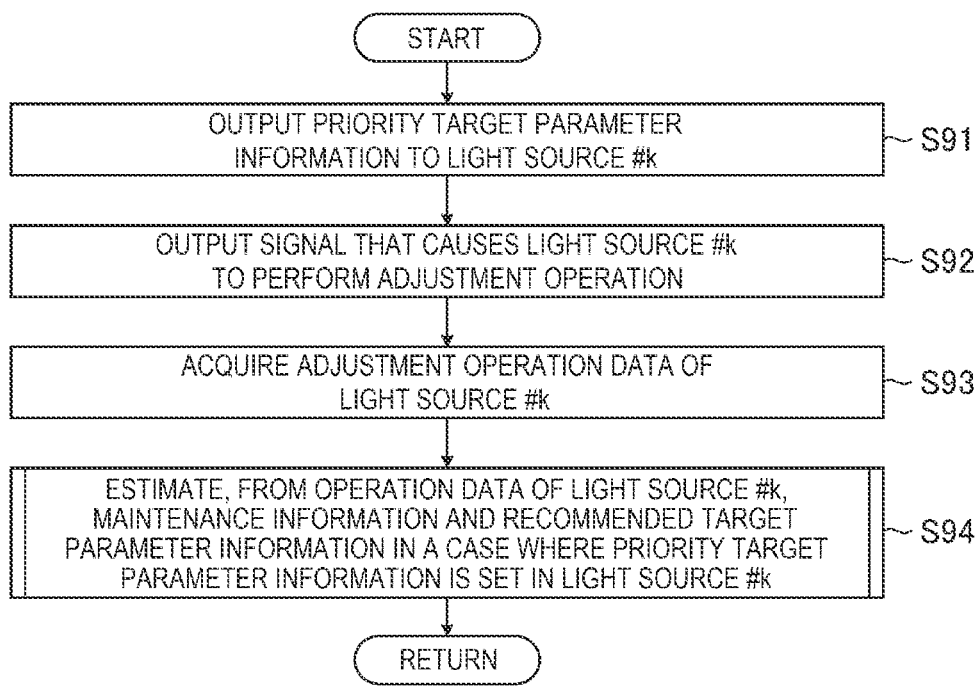
FIG. 21 is a flowchart showing an example of a subroutine applied to step S72 in FIG. 19.

In step S72, the light source parameter management server 320 estimates the maintenance information and the recommended target parameter information for the light source #k in the case where the priority target parameter information is set in the light source #k. The subroutine of step S72 will be described later (FIG. 21).

In step S73, the light source parameter management server 320 outputs the estimated maintenance information and the recommended target parameter information for the light source #k to the semiconductor factory management system 208.

When the light source parameter management server 320 receives the OK signal, which permits the operation of the light source #k, from the semiconductor factory management system 208 in the evaluation in step S74, the light source parameter management server 320 proceeds to step S76.

In step S76, the light source parameter management server 320 outputs the priority target parameter information and the recommended target parameter information to the light source #k. After step S76, the light source parameter management server 320 proceeds to step S77 in FIG. 20.

Figure 22:
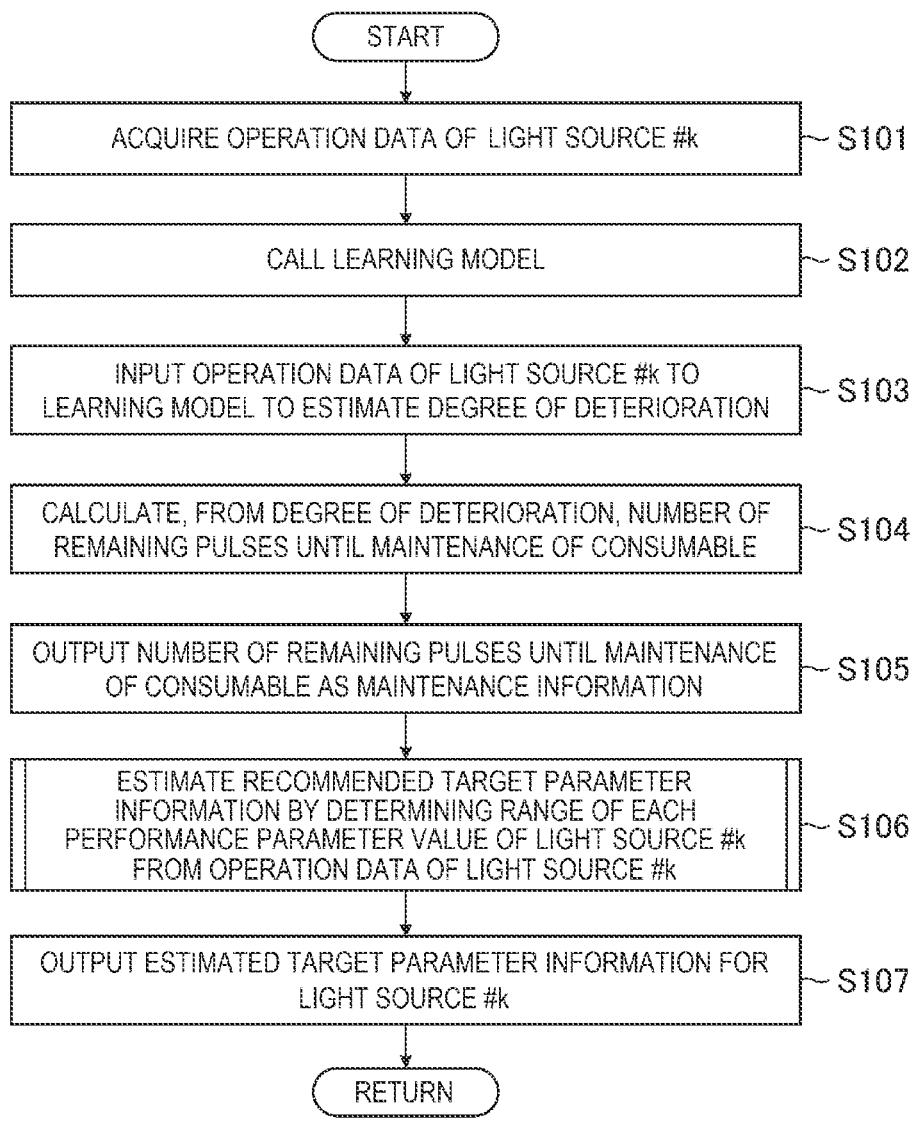
FIG. 22 is a flowchart showing an example of a subroutine applied to step S79 in FIG. 20 and step S94 in FIG. 21.

After the operation data of the light source #k is acquired in step S78, the light source parameter management server 320 estimates in step S79, from the operation data of the light source #k, the maintenance information and the recommended target parameter information in the case where the priority target parameter information is set in the light source #k. The subroutine of step S79 will be described later (FIG. 22).

In step S80, the light source parameter management server 320 outputs the estimated maintenance information and recommended target parameter information for the light source #k to the semiconductor factory management system 208. Subsequent steps S81 and S82 are the same as steps S31 and S32.

FIG. 21 is a flowchart showing an example of a subroutine applied to step S72 in FIG. 19. Steps S91, S92, and S93 in the flowchart of FIG. 21 are the same as steps S41, S42, and S43 in the flowchart of FIG. 14, respectively, and no duplicate description thereof will therefore be made. The flowchart of FIG. 21 differs from the flowchart of FIG. 14 in that step S44 in FIG. 14 is changed to step S94 in FIG. 21.

In step S94, the light source parameter management server 320 carries out the process of estimating, from the operation data of the light source #k, the maintenance information and the recommended target parameter information in the case where the priority target parameter information is set in the light source #k. The "operation data of the light source #k" in this case is the "the adjustment operation data of the light source #k" acquired in step S93. The subroutine process applied to step S94 may be the same subroutine process applied to step S79 in FIG. 20.

FIG. 22 is a flowchart showing an example of a subroutine applied to step S79 in FIG. 20 and step S94 in FIG. 21. Steps S101, S102, S103, S104, and S105 in the flowchart of FIG. 22 are the same as steps S51, S52, S53, S54, and S55 in the flowchart of FIG. 15, respectively, and no duplicate description thereof will therefore be made. The flowchart of FIG. 22 differs from the flowchart of FIG. 15 in that steps S106 and S107 are added after step S55.

In step S106, the light source parameter management server 320 estimates the recommended target parameter information by determining the range of each performance parameter value of the light source from the operation data of the light source #k. The subroutine of step S106 will be described later (FIG. 23).

In step S107, the light source parameter management server 320 outputs the estimated recommended target parameter information for the light source #k. After step S107, the light source parameter management server 320 returns to the flowcharts shown in FIGS. 19 and 20.

Figure 23:
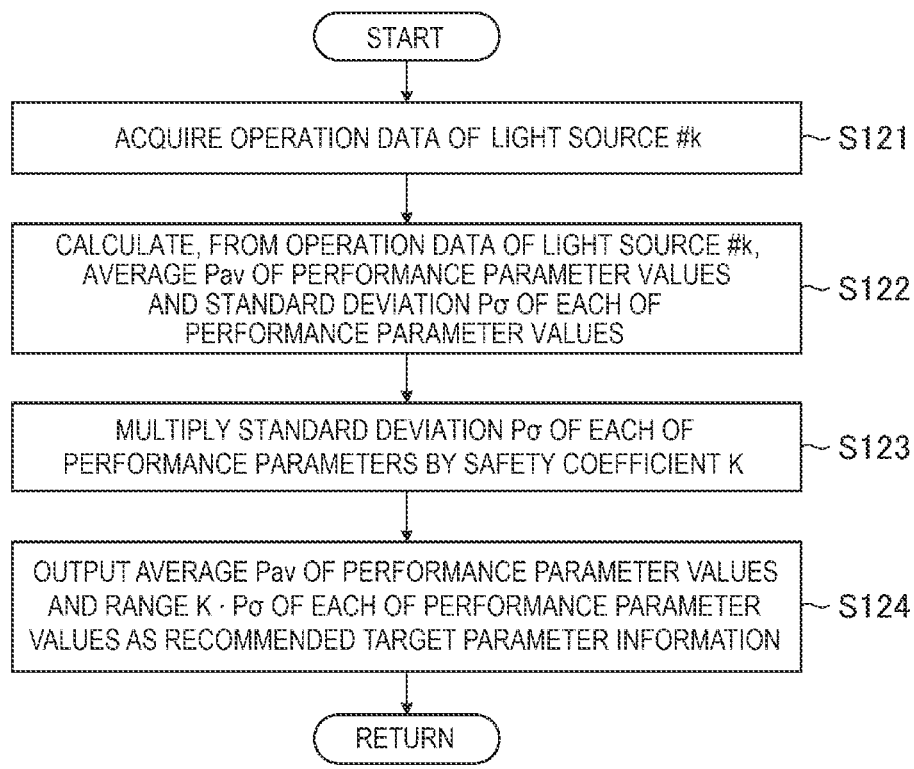
FIG. 23 is a flowchart showing an example of a subroutine applied to step S106 in FIG. 22.

FIG. 23 is a flowchart showing an example of a subroutine applied to step S106 in FIG. 22. In step S121 in FIG. 23, the light source parameter management server 320 acquires the operation data of the light source #k.

In step S122, the light source parameter management server 320 calculates, from the operation data of the light source #k, an average Pav of performance parameter values and a standard deviation Pσ of each of the performance parameter values. The performance parameter values are the values of parameters representing the performance of the pulse laser light. For example, the performance parameter values include the pulse energy E, stability Eσ thereof, the spectral linewidth Δλ, and stability Δλσ thereof.

In step S123, the light source parameter management server 320 multiplies the standard deviation value Pσ of the performance parameters by a safety factor K. The safety factor K may be a value ranging, for example, from 3 to 5. When the safety factor K is 3, the standard deviation is the average±3σ.

In step S124, the light source parameter management server 320 outputs the average Pav of the performance parameter values and a range K·Pσ of each of the performance parameter values as the recommended target parameter information.

After step S124, the light source parameter management server 320 terminates the flowchart of FIG. 23 and returns to the flowchart of FIG. 22.

In FIG. 23, "±K·Pσ" is presented as an example of the expression of the range of each of the performance parameter values, but not necessarily, and the range may instead be expressed, for example, by ±K·(Pσ/Pav)·100(%).

7.3 Effects

According to the second embodiment, based on the priority target parameter information, not only the maintenance information but the recommended target parameter information is estimated, and the estimated information is output to the semiconductor factory management system 208. The semiconductor factory management system 208 can thus evaluate whether the operation of the light source #k is OK or NOK in comprehensive consideration of the information described above.

According to the second embodiment, in which recommended target parameter information required to be relaxed in terms of specifications can be presented to check whether the operation is OK or NOK before the exposure, a decrease in the yield in the exposure process can be suppressed.

According to the second embodiment, the light source #k can be operated with the recommended target parameter information relaxed in terms of specifications, whereby a decrease in the number of remaining pulses and an increase in gas consumption until the maintenance can be suppressed as compared with a case where the light source is operated without specification relaxation.

7.4 Others

In the example according to the second embodiment, the semiconductor factory management system 208 evaluates OK/NOK based on the other management information 209 in the semiconductor factory, but not necessarily. The semiconductor factory management system 208 may instead perform comprehensive OK/NOK evaluation by outputting the recommended target parameter information to the exposure apparatus management system 204, causing the exposure apparatus management system 204 to evaluate whether the exposure apparatus #k can perform the exposure, and receiving the result of the evaluation.

8. Third Embodiment

8.1 Configuration

The system configuration and the overall procedure in a third embodiment may be the same as those in the second embodiment. The third embodiment differs from the second embodiment in that the light source parameter management server 320 changes (resets) the operation control target parameter value for the light source #k based on the priority target parameter information for the light source #k.

A default operation control parameter value is set in the light source #k, and when the priority target parameter information is specified, a parameter value associated thereto is reset.

8.2 Operation

Figure 24:
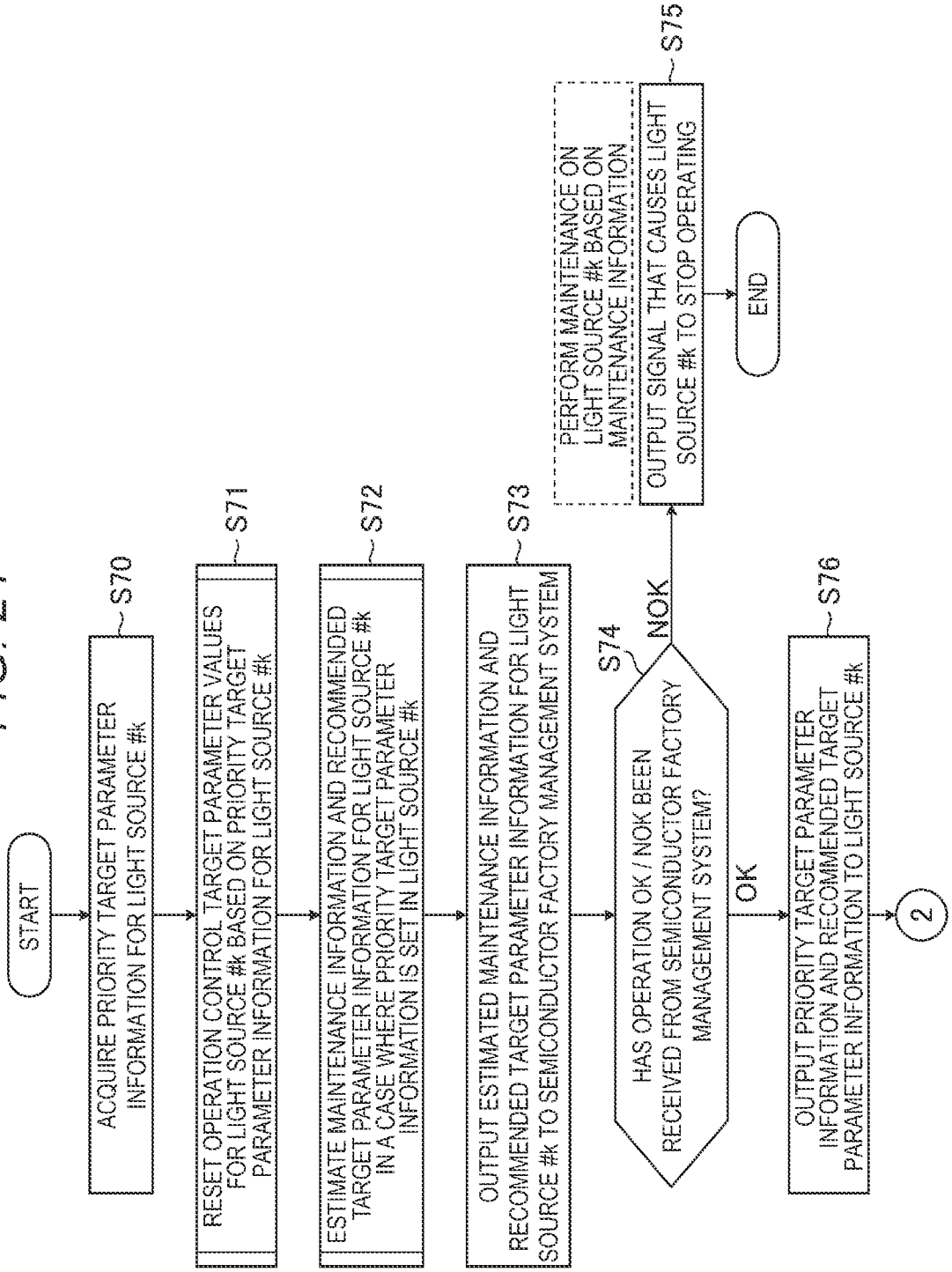
FIG. 24 is a flowchart showing an example of the contents of processes carried out by the light source parameter management server in a third embodiment.

FIG. 24 is a flowchart showing an example of the contents of processes carried out by the light source parameter management server 320 in the third embodiment. In FIG. 24, steps common to those in FIG. 19 have the same step numbers, and no duplicate description thereof will be made. The flowchart shown in FIG. 24 includes step S71 between steps S70 and S72 in FIG. 19.

In step S71, the light source parameter management server 320 resets the operation control target parameter value for the light source #k based on the priority target parameter information for the light source #k. The other steps may be the same as those in FIG. 19. Step S76 and the following steps may be the same as those in the flowchart of FIG. 20.

Figure 25:
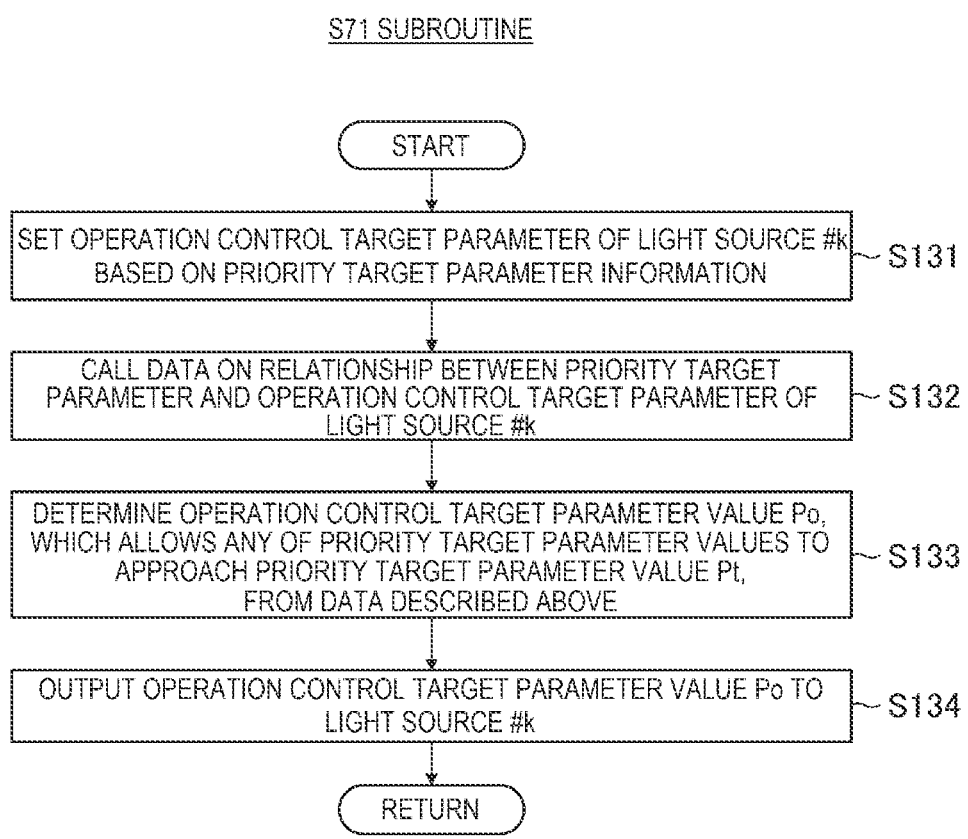
FIG. 25 is a flowchart showing an example of a subroutine applied to step S71 in FIG. 24.

FIG. 25 is a flowchart showing an example of a subroutine applied to step S71 in FIG. 24. When the flowchart of FIG. 25 starts, the light source parameter management server 320 selects in step S131 the operation control target parameter of the light source #k based on the priority target parameter information.

In step S132, the light source parameter management server 320 calls data on the relationship between the priority target parameter and the operation control target parameter for the light source #k. The light source parameter management server 320 stores data such as table data or an approximation curve showing the relationship between the priority target parameter and the operation control target parameter of the light source #k, and calls the relationship data.

Figure 26:
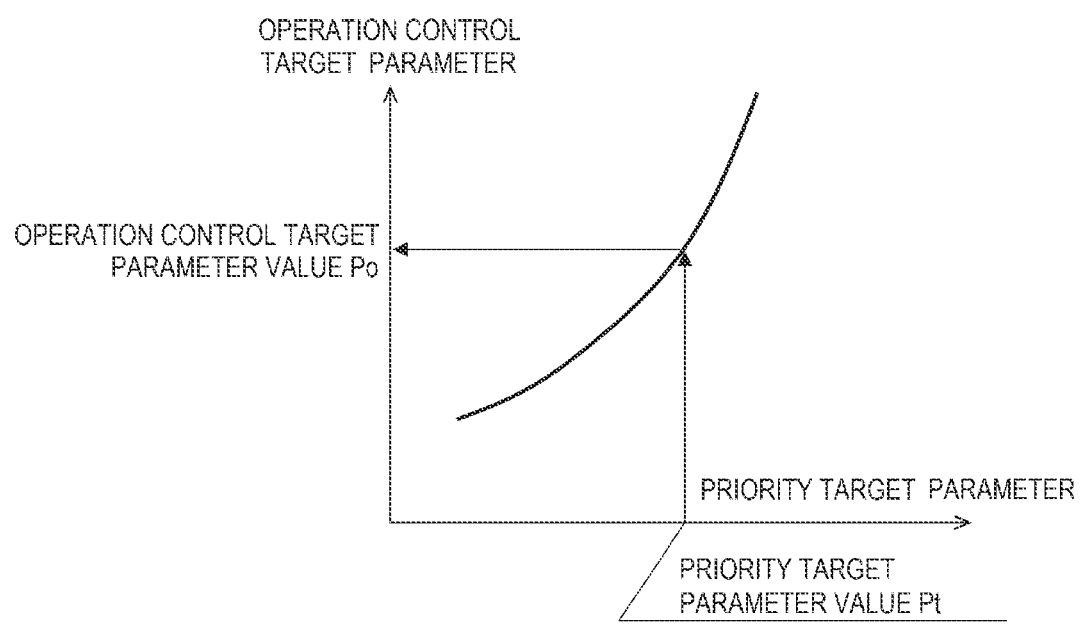
FIG. 26 is an example of a graph showing the relationship between a priority target parameter and an operation control parameter.

In step S133, the light source parameter management server 320 determines an operation control target parameter value Po, which allows the priority target parameter value to approach a priority target parameter value Pt, from the called data (see FIG. 26).

In step S134, the light source parameter management server 320 outputs the operation control target parameter value Po to the light source #k. After step S134, the light source parameter management server 320 returns to the flowchart of FIG. 24.

FIG. 26 is an example of a graph showing the relationship between the priority target parameter and the operation control parameter. The light source parameter management server 320 calls in step S132 in FIG. 25 the data showing the relationship shown in FIG. 26. Thereafter, in step S133, the operation control target parameter value Po corresponding to the priority target parameter value Pt is determined, as shown in FIG. 26.

8.3 Effects

According to the third embodiment, when the priority target parameter information for the light source #k is set, the other operational control target parameter values associated with the setting are reset. The operation that satisfies the priority target parameter information is thus achieved.

9. Fourth Embodiment

9.1 Configuration

A fourth embodiment is an example of a further specific form of the third embodiment. The system configuration and the overall procedure in the fourth embodiment may be the same as those in the first embodiment. The fourth embodiment shows by way of example a case where the light source is operated in each of the optical performance priority mode, the consumable life extension mode, and the consumption reduction mode.

9.2 Optical Performance Priority Mode Operation

The optical performance priority mode operation may have a plurality of different aspects of prioritized performance (important performance), for example, for prioritizing the spectral linewidth performance, prioritizing the pulse energy (output) performance, or prioritizing the energy stability performance. A specific example of the operation required to operate in the mode in which each of the different types of particular optical performance is prioritized will be presented below.

9.2.1 Example of Case where Spectral Linewidth $\Delta\lambda$ is Priority Target Parameter

9.2.1.1 Operation

The following description will be made with reference to a case where the lithography system #k performs exposure for a critical layer process. Since the critical layer process requires that the resolution of the exposure apparatus #k be maintained high, it is presumed that a target parameter representing a target spectral characteristic (spectral linewidth $\Delta\lambda$, for example) needs to be managed as a priority. In this case, the data analysis server 310 executes each step in the flowchart shown in FIG. 27.

Figure 27:
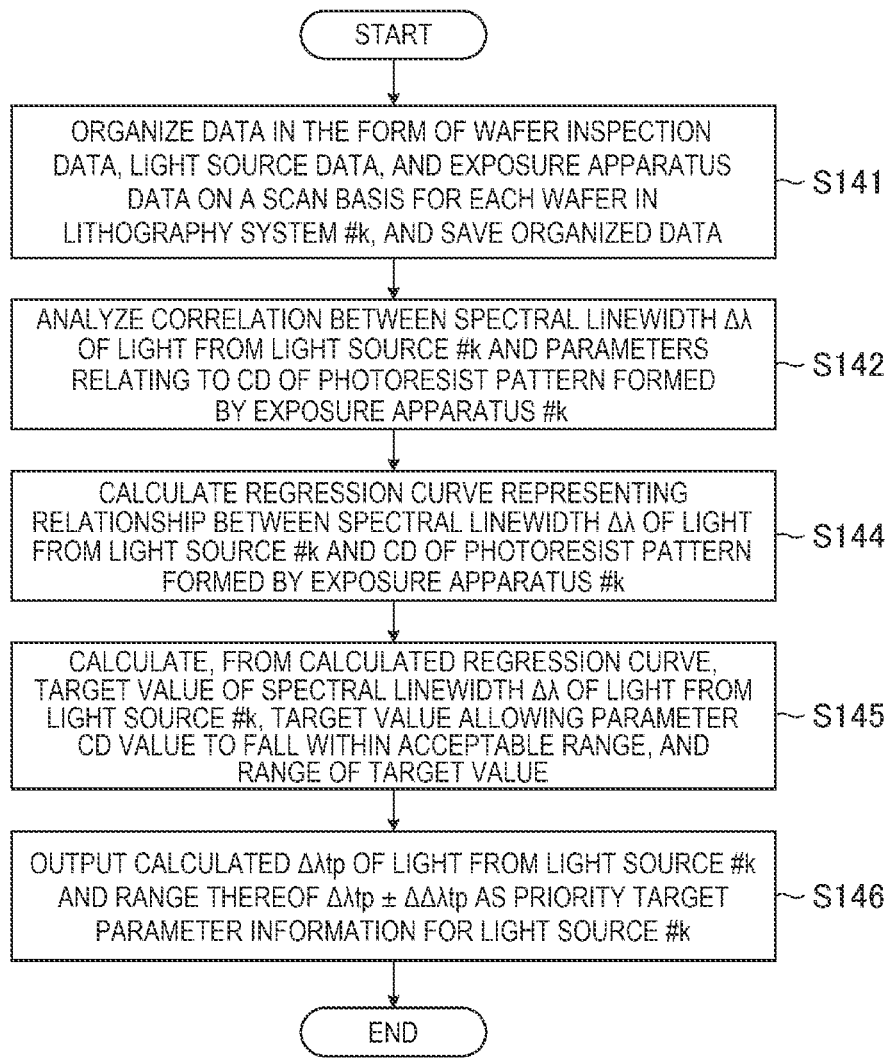
FIG. 27 is a flowchart showing an example of the contents of processes carried out by the data analysis server in a fourth embodiment.

FIG. 27 is a flowchart showing an example of the contents of processes carried out by the data analysis server 310 in the fourth embodiment. Step S141 is the same as step S11 in FIG. 10.

In step S142, the data analysis server 310 analyzes the correlation between the spectral linewidth $\Delta\lambda$ of the light from the light source #k and parameters relating to the CD of a photoresist pattern formed by the exposure apparatus #k.

In step S144, the data analysis server 310 calculates a regression curve representing the relationship between the spectral linewidth $\Delta\lambda$ of the light from the light source #k and the CD of the photoresist pattern formed by the exposure apparatus #k.

In step S145, the data analysis server 310 calculates, from the calculated regression curve, a target value of the spectral linewidth $\Delta\lambda t$ of the light from the light source #k, the target value allowing the parameter CD value to fall within an acceptable range, and the range of the target value.

In step S146, the data analysis server 310 outputs a calculated target spectral linewidth $\Delta\lambda tp$ of the light from the light source #k and the calculated range of the target spectral linewidth $\Delta\lambda tp$ ($\Delta\lambda tp\pm\Delta\Delta\lambda tp$) as the priority target parameter information for the light source #k. The target spectral linewidth $\Delta\lambda tp$ and the range thereof ($\Delta\lambda tp\pm\Delta\Delta\lambda tp$) are examples of the "spectral linewidth parameter information" in the present disclosure.

After step S146, the flowchart of FIG. 27 is terminated.

Figure 28:
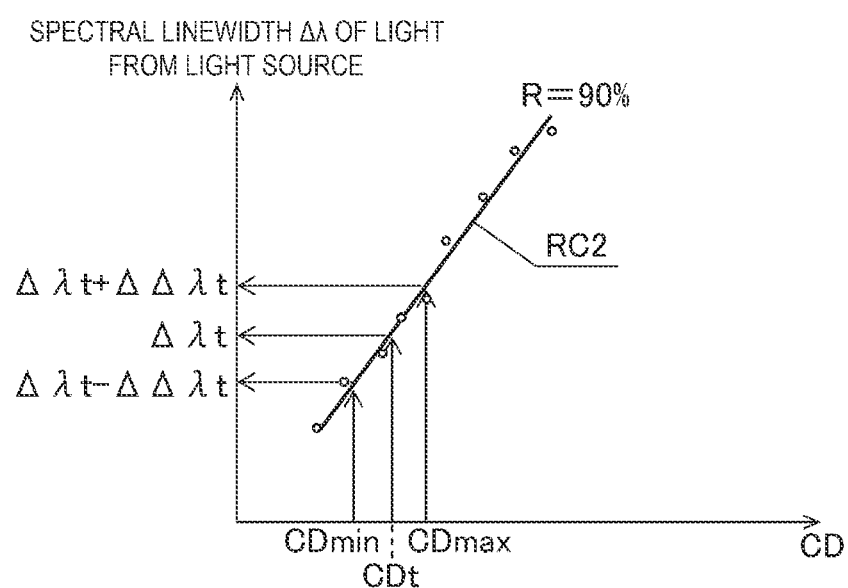
FIG. 28 is a graph showing an example of how a regression curve is used to determine a target spectral linewidth and the range thereof.

FIG. 28 is a graph showing an example of how a regression curve is used to determine the target spectral linewidth $\Delta\lambda t$ and the range thereof. The horizontal axis of FIG. 28 represents CD, and the vertical axis of FIG. 28 represents the spectral linewidth $\Delta\lambda$ of the light from the light source. A regression curve RC2 is a curve showing the correlation between CD and the spectral linewidth $\Delta\lambda$. Based on a target value CDt of CD, and lower and upper acceptable limits CDmin and CDmax, which indicate an acceptable range of the target value CDt, the target spectral linewidth $\Delta\lambda t$, which is a target value of the spectral linewidth $\Delta\lambda$ of the light from the light source, and lower and upper acceptable limits $\Delta\lambda t-\Delta\Delta\lambda t$ and $\Delta\lambda t+\Delta\Delta\lambda t$, which indicate an acceptable range of the target spectral linewidth $\Delta\lambda t$, can be determined from the regression curve RC. The collection of data containing the thus determined target spectral linewidth $\Delta\lambda t$ and range thereof ($\Delta\lambda t\pm\Delta\Delta\lambda t$) can be the target spectral linewidth $\Delta\lambda tp$ and the range thereof ($\Delta\lambda tp\pm\Delta\Delta\lambda tp$) as the priority target parameter information for the light source.

When the exposure process performed by the light source #k is performed on a critical layer, the exposure needs to be performed with light having a narrow spectral linewidth $\Delta\lambda$.

Figure 29:
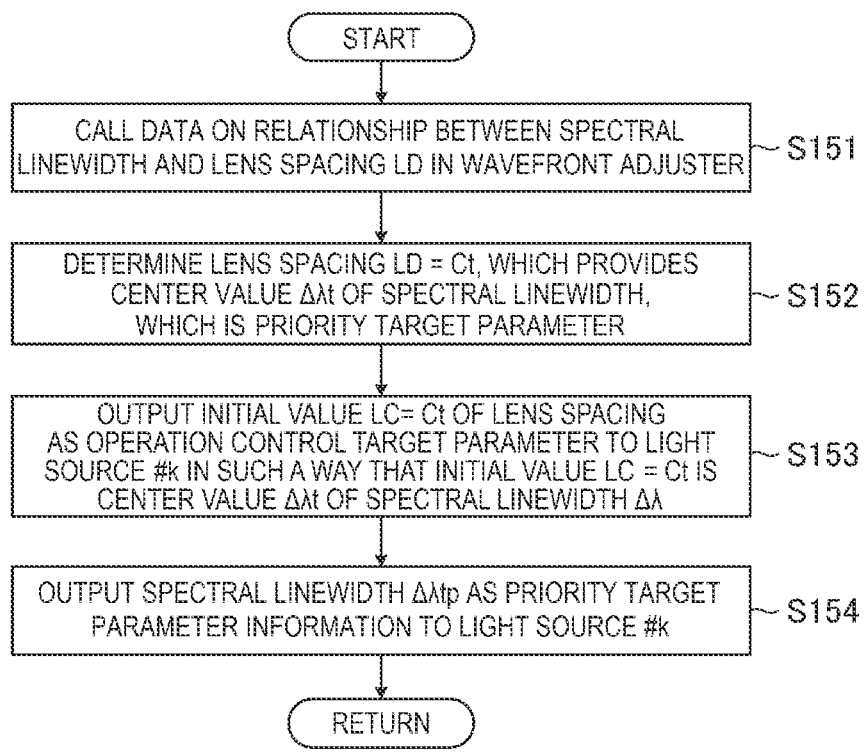
FIG. 29 is a flowchart showing an example of a subroutine applied to step S71 in FIG. 24 in a case where a spectral linewidth is the priority target parameter.

FIG. 29 is a flowchart showing an example of application of the flowchart of FIG. 25 to the case where the spectral linewidth $\Delta\lambda$ is the priority target parameter. When the spectral linewidth $\Delta\lambda$ is the priority target parameter, the flowchart of FIG. 29 is applied as the subroutine of step S71 in FIG. 24.

In step S151, the light source parameter management server 320 calls data on the relationship between the spectral linewidth $\Delta\lambda$ and a lens spacing LD in the wavefront adjuster 107. The lens spacing LD is the spacing between the concave lens 171 and the convex lens 172, which constitute the wavefront adjuster 107.

Figure 30:
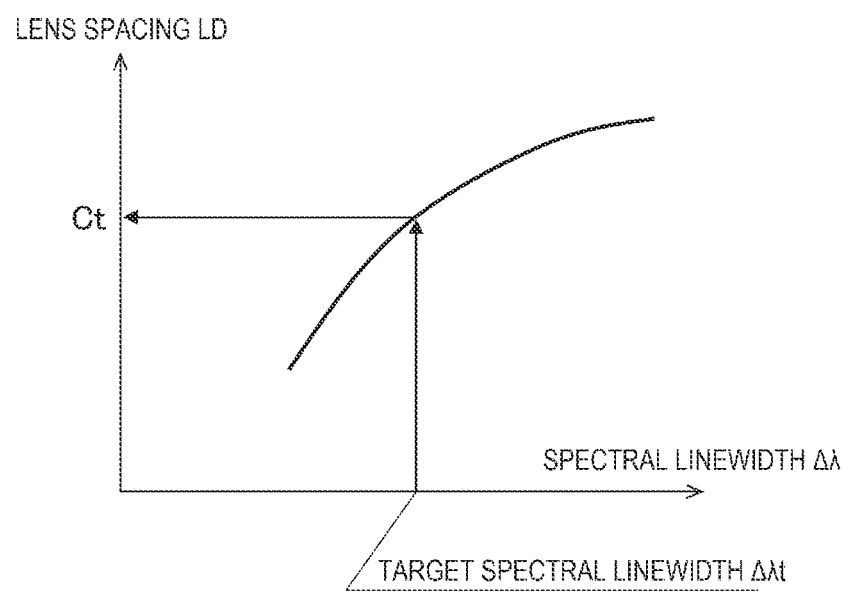
FIG. 30 is an example of a graph showing the relationship between the spectral linewidth and a lens spacing in a wavefront adjuster.

In step S152, the light source parameter management server 320 determines a lens spacing LD=Ct, which provides the center value (target value $\Delta\lambda t$) of the spectral linewidth $\Delta\lambda$, which is the priority target parameter (see FIG. 30).

In step S153, the light source parameter management server 320 outputs an initial value LC=Ct of the lens spacing LD to the light source #k as the operation control target parameter in such a way that the initial value LC=Ct is the center value $\Delta\lambda t$ of the spectral linewidth $\Delta\lambda$.

In step S154, the light source parameter management server 320 outputs the spectral linewidth $\Delta\lambda tp$ as the priority target parameter information to the light source #k. The light source parameter management server 320 may instead output the spectral linewidth $\Delta\lambda tp$ as the priority target parameter information to the exposure apparatus #k. After step S154, the light source parameter management server 320 returns to the flowchart of FIG. 24.

FIG. 30 is an example of a graph showing the relationship between the spectral linewidth $\Delta\lambda$ and the lens spacing LD in the wavefront adjuster 107. The horizontal axis of FIG. 30 represents the spectral linewidth $\Delta\lambda$, and the vertical axis of FIG. 30 represents the lens spacing LD. Using data showing the relationship between the parameters shown in FIG. 30 allows determination of the lens spacing Ct corresponding to the target spectral linewidth $\Delta\lambda t$.

9.2.1.2 Effects

In the example described above, setting the lens spacing in the wavefront adjuster 107 as the initial value Ct allows light source operation in which the prioritized target spectral linewidth $\Delta\lambda tp$ is set in a short period.

The example described above allows the light source to be operated at a narrow spectral linewidth suitable for the exposure process and having a limited range, whereby the yield of the critical layer resulting from the exposure process is improved.

9.2.1.3 Others

In this example, only the target spectral linewidth, which is the priority target parameter, is narrowed. In this case, the margin of the pulse energy decreases, so that the number of remaining pulses until the maintenance of the consumable decreases. In this regard, the recommended target parameter information may be estimated for other parameters the specifications of which can be relaxed, as described in the second embodiment.

The consumable maintenance information may be estimated based on the operation data provided by the adjustment oscillation performed with the priority target parameter information set in the light source #k.

In this example, the lens spacing between the concave and convex lenses of the wavefront adjuster 107 is changed as a way of changing the spectral linewidth $\Delta\lambda$, but not necessarily. For example, the first prism 131 and the second prism 132 of the LNM 102 may be rotated to adjust the magnification of the beam expansion with the aid of the two prisms.

The last step in FIG. 29 (step S154) is the step of outputting data to the light source #k, and may instead be the step of outputting data to the exposure apparatus #k. During the actual exposure, the exposure apparatus #k may output the data as the priority target parameter value to the light source #k.

9.2.2 Case where Pulse Energy is Priority Target Parameter

9.2.2.1 Example of Case where Generation of High Pulse Energy is Prioritized and Exposure can be Performed with Spectral Linewidth $\Delta\lambda$ Widened When the exposure process performed by the light source #k is performed on a rough layer or is the process of forming a photoresist pattern on a substrate having a step that requires a certain depth of focus, the exposure needs to be performed under the conditions below (conditions A and B).

Condition A: The exposure is performed with the spectral linewidth $\Delta\lambda$ widened to achieve a wide depth of focus.

Condition B: Furthermore, when the exposure is performed on a photoresist having low photoresist sensitivity or a thick photoresist, the pulse energy of the light from the light source #k is set high to maintain the throughput.

9.2.2.1.1 Operation

Figure 31:
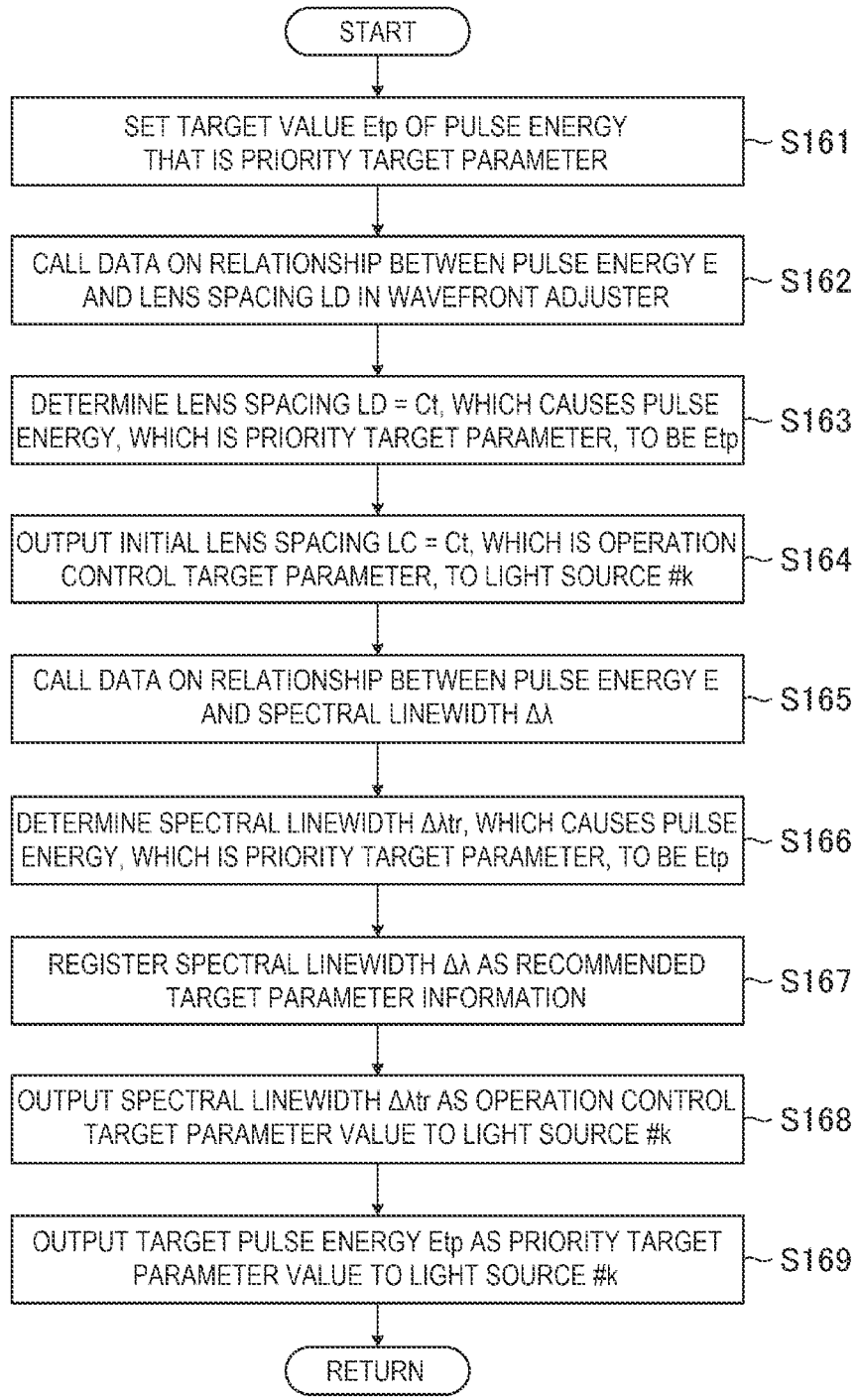
FIG. 31 is a flowchart showing an example of the contents of the processes carried out by the light source parameter management server when the priority target parameter value is set at a high pulse energy value, and the recommended target parameter value is set at a wide spectral linewidth value.

FIG. 31 shows an example of the procedure of the processes carried out by the light source parameter management server 320 when the light source #k is operated with the pulse energy set as the priority target parameter, a target value Etp thereof set at a high pulse energy value, the recommended target parameter further set as the spectral linewidth, and a target value $\Delta\lambda tr$ thereof set at a wide spectral linewidth value.

FIG. 31 is a flowchart showing a case where the flowchart of FIG. 25 is applied to a mode in which high pulse energy is prioritized. When the pulse energy is the priority target parameter, the flowchart of FIG. 31 is applied as the subroutine of step S71 in FIG. 24.

In step S161, the light source parameter management server 320 sets the target value Etp of the pulse energy, which is the priority target parameter.

In step S162, the light source parameter management server 320 calls the data on the relationship between the pulse energy E and the lens spacing LD in the wavefront adjuster 107.

Figure 32:
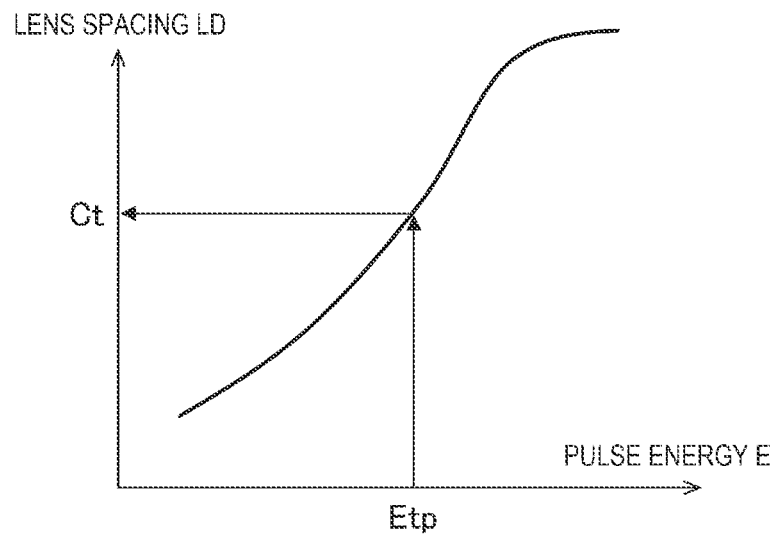
FIG. 32 is an example of a graph showing the relationship between the pulse energy and the lens spacing in the wavefront adjuster.

In step S163, the light source parameter management server 320 uses the called relationship data to determine the lens spacing LD=Ct, which causes the pulse energy E, which is the priority target parameter, to be the target value Etp (see FIG. 32).

In step S164, the light source parameter management server 320 outputs the initial lens spacing LC=Ct, which is the operation control target parameter value, to the light source #k.

In step S165, the light source parameter management server 320 calls data on the relationship between the pulse energy E and the spectral linewidth $\Delta\lambda$.

Figure 33:
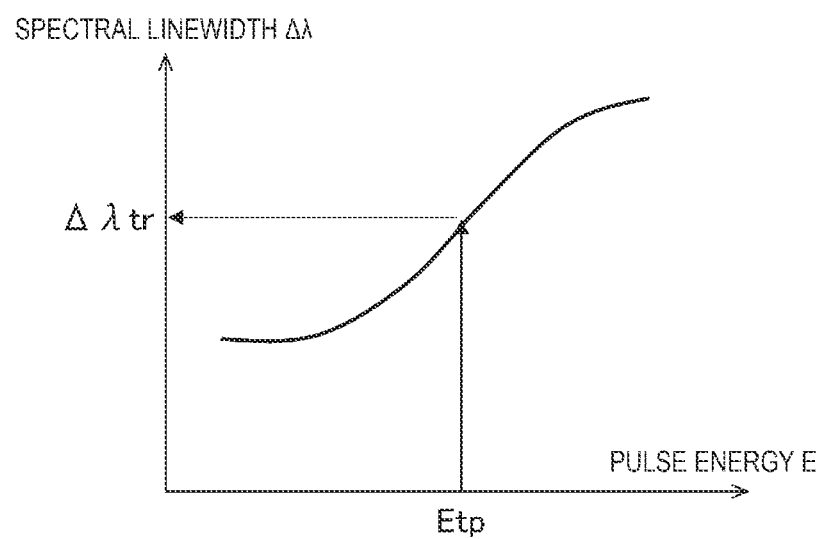
FIG. 33 is an example of a graph showing the relationship between the pulse energy and the spectral linewidth.

In step S166, the light source parameter management server 320 uses the called relationship data to determine the spectral linewidth $\Delta\lambda tr$, which causes the pulse energy E, which is the priority target parameter, to be the target value Etp (see FIG. 33). $\Delta\lambda tr$ is a target value of a recommended target spectral linewidth.

In step S167, the light source parameter management server 320 registers the spectral linewidth $\Delta\lambda$ as the recommended target parameter information.

In step S168, the light source parameter management server 320 outputs the target spectral linewidth $\Delta\lambda tr$ as the operation control target parameter value to the light source #k.

In step S169, the light source parameter management server 320 outputs the target pulse energy Etp as the priority target parameter value to the light source #k.

The light source parameter management server 320 may output at least one of the target spectral linewidth $\Delta\lambda tr$ and the target pulse energy value Etp also to the exposure apparatus #k.

After step S169, the light source parameter management server 320 returns to the flowchart of FIG. 24.

FIG. 32 is an example of a graph showing the relationship between the pulse energy E and the lens spacing LD in the wavefront adjuster 107. The horizontal axis of FIG. 32 represents the pulse energy E, and the vertical axis of FIG. 32 represents the lens spacing LD. Using the relationship data shown in FIG. 32 allows determination of the lens spacing Ct corresponding to the target pulse energy value Etp.

FIG. 33 is an example of a graph showing the relationship between the pulse energy E and the spectral linewidth $\Delta\lambda$. The horizontal axis of FIG. 33 represents the pulse energy E, and the vertical axis of FIG. 33 represents the spectral linewidth $\Delta\lambda$. Using the relationship data shown in FIG. 33 allows determination of the target spectral linewidth $\Delta\lambda tr$ corresponding to the target pulse energy Etp.

9.2.2.1.2 Effects

The scheme described with reference to FIGS. 31 to 33 allows operation of the light source #k at high pulse energy that is a target value of the priority target parameter.

Although the scheme widens the spectral line width Δλ, the exposure can be performed, for example, when the exposure is performed on a rough layer, when a photoresist pattern is formed on a substrate having a step that requires a certain depth of focus, or when a photoresist is thick.

In this example, the spectral linewidth is widened as a way of increasing the target pulse energy, whereby a decrease in the number of remaining pulses until maintenance of any of the consumables and an increase in the gas consumption can be suppressed.

9.2.2.1.3 Others

The last two steps in FIG. 31 (steps S168 and S169) are the steps of outputting an operating control target parameter value and a priority target parameter value to the light source #k, and may instead be the steps of outputting the information on the target parameter values to the exposure apparatus #k. During the actual exposure, the exposure apparatus #k may output the target parameter values to the light source #k.

In this example, the lens spacing LD in the wavefront adjuster 107 is changed to change the spectral linewidth Δλ, but not necessarily. For example, the spectral linewidth Δλ may be widened by rotation of the first prism 131 and the second prism 132 of the LNM 102 to lower the magnification by which the two prisms expand the beam, so that the pulse energy has a margin.

9.2.2.2 Example of Case where Exposure can be Performed with Generation of High Pulse Energy Prioritized and Pulse Energy Stability Relaxed in Terms of Specifications

9.2.2.2.1 Operation

Figure 34:
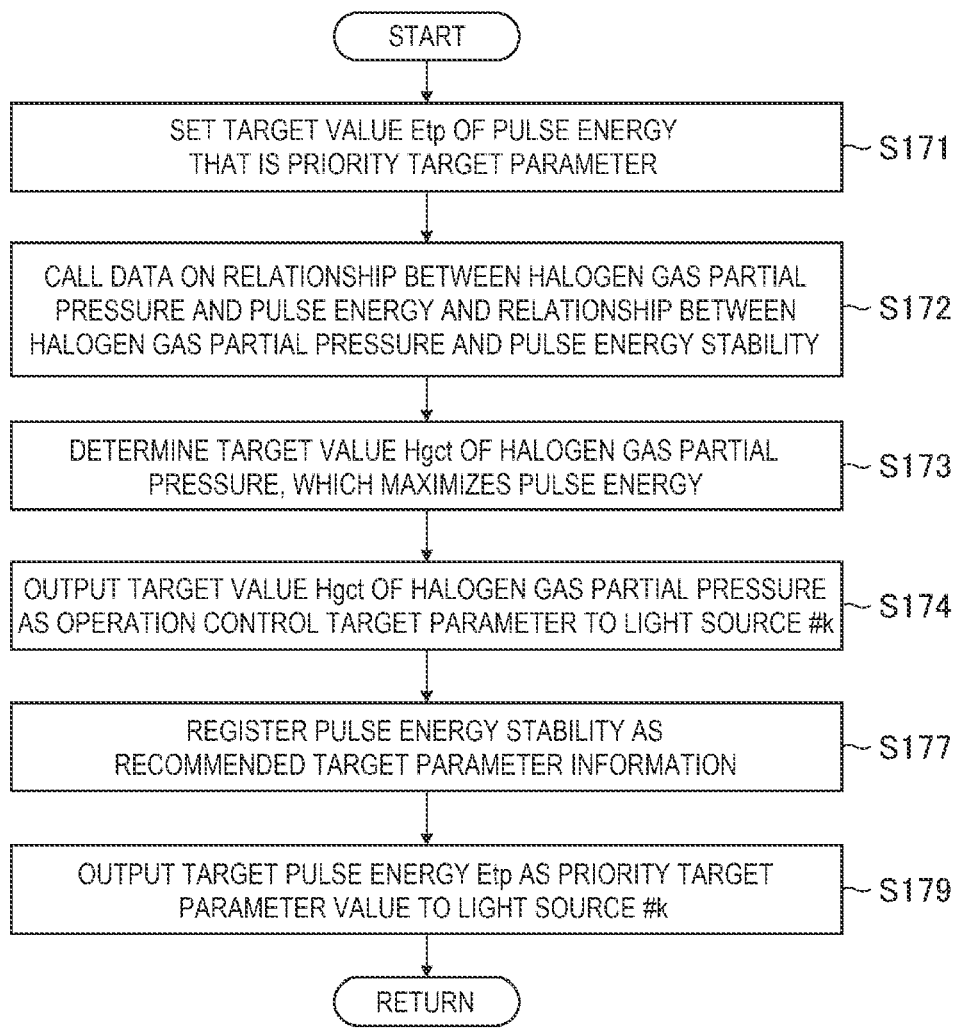
FIG. 34 is a flowchart showing an example of the contents of the processes carried out by the light source parameter management server when the priority target parameter value is set at a high pulse energy value, and the range of a pulse energy stability parameter can be relaxed in terms of specifications.

FIG. 34 shows an exemplary flowchart in a case where the pulse energy is the priority target parameter, the high pulse energy value is set at the target value Etp, and the range of a pulse energy stability parameter can be relaxed in terms of specifications. When the exposure can be performed with the pulse energy E being the primary target parameter and the pulse energy stability relaxed in terms of specifications, the flowchart of FIG. 34 can be applied in place of the flowchart of FIG. 31.

In step S171, the light source parameter management server 320 sets the target value Etp of the pulse energy, which is the priority target parameter.

In step S172, the light source parameter management server 320 calls data on the relationship between halogen gas partial pressure Hgc and the pulse energy E, and the relationship between the halogen gas partial pressure Hgc and the pulse energy stability Eσ.

Figure 35:
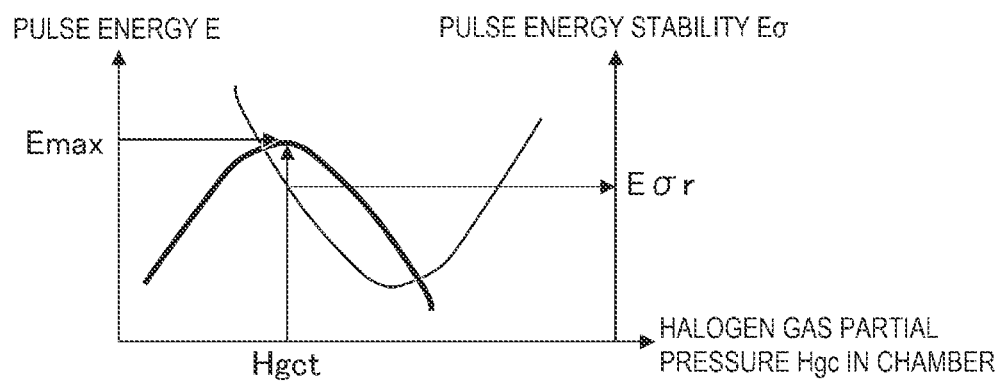
FIG. 35 is an example of a graph showing the relationship between halogen gas partial pressure and the pulse energy, and the relationship between the halogen gas partial pressure and the pulse energy stability.

In step S173, the light source parameter management server 320 uses the called relationship data to determine a target value Hgct of the halogen gas partial pressure at which the pulse energy E is maximized (see FIG. 35).

In step S174, the light source parameter management server 320 outputs the target value Hgct of the halogen gas partial pressure as the operation control target parameter to the light source #k.

In step S177, the light source parameter management server 320 registers the pulse energy stability Eσ as the recommended target parameter information.

In step S179, the light source parameter management server 320 outputs the target pulse energy Etp as the priority target parameter value to the light source #k. The light source parameter management server 320 may output the target pulse energy Etp also to the exposure apparatus #k.

After step S179, the light source parameter management server 320 returns to the flowchart of FIG. 24.

FIG. 35 is an example of a graph showing the relationship between the halogen gas partial pressure Hgc and the pulse energy E, and the relationship between the halogen gas partial pressure Hgc and the pulse energy stability Eσ. The horizontal axis of FIG. 35 represents the halogen gas partial pressure Hgc in the chamber 100, the left vertical axis of FIG. 35 represents the pulse energy E, and the right vertical axis of FIG. 35 represents the pulse energy stability Eσ.

In FIG. 35, the mountain-shaped curve drawn with the thick line is a graph showing the relationship between the halogen gas partial pressure Hgc and the pulse energy E, and the valley-shaped curve drawn with the thin line is a graph showing the relationship between the halogen gas partial pressure Hgc and the pulse energy stability Eσ. Using the relationship data shown in FIG. 35 allows determination of the halogen gas partial pressure Hgct and pulse energy stability Eσr corresponding to a maximum Emax of the pulse energy E.

9.2.2.2.2 Effects

According to the flowchart of FIG. 34, the pulse energy E can be increased by control of the halogen gas partial pressure Hgc in the chamber 100 in such a way that the halogen gas partial pressure Hgct, which achieves the maximum value Emax of the pulse energy E, is achieved. The exposure throughput is thus improved.

9.2.2.2.3 Others

In the example shown in FIG. 34, the target halogen gas partial pressure Hgct, which is the operation control parameter, is so specified that the pulse energy E is maximized, so that the pulse energy stability Eσ may deteriorate to the value Eσr shown in FIG. 35.

In this case, the pulse energy stability Eσ may be registered as the recommended target parameter information, and the recommended target parameter information may be estimated from the operation data during the adjustment oscillation and output to an external apparatus.

When the range of the pulse energy stability target parameter cannot be relaxed in terms of specifications, the operation control target parameter value may be reset, for example, by increasing the gas consumption per pulse Gwt, which is the operation control target parameter of the light source #k. The number of remaining pulses until the maintenance of each of the consumables can thus be maintained.

Figure 36:
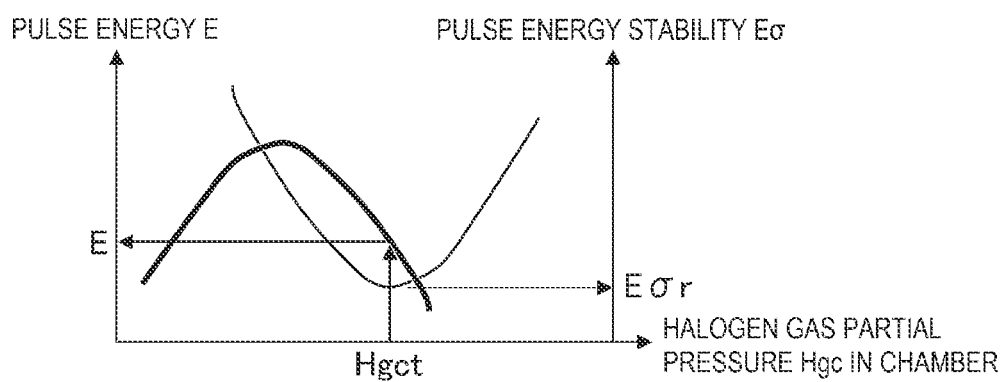
FIG. 36 is a graph showing an example of setting the halogen gas partial pressure in a case where the pulse energy stability is prioritized in an optical performance priority mode.

There may be a mode in which the pulse energy stability is prioritized as another example of the optical performance priority mode. In this case, the target halogen gas partial pressure Hgct may be so set as the operation control target parameter that the value of the pulse energy stability Eσ is minimized (stability is maximized), as shown in FIG. 36. In this case, however, since the pulse energy E is unlikely to be achieved, the light source #k can be operated by allowing a decrease in the number of remaining pulses until the maintenance of a consumable or by increasing the target gas consumption per pulse Gwt.

9.2.2.3 Example of Case where Exposure can be Performed with Operation at High Duty Ratio Prioritized and Pulse Energy Stability Relaxed in Terms of Specifications

9.2.2.3.1 Operation

The light source of an exposure apparatus generally operates in a burst operation pattern in which oscillation (oscillation at predetermined repetition frequency) and pauses are repeated for wafer exposure, as shown in FIG. 2.

The duty ratio in this case is expressed by the expression below.

Duty ratio=oscillation period/(oscillation period+
pause period)×100(%)

Figure 37:
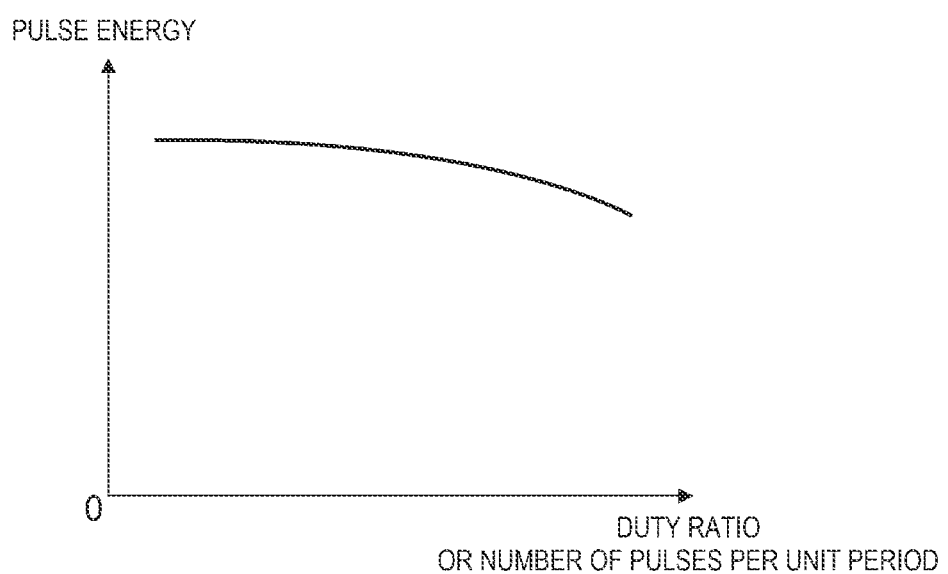
FIG. 37 is a graph showing the relationship between a duty ratio and the pulse energy.

FIG. 37 is a graph showing the relationship between the duty ratio and the pulse energy. Light sources generally have a tendency in which the pulse energy of the light output from the light source decreases as the duty ratio increases under the same conditions (when same gas pressure and charging voltage are applied), as shown in FIG. 37. Therefore, when the light source is operated at a high duty ratio, the light source needs to be operated under conditions that the pulse energy of the light from the light source is high.

A graph drawn with the horizontal axis representing the number of pulses per unit period and the vertical axis representing the pulse energy has the same tendency of the relationship shown in FIG. 37.

Therefore, when the number of pulses per unit period increases, the pulse energy decreases, so that how to compensate for the pulse energy in a case where the light source is operated with an increased number of pulses per unit period is the same as in the case where the light source is operated at a high duty ratio.

Figure 38:
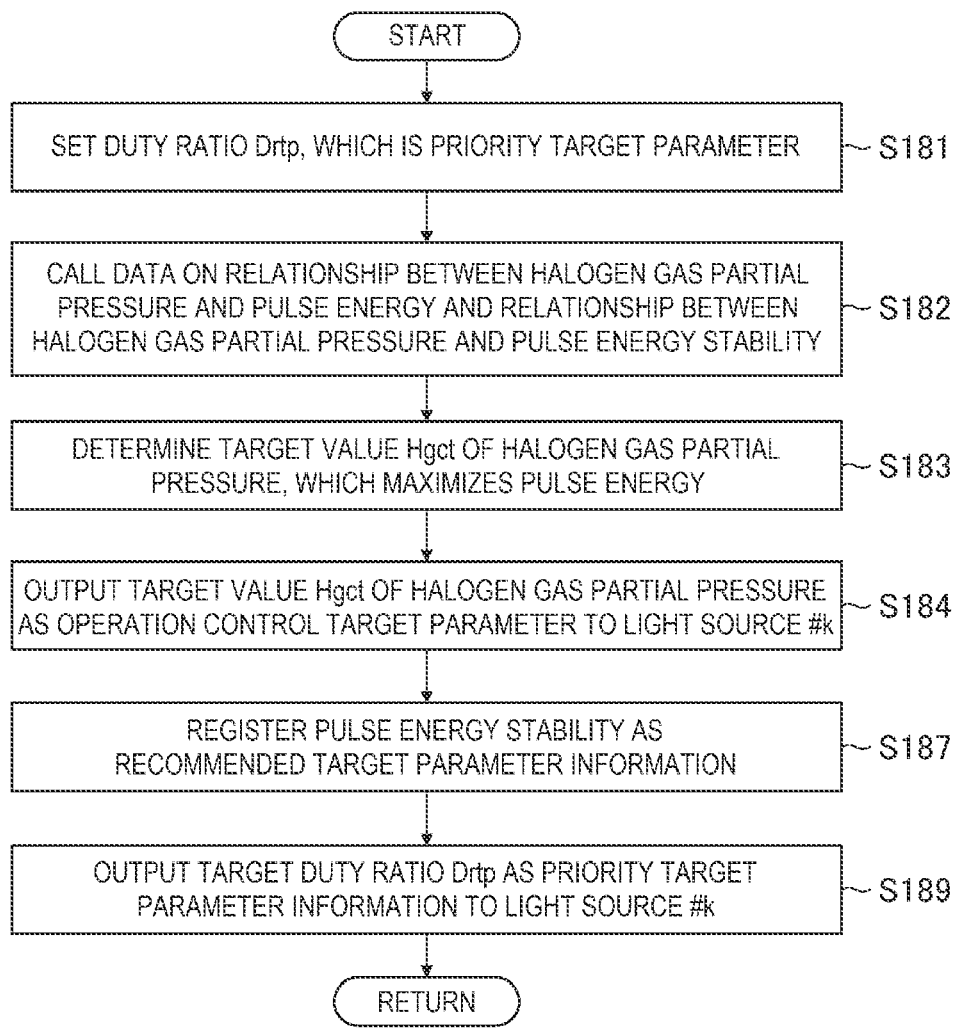
FIG. 38 is a flowchart showing an example of the contents of the processes carried out by the light source parameter management server when the duty ratio is the priority target parameter and the range of the pulse energy stability parameter can be relaxed in terms of specifications.

FIG. 38 shows an exemplary flowchart in a case where the duty ratio is the priority target parameter and the range of the pulse energy stability parameter can be relaxed in terms of specifications. When a duty ratio Dr is the primary target parameter and the exposure can be performed with the pulse energy stability relaxed in terms of specifications, the flowchart of FIG. 38 can be applied in place of the flowchart of FIG. 31.

In step S181, the light source parameter management server 320 sets Drtp, which is the priority target parameter. The burst pattern duty ratio Drtp, which is the priority parameter, is the duty ratio calculated from the operation pattern used to perform the following exposure.

Steps S182, S183, S184, and S187 may be the same as steps S172, S173, S174, and S177 in FIG. 34.

In step S189 after step S187, the light source parameter management server 320 outputs the target duty ratio Drtp as the priority target parameter information to the light source #k. The light source parameter management server 320 may output the target duty ratio also to the exposure apparatus #k. The exposure apparatus #k outputs a trigger pattern to the light source #k to perform the exposure in a burst exposure pattern close to the target duty ratio Drtp.

9.2.2.3.2 Effects

Controlling the halogen gas partial pressure in the chamber 100 in such a way that halogen gas partial pressure that maximizes the pulse energy is achieved allows the high duty ratio operation. The exposure throughput is thus improved.

9.2.2.3.3 Others

In the example described above, the target halogen gas partial pressure Hgct is so specified that the pulse energy is maximized, so that the pulse energy stability may deteriorate. Therefore, the pulse energy stability may be registered as the recommended target parameter information, and the recommended target parameter information may be estimated from the operation data during the adjustment oscillation and output to an external apparatus.

When the pulse energy stability target parameter cannot be relaxed in terms of specifications, the gas consumption per pulse Gwt, which is the operation control target parameter of the light source #k, may, for example, be increased so that it is reset. The number of remaining pulses until the maintenance of a consumable can thus be maintained.

In this example, the case where the duty ratio is the priority target parameter is presented, but not necessarily. For example, output per unit period may be set as the priority target parameter.

Generally, in the case of excimer lasers, a high duty ratio or a large number of pulses per unit period makes it difficult to achieve pulse energy. The operation control target parameter is therefore set under conditions that the pulse energy can be maintained, for example, by carrying out the procedure of the processes shown in FIG. 31 or 38 to widen the spectral linewidth, relax the specifications of the range of the pulse energy stability parameter, or increase the gas consumption per pulse Gw, or any combination thereof. The light source #k may then be operated by setting a high duty ratio or a large number of pulses per unit period as the target priority parameter information.

9.3 Consumable Life Extension Mode Operation

In some semiconductor factories, it is desired in some cases to extend the period until the maintenance of a consumable due to production plans, maintenance plans, or other circumstances. To extend the life of a consumable, the operation control target parameter of the light source #k only needs to be set to increase the pulse energy for the same gas pressure and charging voltage.

9.3.1 Example of Resetting Target Halogen Gas Partial Pressure

9.3.1.1 Operation

Figure 39:
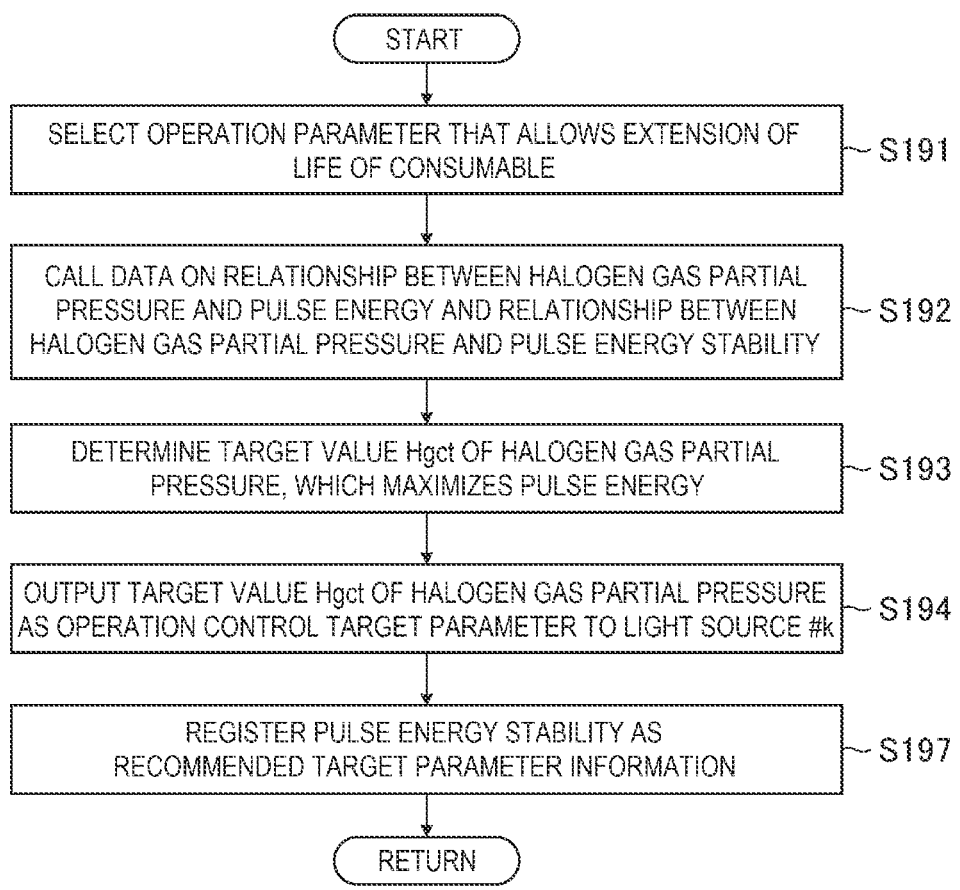
FIG. 39 is a flowchart showing an example of the contents of processes applied to a consumable life extension mode operation.

FIG. 39 shows an example of the procedure of processes applied to the consumable life extension mode operation. In the consumable life extension mode operation, the flowchart of FIG. 39 is applied to step S71 in FIG. 24.

In step S191, the light source parameter management server 320 selects an operation parameter that allows extension of the life of a consumable. One of the operation parameters that allow an increase in the pulse energy in the case where the same gas pressure and charging voltage are applied is the halogen gas partial pressure (see FIG. 35). In this example, the light source parameter management server 320 selects the halogen gas partial pressure.

Steps S192, S193, S194, and S197 may be the same as steps S182, S183, S184, and S187 in FIG. 38, respectively.

After step S197, the light source parameter management server 320 returns to the flowchart of FIG. 24.

9.3.1.2 Effects

Resetting the target halogen gas partial pressure as the operation control target parameter of the light source #k in such a way that the pulse energy is maximized allows an increase in the pulse energy when the same gas pressure and charging voltage are set, as shown in FIG. 39. This pulse energy margin can be allocated to increase the number of remaining pulses until the maintenance of the consumable.

In this case, the pulse energy and the pulse energy stability may be determined based on data provided during the adjustment operation as the recommended target parameter information, and the results of the determination may be output to an external apparatus.

9.3.2 Example of Resetting Target Spectral Linewidth

The target spectral linewidth can be widened as the operation control target parameter of the light source #k to increase the pulse energy when the same gas pressure and charging voltage are applied, as described in FIG. 33. This pulse energy margin can be allocated to increase the number of remaining pulses until the maintenance of the consumable.

In this case, the spectral linewidth and the spectral linewidth stability may be determined as the recommended target parameter information based on the data provided during the adjustment operation, and the results of the determination may be output to an external apparatus.

9.3.3 Example of Resetting Gas Consumption

When the target parameter, such as the pulse energy stability or the spectral linewidth cannot be relaxed in terms of specifications as the recommended target parameter information, the gas consumption per pulse Gwt, which is the operation control target parameter of the light source #k, may, for example, be increased so that it is reset. The number of remaining pulses until the maintenance of the consumable can thus also be increased. In this case, however, the set gas consumption per pulse Gwt may be output as the recommended target parameter information to an external apparatus. The maintenance information may be output to an external apparatus based on the data provided during the adjustment operation in the case where the gas consumption per pulse Gwt is set at an increased value.

9.3.4 Effects

The consumable life extension mode operation can increase the number of remaining pulses until the maintenance of the consumable. Increasing the number of remaining pulses until the maintenance of the consumable, for example, allows the timing of the maintenance of the other consumables in the lithography system #k to accord with the timing of the maintenance of the light source #k, whereby the downtime of the production line can be suppressed. The consumable life extension mode operation also allows the timing of the maintenance of the consumables of the light source #k to accord with the timing of the maintenance of the consumables of the light source #j (j≠k).

9.3.5 Others

The above description shows three examples of resetting the target halogen partial pressure, resetting the target spectral linewidth, and resetting the target gas consumption, but not necessarily, and any of the three examples may be combined with each other as appropriate. By doing so, it is also possible to narrow the scope of the specification relaxation of the recommended target parameter information.

9.4 Consumption Reduction Mode Operation

9.4.1 Gas Consumption Reduction Mode Operation

It is conceivable for some reason to desire to reduce the gas consumption below the typical specifications. To reduce the gas consumption, the target operation control parameter of the light source only needs to be so set that the pulse energy achieved when the same gas pressure and charging voltage are applied increases.

Figure 40:
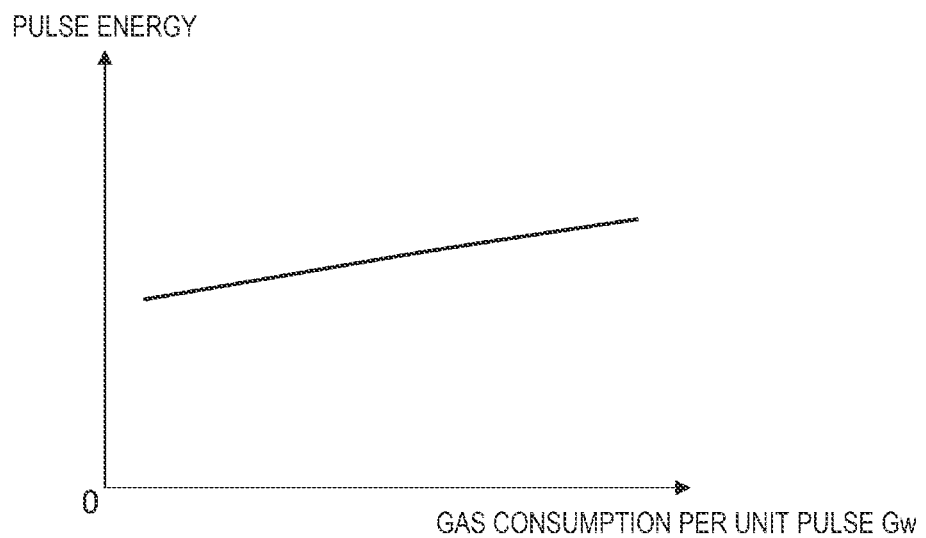
FIG. 40 is a graph showing the relationship between the gas consumption per unit pulse and the pulse energy.

FIG. 40 is a graph showing the relationship between the gas consumption per unit pulse and the pulse energy. Light sources generally have a tendency in which the pulse energy of the light output from the source increases as the gas consumption per unit pulse increases, as shown in FIG. 40.

The reason for this is conceivably that an increase in the amount of replaced laser gas allows reduction in the concentration of impurity gases that are present in the chamber and absorb the laser light, so that the pulse energy increases.

Increasing the gas consumption per unit pulse therefore allows the pulse energy of the light from the light source maintained high. Conversely, when the pulse energy can be maintained high by any other parameter, the gas consumption can be reduced.

9.4.1.1 Example of Resetting Target Halogen Partial Pressure

Figure 41:
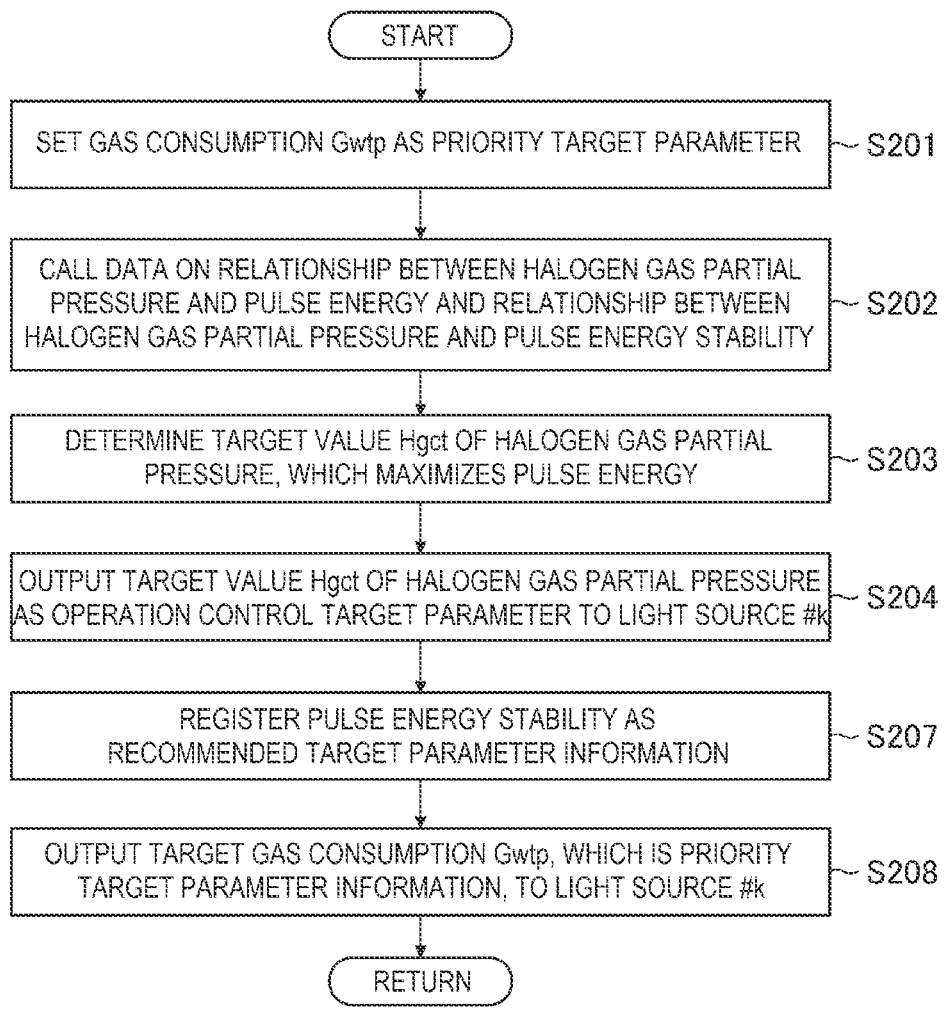
FIG. 41 shows an example of the procedure of processes applied to gas consumption reduction mode operation.

FIG. 41 shows an example of the procedure of processes applied to gas consumption reduction mode operation. In the gas consumption reduction mode operation, the flowchart of FIG. 41 is applied to step S71 in FIG. 24.

In step S201, the light source parameter management server 320 sets gas consumption Gwtp, which is the priority target parameter. Steps S202, S203, S204, and S207 may be the same as steps S182, S183, S184, and S187 in FIG. 38, respectively.

In step S208 after step S207, the light source parameter management server 320 outputs the target gas consumption Gwtp, which is the priority target parameter information, to the light source #k.

After step S208, the light source parameter management server 320 returns to the flowchart of FIG. 24.

Adjusting the target halogen gas partial pressure Hgct in such a way that the pulse energy is maximized allows an increase in the pulse energy when the same gas pressure and charging voltage are applied, as described in FIG. 35. The pulse energy margin can be allocated to reduce the gas consumption.

In this case, the light source parameter management server 320 determines the pulse energy stability as the recommended target parameter information based on the data provided during the adjustment operation. The light source parameter management server 320 then outputs the estimated recommended target parameter information and maintenance information to an external apparatus.

9.4.1.2 Example of Widening Target Spectral Linewidth

The target spectral linewidth Δλt can be widened to increase the pulse energy when the same gas pressure and charging voltage are applied, as in the example shown in FIG. 33. The pulse energy margin can be allocated to reduce the gas consumption. In this case, the following parameters are reset as the operation control target parameter of the light source #k in the flowchart of FIG. 24.

[1] The gas consumption for each pulse from the light source #k is set at the reduced target gas consumption Gwtp.

[2] The spectral linewidth is set at the widened target spectral linewidth $\Delta\lambda$tp.

In this case, the recommended target parameter information allows determination of the spectral linewidth $\Delta\lambda\backslash$ and the range of the spectral linewidth stability based on the operation data during the adjustment operation. The light source parameter management server 320 then outputs the recommended target parameter information and the maintenance information to an external apparatus.

9.4.1.3 Example of Reducing Number of Remaining Pulses Until Maintenance

When the target parameter of the energy stability or the spectral linewidth cannot be relaxed in terms of specifications as the recommended target parameter information, the gas consumption can be suppressed by reducing the number of remaining pulses until the maintenance of a consumable. In this case, however, the fact that the number of remaining pulses until the maintenance decreases is output as the maintenance information to an external apparatus.

9.4.1.4 Effects

According to the gas consumption reduction mode operation described above by way of example, the gas consumption per unit pulse can be reduced. The gas consumption reduction mode operation provides a large cost reduction effect when the cost of the excimer laser gas rises.

In addition, for example, the gas consumption reduction mode operation is effective even when the amount of remaining excimer laser gas in the semiconductor factory is low but when the operation of the light source cannot be stopped.

9.4.1.5 Others

The above description shows three examples of resetting the target halogen partial pressure, widening the target spectral linewidth, and reducing the number of remaining pulses until the maintenance, but not necessarily, and any of the three examples may be combined with each other as appropriate. By doing so, it is also possible to narrow the scope of the specification relaxation of the recommended target parameter.

9.4.2 Power Saving Mode Operation

Setting a narrow range of the power supply charging voltage allows reduction in consumed power.

9.4.2.1 Example of Resetting Target Value of Charging Voltage

Figure 42:
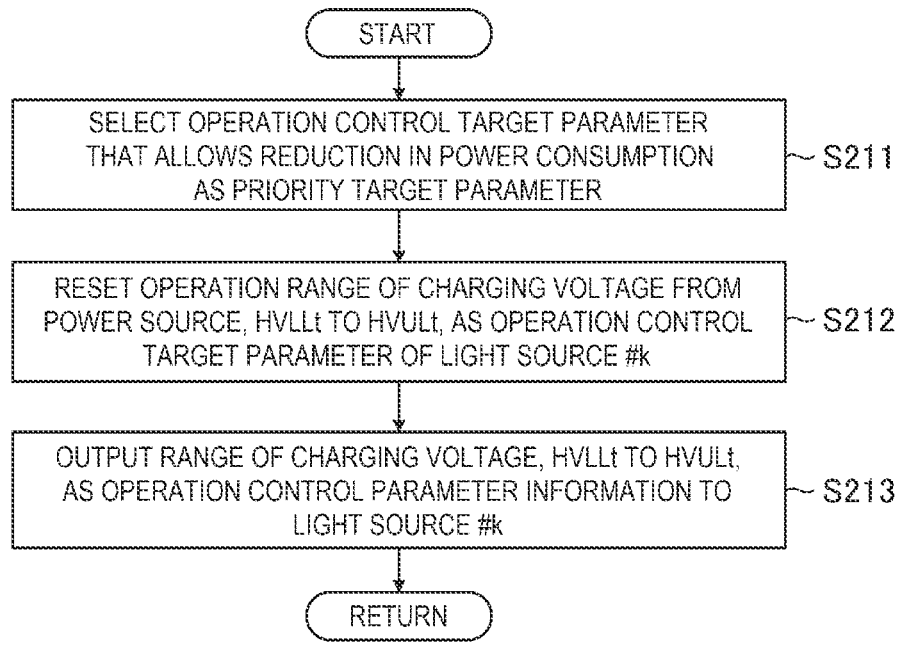
FIG. 42 shows an example of the procedure of processes applied to power saving mode operation.

FIG. 42 shows an example of the procedure of processes applied to power saving mode operation. In the power saving mode operation, the flowchart of FIG. 42 is applied to step S71 in FIG. 24.

In step S211, the light source parameter management server 320 selects as the priority target parameter an operational control target parameter that allows reduction in power consumption (consumed power). The light source parameter management server 320 selects the charging voltage from the charger 110 as one of the operation control target parameters that allow reduction in power consumption.

In step S212, the light source parameter management server 320 resets an operation range of the charging voltage from the charger 110, HVLLt to HVULt, as the operation control target parameter of the light source #k. Since the consumed power depends on the charging voltage in the laser apparatus, which is the light source, the consumed power can be suppressed by lower and upper limits of the target charging voltage, HVLLt and HVULt, set as low as possible that falls within the operation range.

In step S213, the light source parameter management server 320 outputs the operation range of the charging voltage, HVLLt to HVULt, as the operation control parameter information to the light source #k.

After step S213, the light source parameter management server 320 returns to the flowchart of FIG. 24.

The consumed power can be reduced by the lower limit HVLLt and the upper limit HVULt, which determine the range of the charging voltage target value, set as low as possible that falls within the operation range, as in the example shown in FIG. 42. That is, the lower limit HVLLt and the upper limit HVULt of the target charging voltage from the charger 110 as the operation control target parameter of the light source #k only need to each be reset at a value lower than in the typical case.

When the charging voltage is set low, however, side effects may occur, including deterioration in the pulse energy stability, an increase in the gas consumption, and a decrease in the number of remaining pulses until the maintenance. In this case, the light source parameter management server 320 determines parameter information on the pulse energy stability and the gas consumption based on the operation data during the adjustment operation as the recommended target parameter information, and outputs the recommended target parameter information and the maintenance information to an external apparatus.

9.4.2.2 Example of Resetting Target Value of Halogen Gas Partial Pressure

Setting the halogen gas partial pressure, which is the operation control target parameter, as the target value Hgct, which maximizes the pulse energy, allows an increase in the pulse energy under the conditions that the same gas pressure and charging voltage are applied, as in the example shown in FIG. 35. The pulse energy margin can be allocated to the charging voltage operation range. In this case, the light source parameter management server 320 determines the range of the pulse energy stability as the recommended target parameter information based on the operation data during the adjustment operation, and outputs the recommended target parameter information to an external apparatus.

9.4.2.3 Example of Widening Target Spectral Linewidth

The target spectral linewidth $\Delta\lambda$t, which is the operation control target parameter, can be widened to increase the pulse energy when the same gas pressure and charging voltage are applied, as in the example shown in FIG. 33. The pulse energy margin can be allocated to the charging voltage operation range. In this case, the light source parameter management server 320 determines the spectral linewidth and the range of the spectral linewidth stability as the recommended target parameter information based on the operation data during the adjustment operation, and outputs the recommended target parameter information to an external apparatus.

9.4.3 Effects

Performing power saving mode operation allows reduction in the power consumption. In addition, even when the electric power situation in the semiconductor factory is under strain, the light source can be continuously operated with the power consumption suppressed.

9.4.4 Others

The above description shows three examples of resetting the charging voltage target value, resetting the halogen gas partial pressure, and widening the spectral linewidth, but not necessarily, and any of the three examples may be combined with each other as appropriate. By doing so, it is also possible to narrow the scope of the specification relaxation of the recommended target parameter.

Another item that causes the laser apparatus to consume a large amount of power may be the power consumed by the motor 124, which drives the CFF 123. In this case, reducing the rotational speed of the CFF 123 allows suppression of the consumed power.

In this case, however, the pulse energy stability may worsen, or the life of the chamber may shorten. Also in this case, the recommended target parameter information may be output to an external apparatus to cause external apparatus to evaluate whether the operation is OK or NOK.

9.5 Variations

Figure 43:
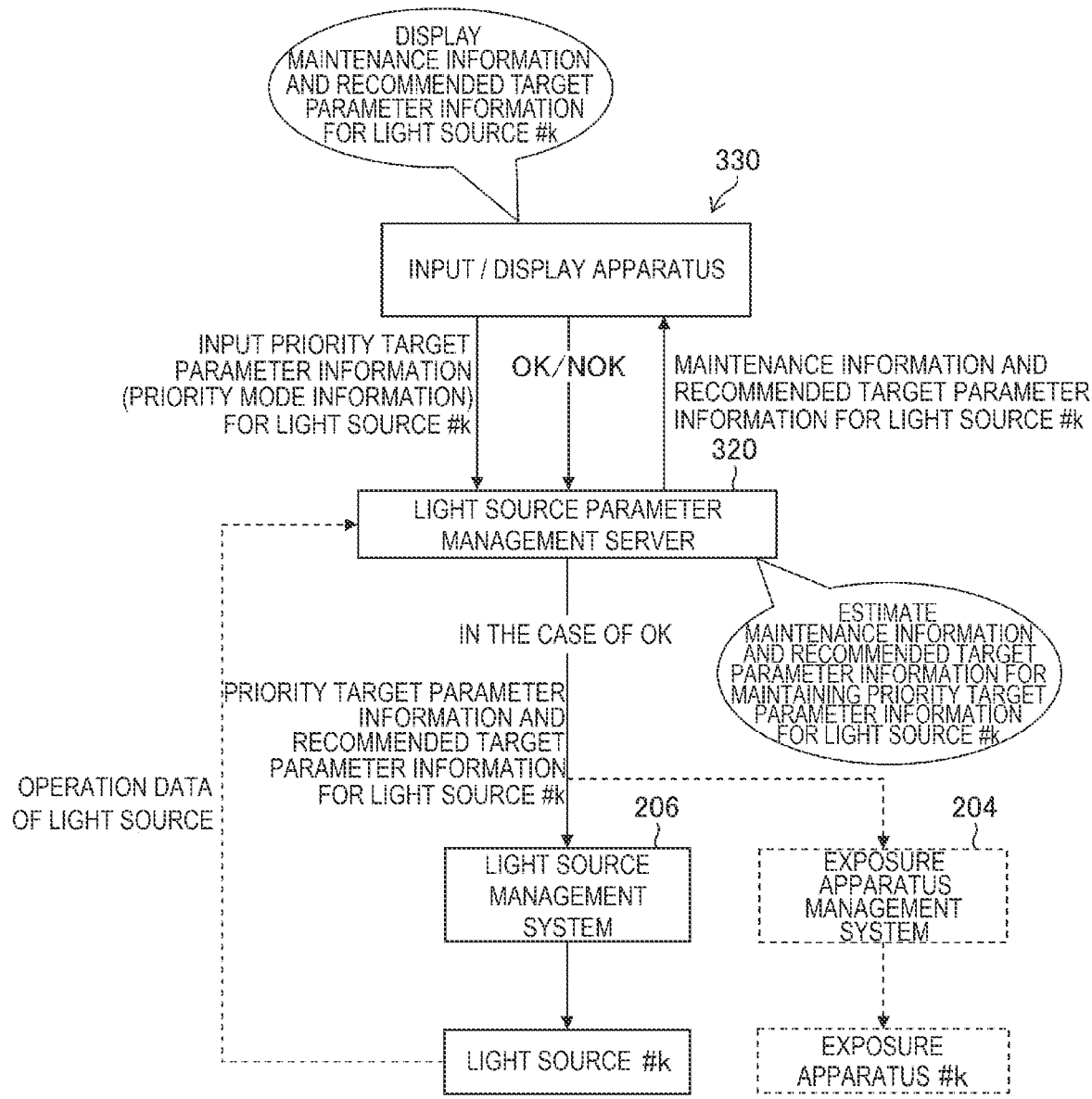
FIG. 43 is a block diagram showing a variation of the fourth embodiment.

FIG. 43 is a block diagram showing a variation of the fourth embodiment. The semiconductor manufacturing system may have a configuration including an input/display apparatus 330 connected to the light source parameter management server 320, as shown in FIG. 43. The input/display apparatus 330 includes an input apparatus that accepts input of information from the operator and a display apparatus that displays a variety of pieces of information. The input apparatus may, for example, be a keyboard, a mouse, a multi-touch panel, a voice input apparatus, or an appropriate combination thereof. The input/display apparatus 330 may be an information processing terminal apparatus that can access the light source parameter management server 320 via a communication line, such as a personal computer and a tablet terminal. There may be a plurality of input/display apparatuses 330.

The operator in the factory may select the light source #k, and input the priority target parameter information via the input/display apparatus 330 to cause the input/display apparatus 330 to display the maintenance information and the recommended target parameter information. The operator may then check the maintenance information and the recommended target parameter information to evaluate whether the operation is OK or NOK, and input the result of the evaluation via the input/display apparatus 330.

The method for inputting the priority target parameter information via the input/display apparatus 330 is not limited to direct input of information on a parameter and the numerical value thereof, and the same operation achieved by the method described above may be performed, for example, by inputting mode information, such as the typical optical performance priority mode operation, consumable life extension mode operation, or consumption reduction mode operation, via the input/display apparatus 330 to automatically set the priority target parameter information defined in any of the modes.

As an example, the input/display apparatus 330 presents a mode selection menu containing a plurality of mode selection candidates, and when the operator inputs an instruction of selection, for example, of a "spectral linewidth priority mode" from the mode selection menu, the priority target parameter information containing a narrowed target value of the spectral linewidth defined in the spectral linewidth priority mode is captured by the light source parameter management server 320. The conversion from the mode information into the corresponding parameter information may be performed by the input/display apparatus 330 or the light source parameter management server 320.

10. Specific Example of Parameter Information

FIG. 44 shows a specific example of the light source parameter information. For example, the spectral linewidth parameter information is a collection of data containing the spectral linewidth and the value thereof, and the spectral linewidth stability and the value thereof.

FIG. 45 shows a specific example of the priority target parameter information. For example, the priority target parameter information on the spectral linewidth contains the priority target spectral linewidth as a variable, the target value $\Delta\lambda Tp$ of the prioritized spectral linewidth, the stability of the priority target spectral linewidth as another variable, and the target value $\Delta\Delta\lambda tp$ of the width of the variation in the prioritized spectral linewidth $\Delta\lambda$. The spectral linewidth used herein is an example of the "first variable" in the present disclosure, and the target value $\Delta\lambda tp$ is an example of the "first target value" in the present disclosure. The width of variation in the spectral linewidth $\Delta\lambda$ corresponds to an acceptable numerical range of the spectral linewidth $\Delta\lambda$. The width of variation in the spectral linewidth $\Delta\lambda$ is an example of the "second variable" in the present disclosure, and the target value $\Delta\Delta\lambda tp$ is an example of the "second target value" in the present disclosure.

FIG. 46 shows a specific example of the recommended target parameter information. FIG. 46 differs from FIG. 45 in that the phrase "priority target parameter" shown in FIG. 45 is changed to the "recommended target parameter" and the prioritized target value shown in FIG. 45 is changed to the recommended target value.

FIG. 47 shows a specific example of the maintenance information. In this example, the chamber 100, the LNM line narrowing module, and the output coupler (OC) are presented as the consumables, but not necessarily. For example, the consumables further include other optical modules (such as optical pulse stretcher that is not shown) disposed on the optical path of the laser light.

FIG. 48 shows a specific example of the operation control target parameter information. In this example, the voltage to be instructed to the charger (charging voltage), the halogen gas partial pressure, and the lens spacing in the wavefront adjuster are examples of the operation control parameters, but not necessarily. For example, the operation control parameters also include control gains for feedback control of the spectral linewidth, the wavelength, and the pulse energy.

11. Computer Readable Medium on which Program is Recorded

A program containing instructions for causing a computer to function as the data analysis server 310 and the light source parameter management server 320 described in each of the embodiments described above can be recorded on an optical disk, a magnetic disk, or any other computer readable medium (tangible, non-transitory information storage medium), and the program can be provided in the form of the information recording medium. The program can be incorporated in the computer, and a processor in the computer can execute the instructions in the program to cause the computer to achieve the functions of the servers.

12. Others

In each of the embodiments described above, an excimer laser apparatus is presented as the light source used in the exposure apparatus, but not necessarily, and the light source may instead be a solid-state laser apparatus, or an extreme ultraviolet (EUV) light generator that generates EUV light having a wavelength of about 13 nm. The EUV light generator may, for example, be an apparatus based on a laser produced plasma (LPP) scheme, in which plasma generated by a target material irradiated with laser light is used.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A light source parameter information management method for managing information on a parameter of a light source used in an exposure apparatus, the method comprising:
    acquiring priority target parameter information containing an item of a variable that is a priority target parameter prioritized in operation of the light source, and a target value of the variable;
    estimating maintenance information based on the priority target parameter information, the maintenance information containing a value representing a life of a consumable in the light source until maintenance of the consumable; and
    outputting the maintenance information.

2. The light source parameter information management method according to claim 1,
    wherein input of the priority target parameter information is accepted from an external apparatus, and
    the maintenance information is output to the external apparatus.

3. The light source parameter information management method according to claim 2, further comprising
    acquiring an OK or NOK signal from the external apparatus, the signal indicating whether the operation of the light source is permitted.

4. The light source parameter information management method according to claim 3, further comprising
    controlling the light source with the priority target parameter information set in the light source when the OK signal, which permits the operation of the light source, is received from the external apparatus.

5. The light source parameter information management method according to claim 4, further comprising
    estimating, from data during the operation of the light source, the maintenance information of the light source with the priority target parameter information set in the light source.

6. The light source parameter information management method according to claim 5, further comprising
    outputting the maintenance information estimated from the data during the operation to the external apparatus.

7. The light source parameter information management method according to claim 3, further comprising
    causing the light source to stop operating when the NOK signal, which does not permit the operation of the light source, is received from the external apparatus.

8. The light source parameter information management method according to claim 1,
    wherein the priority target parameter information contains a first target value of a first variable that is the priority target parameter, and a second target value of a second variable representing a numerical range of the first variable.

9. The light source parameter information management method according to claim 1,
    wherein the priority target parameter information includes at least one of target spectral characteristic parameter information, target output characteristic parameter information, and target consumption information.

10. The light source parameter information management method according to claim 1,
    wherein the maintenance information contains at least one of the number of remaining pulses and a remaining period until the maintenance of the consumable as a value representing the life of the consumable.

11. The light source parameter information management method according to claim 1,
    wherein the estimating of the maintenance information includes
    inputting operation data to a learned machine learning model, the operation data produced by setting the priority target parameter information in the light source and causing the light source to perform adjustment operation, and causing the machine learning model to output a degree of deterioration of the consumable, and
    determining a value representing the life of the consumable based on the degree of degradation.

12. The light source parameter information management method according to claim 1, further comprising:
    estimating recommended target parameter information containing parameter information different from the acquired priority target parameter information; and
    outputting the recommended target parameter information.

13. The light source parameter information management method according to claim 12, wherein the recommended target parameter information includes at least one of target spectral characteristic parameter information, target output characteristic parameter information, and target consumption parameter information.

14. The light source parameter information management method according to claim 1,
wherein the priority target parameter information includes mode information that specifies at least one of an optical performance priority mode in which optical performance of the light source is prioritized, a consumable life extension mode in which extension of the life of the consumable of the light source is prioritized, and a consumption reduction mode in which consumption of an element consumed in the operation of the light source is reduced.

15. The light source parameter information management method according to claim 14,
wherein the optical performance priority mode is a mode in which the light source is operated with either spectral linewidth parameter information or output characteristic parameter information prioritized.

16. The light source parameter information management method according to claim 14,
wherein the consumable life extension mode is a mode in which the light source is operated with extension of the number of remaining pulses until the maintenance of the consumable of the light source prioritized.

17. The light source parameter information management method according to claim 14,
wherein the consumption reduction mode is a mode in which the light source is operated with either reduction in laser gas consumption or reduction in consumed power prioritized.

18. The light source parameter information management method according to claim 1,
wherein the priority target parameter is selected based on wafer inspection data, data produced from the exposure apparatus, data produced from the light source, and tracking data.

19. A light source parameter information management apparatus for managing information on a parameter of a light source used in an exposure apparatus, the apparatus comprising:
a processor; and
a memory configured to store a program executed by the processor,
the processor executing instructions of the program to
acquire priority target parameter information containing an item of a variable that is a priority target parameter prioritized in operation of the light sourced, and a target value of the variable,
estimate maintenance information based on the priority target parameter information, the maintenance information containing a value representing a life of a consumable in the light source until maintenance of the consumable, and
output the maintenance information.

20. A non-transitory computer readable medium storing a program that causes a computer to achieve a function of managing information on a parameter of a light source used in an exposure apparatus, the program causing the computer to perform functions of
acquiring priority target parameter information containing an item of a variable that is a priority target parameter prioritized in operation of the light source, and a target value of the variable,
estimating maintenance information based on the priority target parameter information, the maintenance information containing a value representing a life of a consumable in the light source until maintenance of the consumable, and
outputting the maintenance information.

* * * * *